(12) United States Patent
Chiang et al.

(10) Patent No.: US 12,272,750 B2
(45) Date of Patent: Apr. 8, 2025

(54) MEMORY ARRAY CHANNEL REGIONS

(71) Applicant: Taiwan Semiconductor Manufacturing Co., Ltd., Hsinchu (TW)

(72) Inventors: Kuo-Chang Chiang, Hsinchu (TW); Hung-Chang Sun, Kaohsiung (TW); Sheng-Chih Lai, Hsinchu (TW); TsuChing Yang, Taipei (TW); Yu-Wei Jiang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/330,604

(22) Filed: Jun. 7, 2023

(65) Prior Publication Data

US 2023/0317848 A1 Oct. 5, 2023

Related U.S. Application Data

(62) Division of application No. 17/150,522, filed on Jan. 15, 2021, now Pat. No. 11,710,790.
(Continued)

(51) Int. Cl.
*G11C 11/22* (2006.01)
*G11C 5/06* (2006.01)
(Continued)

(52) U.S. Cl.
CPC ........ *H01L 29/78391* (2014.09); *G11C 5/063* (2013.01); *G11C 11/223* (2013.01);
(Continued)

(58) Field of Classification Search
CPC . G11C 11/223; G11C 5/063; H01L 27/11587; H01L 27/11595;
(Continued)

(56) References Cited

U.S. PATENT DOCUMENTS 6,204,158 B1 3/2001 Hendrix et al.
6,784,061 B1 8/2004 Yang et al.
(Continued)

FOREIGN PATENT DOCUMENTS

CN 102265405 A 11/2011
CN 103794612 A 5/2014
(Continued)

OTHER PUBLICATIONS

Kim et al., "Synergistic Improvement of Long-Term Plasticity in Photonic Synapses Using Ferroelectric Polarization in Hafnia-Based Oxide Semiconductor Transistors" Advanced Materials, Feb. 2020, 32, Pohang, Korea, pp. 1-6.
(Continued)

*Primary Examiner* — Meiya Li
(74) *Attorney, Agent, or Firm* — Slater Matsil, LLP

(57) ABSTRACT

A memory cell includes a ferroelectric (FE) material contacting a word line; and an oxide semiconductor (OS) layer contacting a source line and a bit line, wherein the FE material is disposed between the OS layer and the word line. The OS layer comprises: a first region adjacent the FE material, the first region having a first concentration of a semiconductor element; a second region adjacent the source line, the second region having a second concentration of the semiconductor element; and a third region between the first region and the second region, the third region having a third concentration of the semiconductor element, the third concentration is greater than the second concentration and less than the first concentration.

20 Claims, 57 Drawing Sheets

Related U.S. Application Data

(60) Provisional application No. 63/031,646, filed on May 29, 2020.

(51) Int. Cl.
  *H01L 21/28* (2006.01)
  *H01L 29/51* (2006.01)
  *H01L 29/78* (2006.01)
  *H01L 29/786* (2006.01)

(52) U.S. Cl.
  CPC ...... *H01L 29/40111* (2019.08); *H01L 29/516* (2013.01); *H01L 29/7869* (2013.01)

(58) Field of Classification Search
  CPC ......... H01L 27/11597; H01L 29/40111; H01L 29/516; H01L 29/78391; H01L 29/7869
  See application file for complete search history.

(56) References Cited

U.S. PATENT DOCUMENTS

| | | |
|---|---|---|
| 8,530,976 B1 | 9/2013 | Ratnakumar et al. |
| 9,318,315 B2 | 4/2016 | Mueller et al. |
| 9,530,899 B2 | 12/2016 | Kim et al. |
| 9,875,784 B1 | 1/2018 | Li et al. |
| 9,941,299 B1 | 4/2018 | Chen et al. |
| 10,191,694 B2 | 1/2019 | Colinge et al. |
| 10,367,003 B2 | 7/2019 | Kang et al. |
| 10,910,393 B2 | 2/2021 | Lai et al. |
| 11,515,332 B2 | 11/2022 | Lu et al. |
| 11,729,986 B2 | 8/2023 | Lu et al. |
| 2004/0016958 A1 | 1/2004 | Kato et al. |
| 2004/0026725 A1 | 2/2004 | Gnadinger |
| 2008/0258140 A1 | 10/2008 | Lee et al. |
| 2008/0258141 A1 | 10/2008 | Park et al. |
| 2010/0133601 A1 | 6/2010 | Miyazaki et al. |
| 2010/0330738 A1 | 12/2010 | Uchiyama et al. |
| 2011/0089417 A1 | 4/2011 | Yamazaki et al. |
| 2011/0180796 A1 | 7/2011 | Yamazaki et al. |
| 2011/0215317 A1 | 9/2011 | Yamazaki et al. |
| 2011/0253998 A1 | 10/2011 | Theiss et al. |
| 2012/0007158 A1 | 1/2012 | Yoon et al. |
| 2012/0181534 A1 | 7/2012 | Hatano |
| 2012/0228687 A1 | 9/2012 | Noda |
| 2013/0083588 A1 | 4/2013 | Takemura |
| 2013/0320344 A1 | 12/2013 | Kim et al. |
| 2014/0138609 A1 | 5/2014 | Satoh et al. |
| 2015/0037934 A1 | 2/2015 | Yamazaki |
| 2015/0069320 A1 | 3/2015 | Rabkin et al. |
| 2015/0084042 A1 | 3/2015 | Maeda et al. |
| 2015/0132944 A1 | 5/2015 | Park |
| 2015/0206978 A1 | 7/2015 | Miki et al. |
| 2015/0311256 A1 | 10/2015 | Rabkin et al. |
| 2015/0357343 A1 | 12/2015 | Ishida et al. |
| 2016/0336068 A1 | 11/2016 | Yamazaki et al. |
| 2017/0077308 A1 | 3/2017 | Yamazaki et al. |
| 2017/0179026 A1 | 6/2017 | Toyama et al. |
| 2017/0221910 A1 | 8/2017 | Chen et al. |
| 2017/0236848 A1 | 8/2017 | Yamazaki |
| 2017/0337884 A1 | 11/2017 | Kurokawa |
| 2017/0345940 A1 | 11/2017 | Suzuki et al. |
| 2018/0130823 A1 | 5/2018 | Kim |
| 2018/0145180 A1 | 5/2018 | Koezuka et al. |
| 2018/0151583 A1 | 5/2018 | Lupino et al. |
| 2018/0151588 A1 | 5/2018 | Tsutsumi et al. |
| 2018/0151745 A1 | 5/2018 | Chang et al. |
| 2018/0166453 A1 | 6/2018 | Muller |
| 2018/0247976 A1 | 8/2018 | Sel et al. |
| 2018/0269210 A1 | 9/2018 | Tezuka et al. |
| 2018/0315794 A1 | 11/2018 | Kamalanathan et al. |
| 2018/0350837 A1 | 12/2018 | Yoo et al. |
| 2019/0074286 A1 | 3/2019 | Singh et al. |
| 2019/0140101 A1 | 5/2019 | Im et al. |
| 2019/0148393 A1 | 5/2019 | Lue |
| 2019/0198617 A1 | 6/2019 | Li et al. |
| 2019/0259778 A1 | 8/2019 | Yoo |
| 2019/0326308 A1 | 10/2019 | Pu et al. |
| 2019/0393353 A1 | 12/2019 | Jeong et al. |
| 2020/0018541 A1 | 1/2020 | Villanueva et al. |
| 2020/0026990 A1 | 1/2020 | Lue |
| 2020/0075631 A1 | 3/2020 | Dong et al. |
| 2020/0091171 A1 | 3/2020 | Tokuhira et al. |
| 2020/0098776 A1 | 3/2020 | Sugisaki et al. |
| 2020/0105635 A1 | 4/2020 | Yu et al. |
| 2020/0105775 A1 | 4/2020 | Huang et al. |
| 2020/0119047 A1 | 4/2020 | Yoo et al. |
| 2020/0185411 A1* | 6/2020 | Herner ............. H01L 21/32139 |
| 2020/0212068 A1 | 7/2020 | Lee et al. |
| 2020/0227727 A1 | 7/2020 | Li |
| 2020/0279598 A1 | 9/2020 | Jiang et al. |
| 2021/0066348 A1 | 3/2021 | Prasad et al. |
| 2021/0074727 A1 | 3/2021 | Prasad et al. |
| 2021/0082955 A1 | 3/2021 | Rajashekhar et al. |
| 2021/0174856 A1 | 6/2021 | Chen et al. |
| 2021/0175253 A1 | 6/2021 | Han et al. |
| 2021/0327890 A1 | 10/2021 | Makala et al. |

FOREIGN PATENT DOCUMENTS

| | | |
|---|---|---|
| CN | 104584200 A | 4/2015 |
| CN | 107785376 A | 3/2018 |
| CN | 108987400 A | 12/2018 |
| CN | 109378313 A | 2/2019 |
| CN | 109768082 A | 5/2019 |
| CN | 110506322 A | 11/2019 |
| CN | 110957326 A | 4/2020 |
| CN | 111384063 A | 7/2020 |
| JP | H05326978 A | 12/1993 |
| JP | 2010267704 A | 11/2010 |
| JP | 2013149647 A | 8/2013 |
| KR | 20120006218 A | 1/2012 |
| KR | 20130142522 A | 12/2013 |
| KR | 20150038352 A | 4/2015 |
| KR | 20150054503 A | 5/2015 |
| KR | 20150118395 A | 10/2015 |
| KR | 101758538 B1 | 7/2017 |
| KR | 20180059271 A | 6/2018 |
| KR | 20190036077 A | 4/2019 |
| KR | 20190105174 A | 9/2019 |
| KR | 20190105604 A | 9/2019 |
| KR | 20200000664 A | 1/2020 |
| TW | 201244065 A | 11/2012 |
| TW | 201517236 A | 5/2015 |
| TW | 201631627 A | 9/2016 |
| TW | 201703264 A | 1/2017 |
| TW | 201727836 A | 8/2017 |
| TW | 201804615 A | 2/2018 |
| TW | 201830586 A | 8/2018 |
| TW | 201843811 A | 12/2018 |
| TW | 201904029 A | 1/2019 |
| TW | 201931577 A | 8/2019 |
| TW | I673831 | 10/2019 |
| TW | 201942980 A | 11/2019 |
| TW | 202010102 A | 3/2020 |
| TW | 202013684 A | 4/2020 |
| WO | 0209191 A2 | 1/2002 |
| WO | 2018004581 A1 | 1/2018 |
| WO | 2018136734 A1 | 7/2018 |
| WO | 2019125352 A1 | 6/2019 |
| WO | 2019152226 A1 | 8/2019 |

OTHER PUBLICATIONS

Wei, et al., Chemical solution deposition of ferroelectric Sr:HfO2 film from inorganic salt precursors Journal of Alloys and Compounds, 731 (2018), China, available online Sep. 25, 2017, pp. 546-553.

* cited by examiner

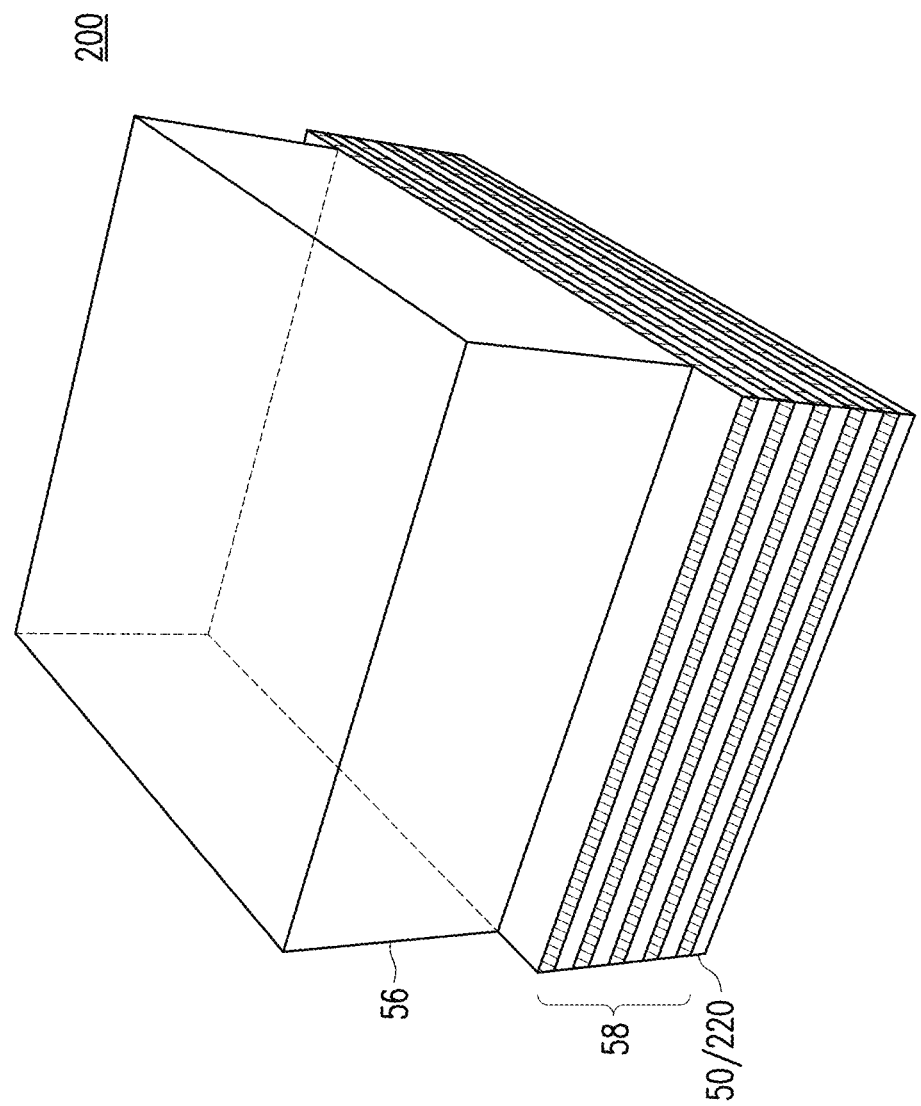

MEMORY ARRAY CHANNEL REGIONS

PRIORITY CLAIM AND CROSS-REFERENCE

This application is a divisional of U.S. application Ser. No. 17/150,522, filed on Jan. 15, 2021, which claims the benefit of U.S. Provisional Application No. 63/031,646, filed on May 29, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A, 5B, 6A, 6B, 7, 8, 9, 10, 11, 12A, 12B, 13A, 13B, 14A, 14B, 15A, 15B, 15C, 16A, 16B, 16C, 17A, 17B, 17C, 18A, 18B, 18C, 19 through 25, 26A, 26B, 27A, 27B, 28A, 28B, 29A, 29B, 30A, 30B, and 30C illustrate varying views of manufacturing a memory array in accordance with some embodiments.

DETAILED DESCRIPTION

Figure 1A:
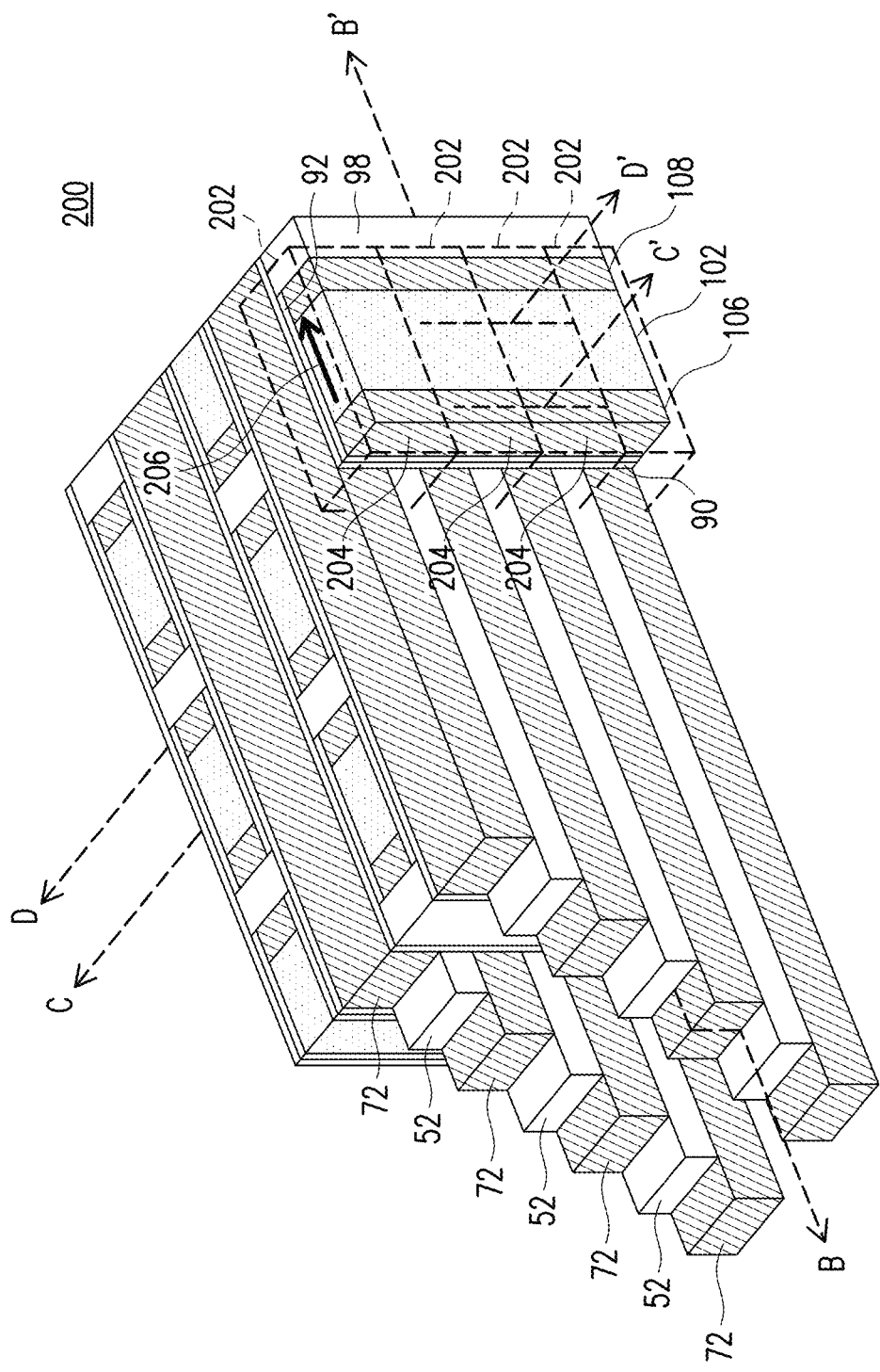
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a three-dimensional (3D) memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes a ferroelectric (FE) gate dielectric layer and an oxide semiconductor (OS) channel region. The OS channel region may have at least three different regions each with a different semiconductor element (e.g., indium) concentration. For example, an indium concentration of the OS channel may decrease in a direction away from the gate electrode/FE gate dielectric. By providing at least three different concentrations of the semiconductor element, advantages may be achieved. For example, by having a relatively high concentration of the semiconductor element closest to the gate electrode, carrier mobility in the OS channel region may be increased. By having a relatively low concentration of the semiconductor element at an exposed surface of the OS channel region away from the gate electrode, process damage during subsequent processing of the OS channel region can be reduced. Further, by including a medium concentration of the semiconductor element between the relatively low concentration region and the relatively high concentration region of the OS channel region, electron scattering between the low and high concentration regions can be reduced. Accordingly, device performance can be increased by reducing manufacturing defects.

Figure 1B:
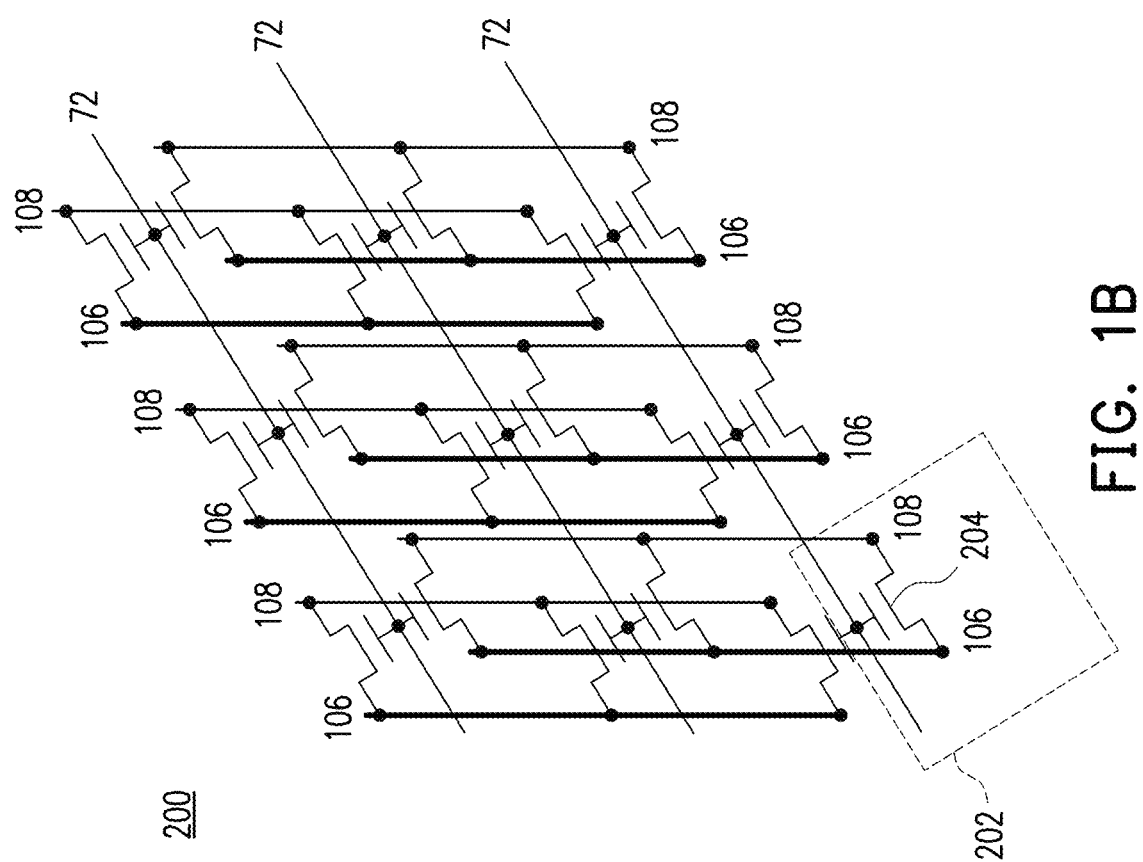

FIGS. 1A and 1B illustrate examples of a memory array according to some embodiments. FIG. 1A illustrates an example of a portion of the memory array 200 in a three-dimensional view, in accordance with some embodiments, and FIG. 1B illustrates a circuit diagram of the memory array 200. The memory array 200 includes a plurality of memory cells 202, which may be arranged in a grids of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate. In some embodiments, the memory array may be disposed in a top metal layer of the interconnect layers, such as above all other interconnect layers in the semiconductor die. In other embodiments, the memory array may be disposed in an intermediate metal layer of the interconnect layers, and the semiconductor die may include, for example, additional interconnect layers above and below the memory array.

In some embodiments, the memory array 200 is a flash memory array, such as a NOR flash memory array, or the like. Each memory cell 202 may include a thin film transistor (TFT) 204 with a ferroelectric (FE) material as a gate dielectric. In some embodiments, a gate of each TFT 204 is electrically coupled to a respective word line, a first source/drain region of each TFT 204 is electrically coupled to a respective bit line, and a second source/drain region of each TFT 204 is electrically coupled to a respective source line, which electrically couples the second source/drain region to ground. The memory cells 202 in a same horizontal row of the memory array 200 may share a common word line while the memory cells in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 102 is disposed between and isolate adjacent ones of the conductive lines 106 and the conductive lines 108. Pairs of the conductive lines 106 and 108 along with an intersecting conductive line 72 define boundaries of each memory cell 202, and a dielectric material 98 is disposed between and isolate adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

The memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 206).

An FE material 90 is disposed between the conductive lines 72 and the OS layer 92, and the FE material 90 may provide gate dielectrics for the TFTs 204. Accordingly, the memory array 200 may also be referred to as a ferroelectric random access memory (FERAM) array. The FE material 90 may be polarized in one of two different directions, and the polarization direction may be changed by applying an appropriate voltage differential across the FE material 90 and generating an appropriate electric field. The polarization may be relatively localized (e.g., generally contained within each boundaries of the memory cells 202), and a continuous region of the FE material 90 may extend across a plurality of memory cells 202. Depending on a polarization direction of a particular region of the FE material 90, a threshold voltage of a corresponding TFT 204 varies, and a digital value (e.g., 0 or 1) can be stored. For example, when a region of the FE material 90 has a first electrical polarization direction, the corresponding TFT 204 may have a relatively low threshold voltage, and when the region of the FE material 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the FE material 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the FE material 90, a polarization direction of the region of the FE material 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202, a read voltage is applied to the corresponding conductive line 72 (e.g., the world line/gate electrodes of the TFT 204), and a current is applied to a corresponding conductive line 106 (e.g., the bit line). The read voltage applied may be between the low and high threshold voltages of the TFT 204. Depending on the polarization direction of the corresponding region of the FE material 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

FIGS. 2 through 30 are views of intermediate stages in the manufacturing of the memory array 200, in accordance with some embodiments. FIGS., 3A, 4A, 5A, 6A, 12A, 13A, 14A, 15A, 16A, 17A, 18A, and 30 are illustrated in a three-dimensional view. FIGS. 3B, 4B, 5B, 6B, 7, 8, 9, 10, 11, 12B, 13B, 14B, 15B, 16B, 17B, and 18B are illustrated along reference cross-section B-B' illustrated in FIG. 1. FIGS. 15C, 16C, 17C, 18C, 19, 20, 21, 22, 23, 24, 28B, and 29B are illustrated along reference cross-section C-C' illustrated in FIG. 1. FIGS. 26B and 27B are illustrated along reference cross-section D-D' illustrated in FIG. 1. FIGS. 25, 26A, 27A, 28A, and 29A illustrate a top-down view.

Figure 2:
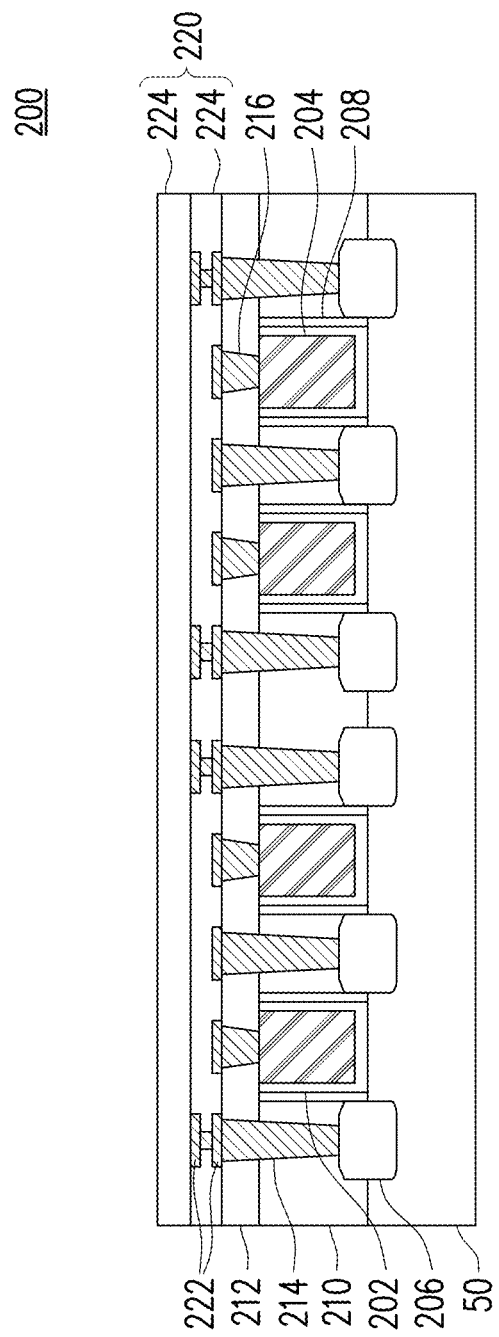

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, active devices (e.g., transistors, diodes, or the like) and/or passive devices (e.g., capacitors, resistors, or the like) may be formed on a top surface of the substrate 50.

FIG. 2 further illustrates circuits that may be formed over the substrate 50. The circuits include transistors at a top surface of the substrate 50. The transistors may include gate dielectric layers 202 over top surfaces of the substrate 50 and gate electrodes 204 over the gate dielectric layers 202. Source/drain regions 206 are disposed in the substrate 50 on opposite sides of the gate dielectric layers 202 and the gate electrodes 204. Gate spacers 208 are formed along sidewalls of the gate dielectric layers 202 and separate the source/drain regions 206 from the gate electrodes 204 by appropriate lateral distances. In some embodiments, the transistors may be planar field effect transistors (FETs), fin field effect transistors (finFETs), nano-field effect transistors (nanoFETs), or the like.

A first interlayer dielectric (ILD) 210 surrounds and isolates the source/drain regions 206, the gate dielectric layers 202, and the gate electrodes 204 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 204. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 200 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
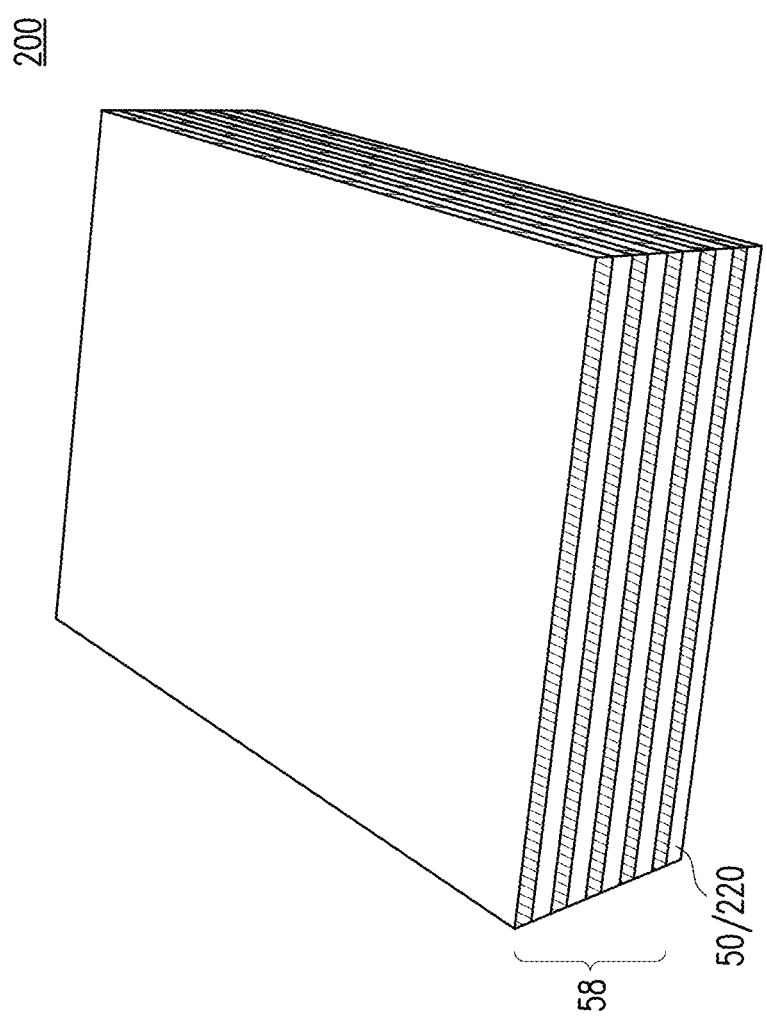
Figure 3B:
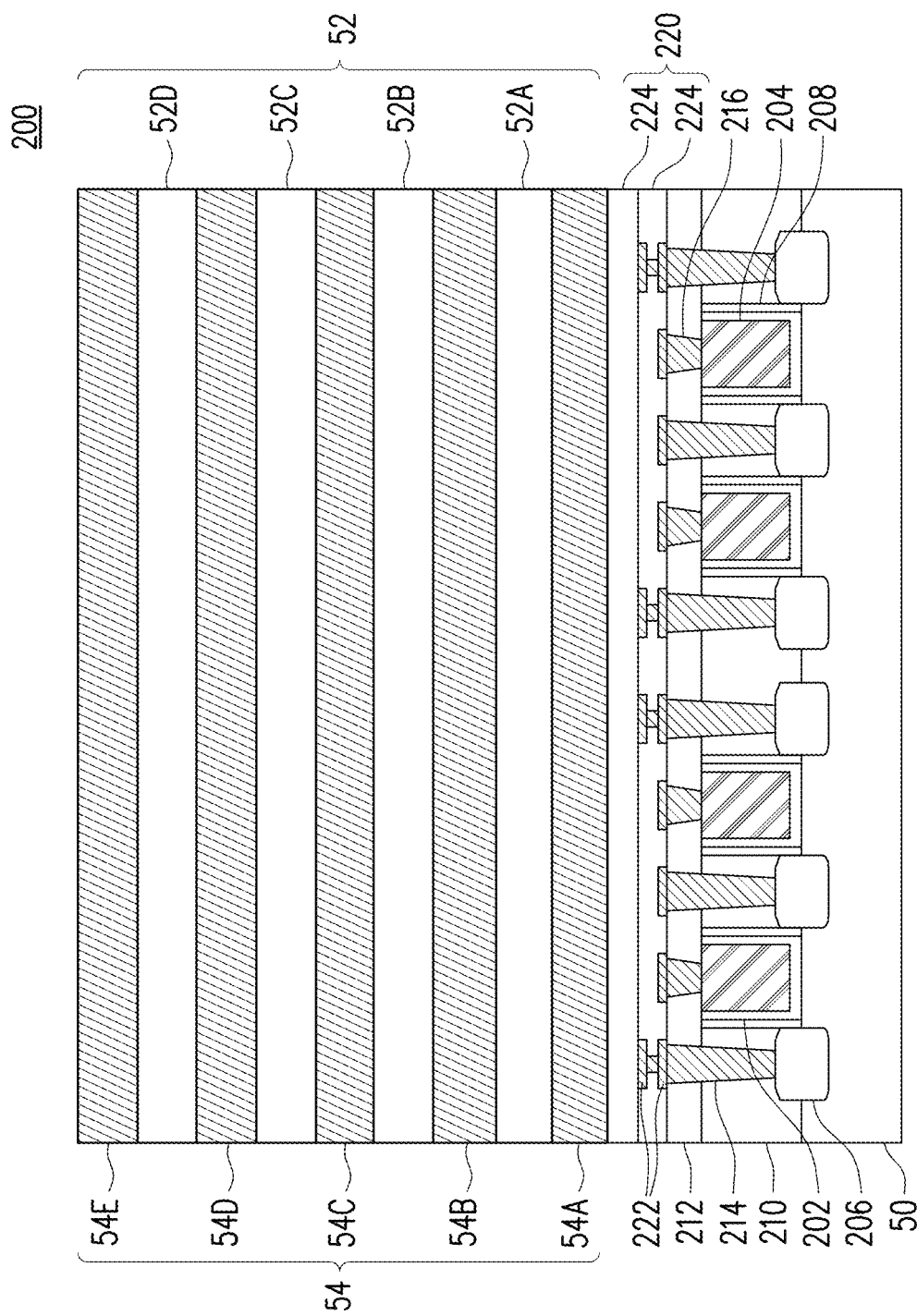

In FIGS. 3A and 3B, a multi-layer stack 58 is formed over structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, the multi-layer stack 58 may be above the interconnect structure 220, and one or more interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive layers 54A-E (collectively referred to as conductive layers 54) and dielectric layers 52A-D (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

Figure 4B:
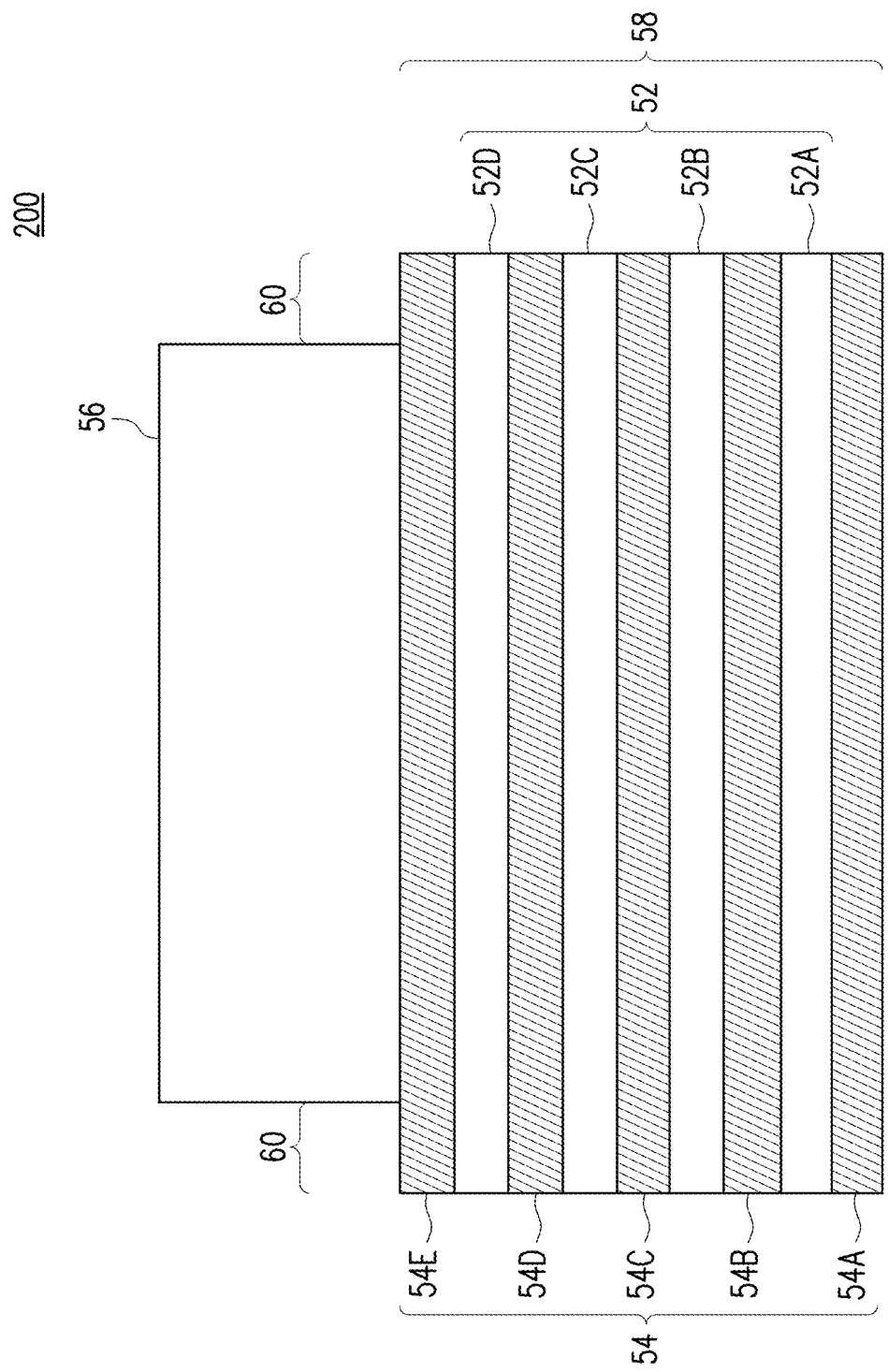

In FIGS. 4A and 4B a photoresist 56 is formed over the multi-layer stack 58. The photoresist 56 can be formed by using a spin-on technique and can be patterned using acceptable photolithography techniques. Patterning the photoresist 56 may expose the multi-layer stack 58 in regions 60 while masking remaining portions of the multi-layer stack 58. For example, a topmost layer of the multi-layer stack 58 (e.g., conductive layer 54E) may be exposed in the regions 60.

Figure 5A:
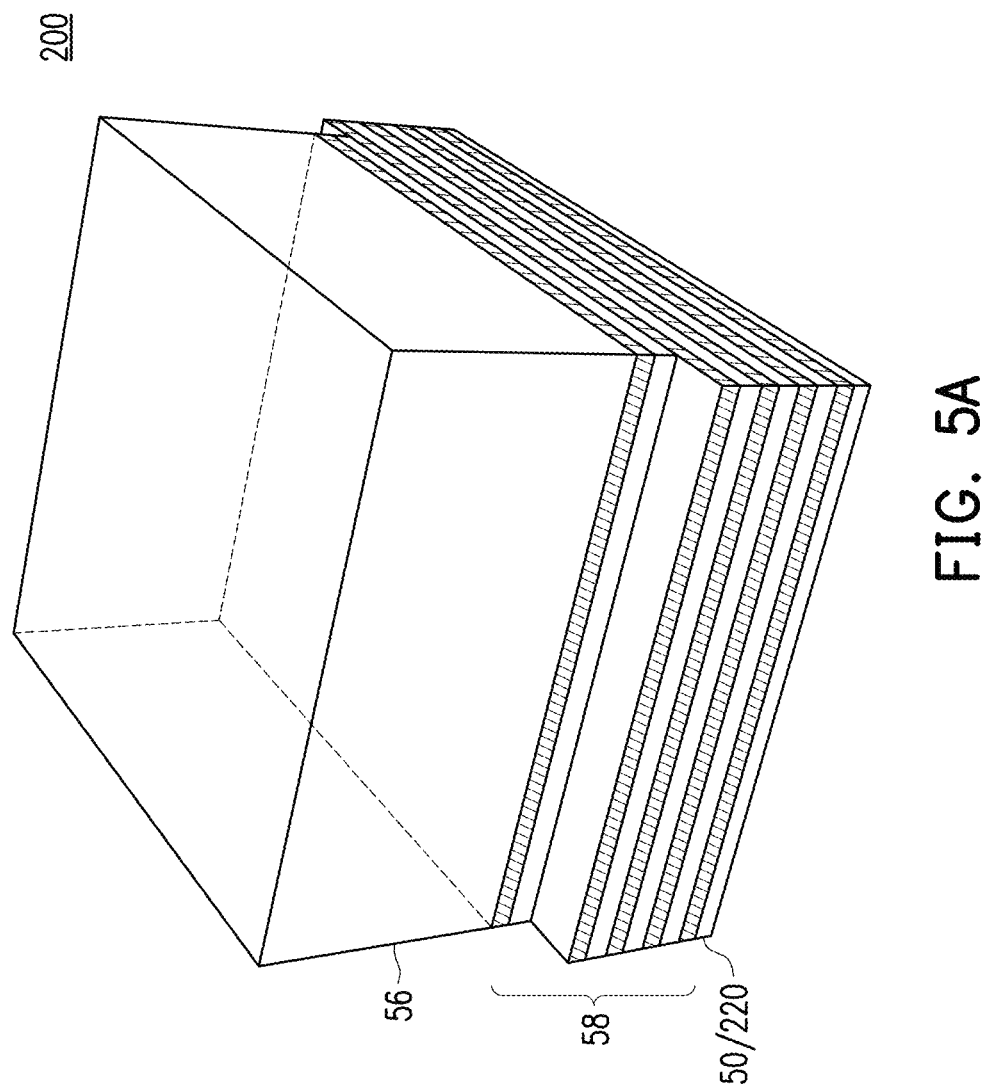
Figure 5B:
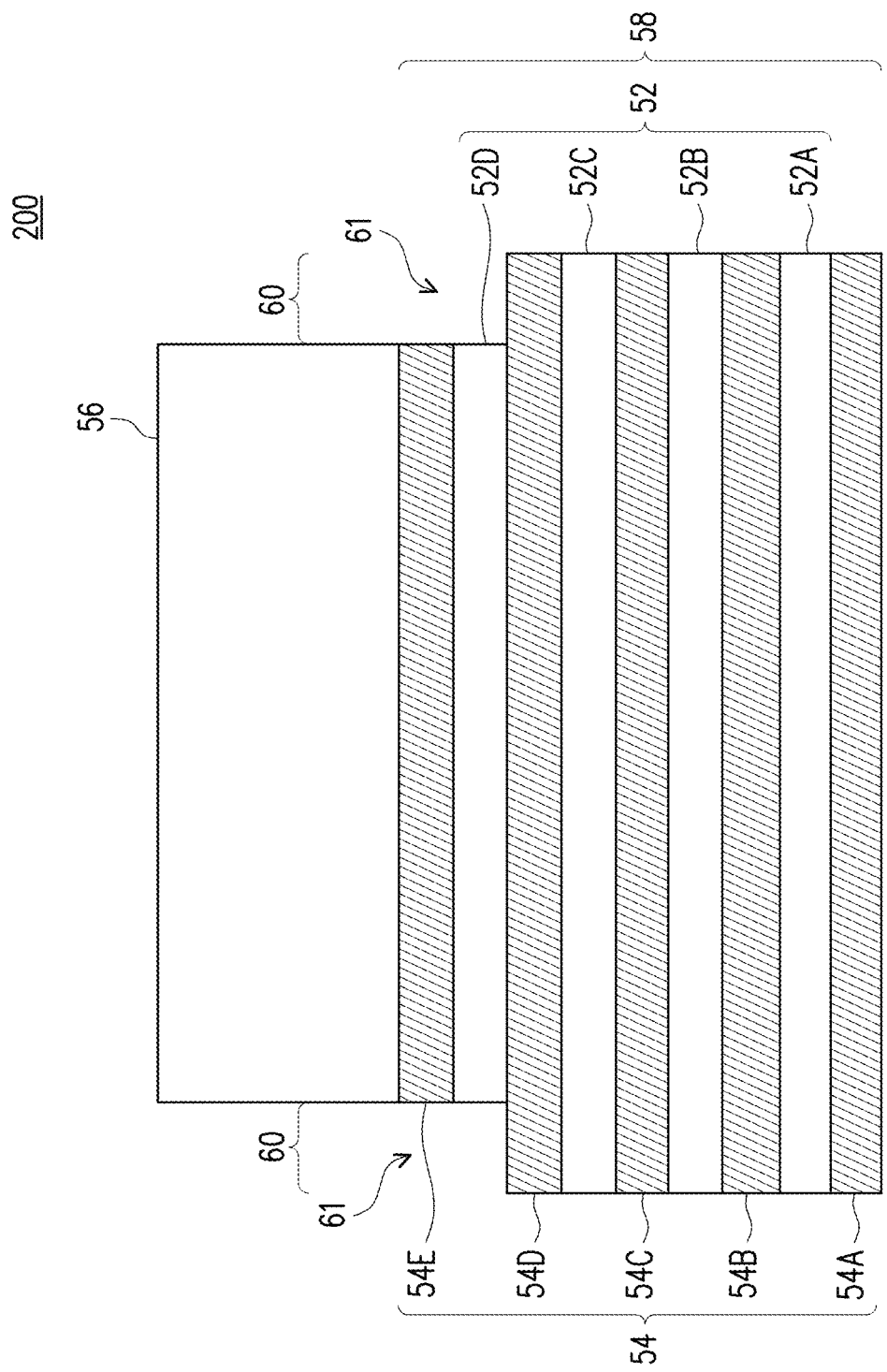

In FIGS. 5A and 5B, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54E and dielectric layer 52D in the regions 60 and define openings 61. Because the conductive layer 54E and the dielectric layer 52D have different material compositions, etchants used to remove exposed portions of these layers may be different. In some embodiments, the dielectric layer 52D acts as an etch stop layer while etching the conductive layer 54E, and the conductive layer 54D acts as an etch stop layer while etching dielectric layer 52D. As a result, the portions of the conductive layer 54E and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54D is exposed in the regions 60.

Figure 6A:
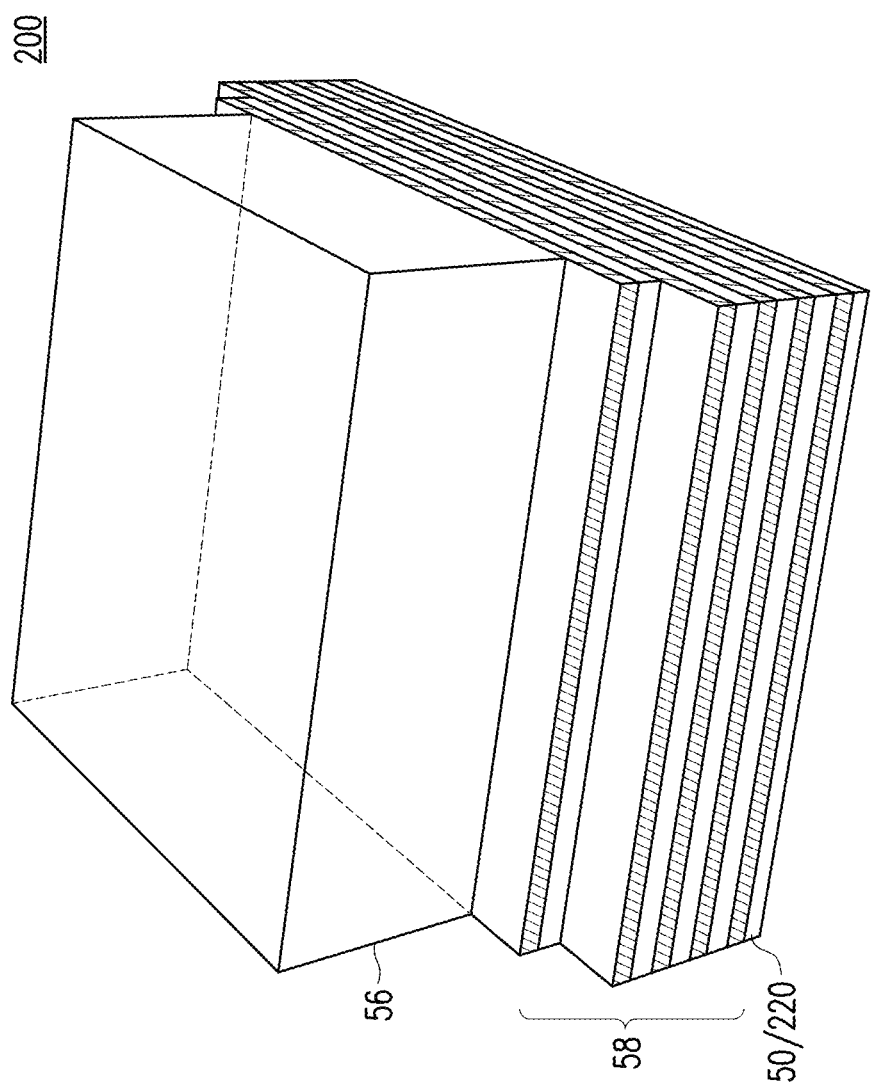
Figure 6B:
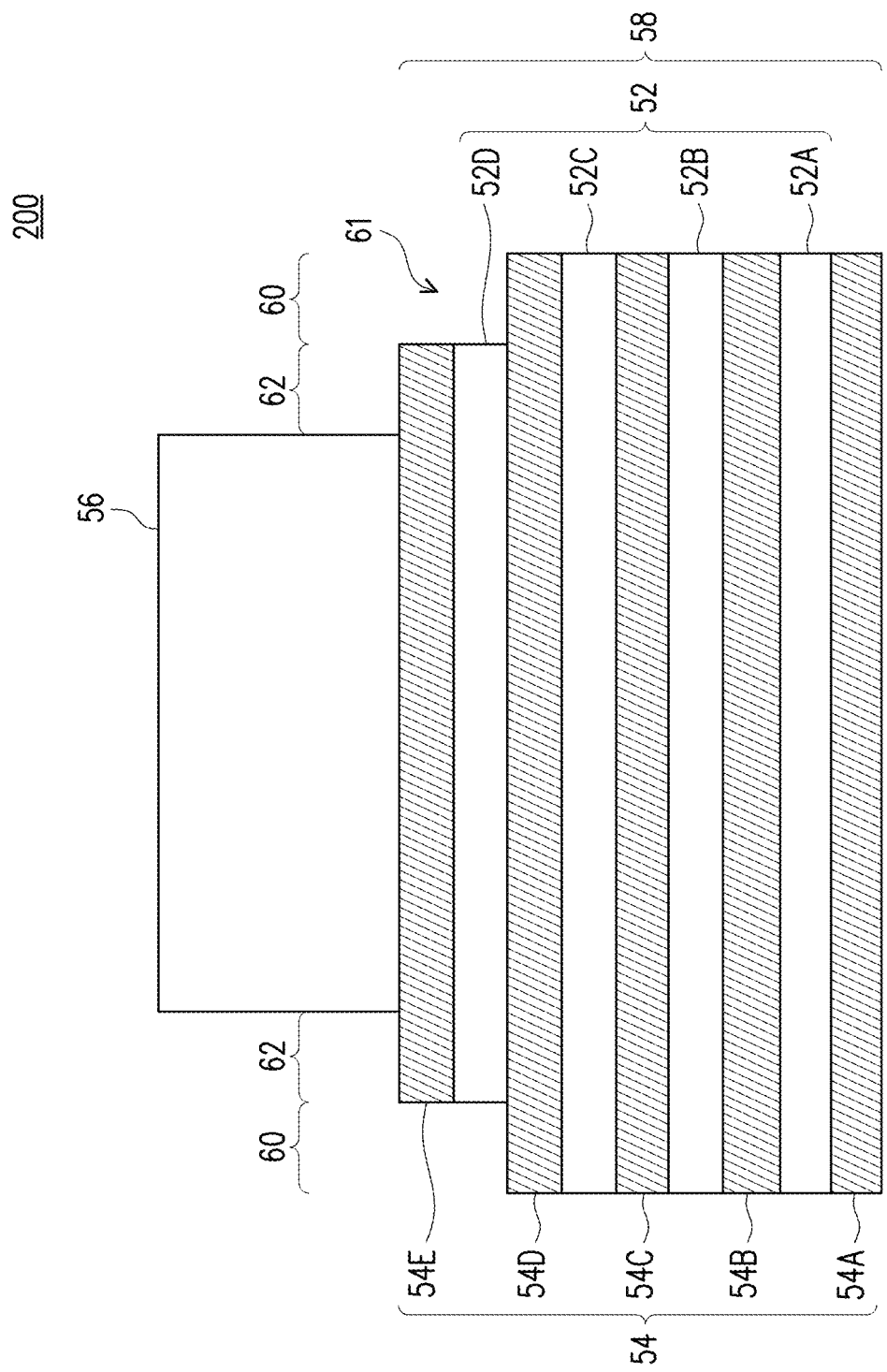

In FIGS. 6A and 6B, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54D may be exposed in the regions 60, and a top surface of the conductive layer 54E may be exposed in the regions 62.

Figure 7:
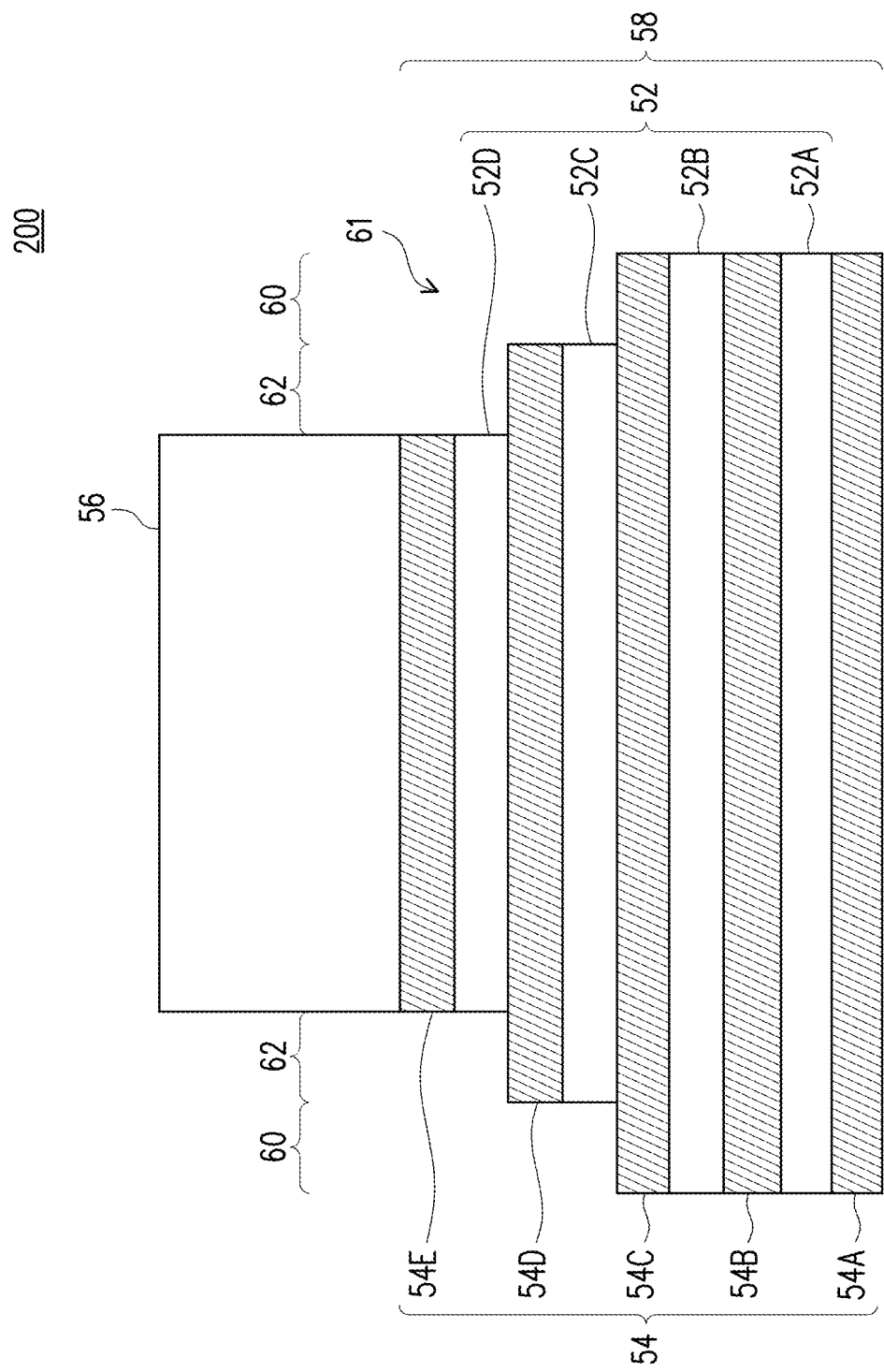

In FIG. 7, portions of the conductive layer 54E, the dielectric layer 52D, the conductive layer 54D, and the dielectric layer 52C in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54E/54D and the dielectric layers 52D/52C have different material compositions, etchants used to remove exposed portions of these layers may be different. In some embodiments, the dielectric layer 52D acts as an etch stop layer while etching the conductive layer 54E; the conductive layer 54D acts as an etch stop layer while etching dielectric layer 52D; the dielectric layer 52C acts as an etch stop layer while etching the conductive layer 54D; and the conductive layer 54C acts as an etch stop layer while etching the dielectric layer 52C. As a result, portions of the conductive layers 54E/54D and the dielectric layer 52D/52C may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54E and dielectric layer 52D (see FIGS. 6A and 6B) may be transferred to the underlying conductive layer 54D and dielectric layer 52C. In the resulting structure, the conductive layer 54C is exposed in the regions 60, and the conductive layer 54D is exposed in the regions 62.

Figure 8:
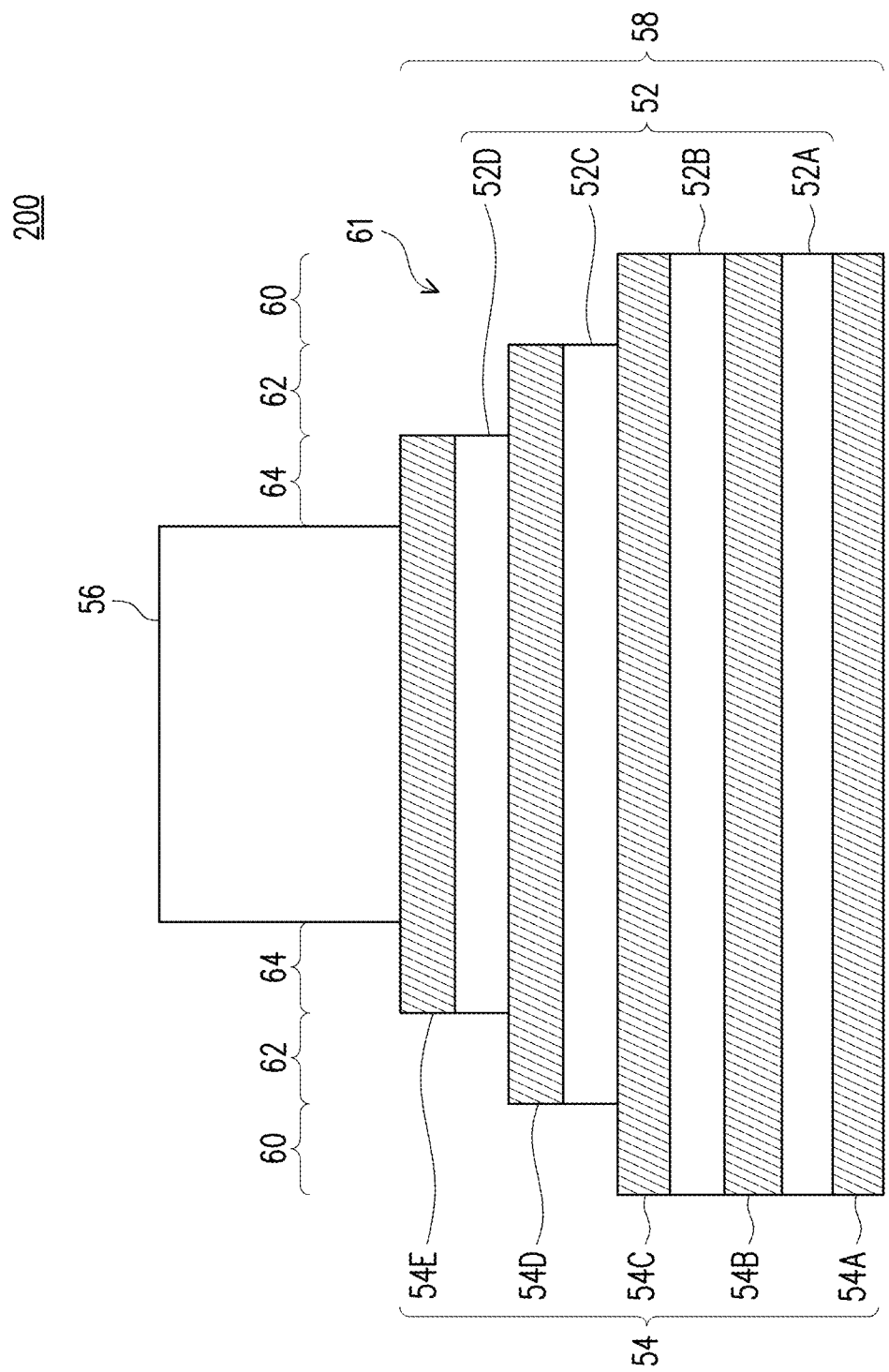

In FIG. 8, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 62, and 64 may be exposed. For example, a top surface of the conductive layer 54C may be exposed in the regions 60; a top surface of the conductive layer 54D may be exposed in the regions 62; and a top surface of the conductive layer 54E may be exposed in the regions 64.

Figure 9:
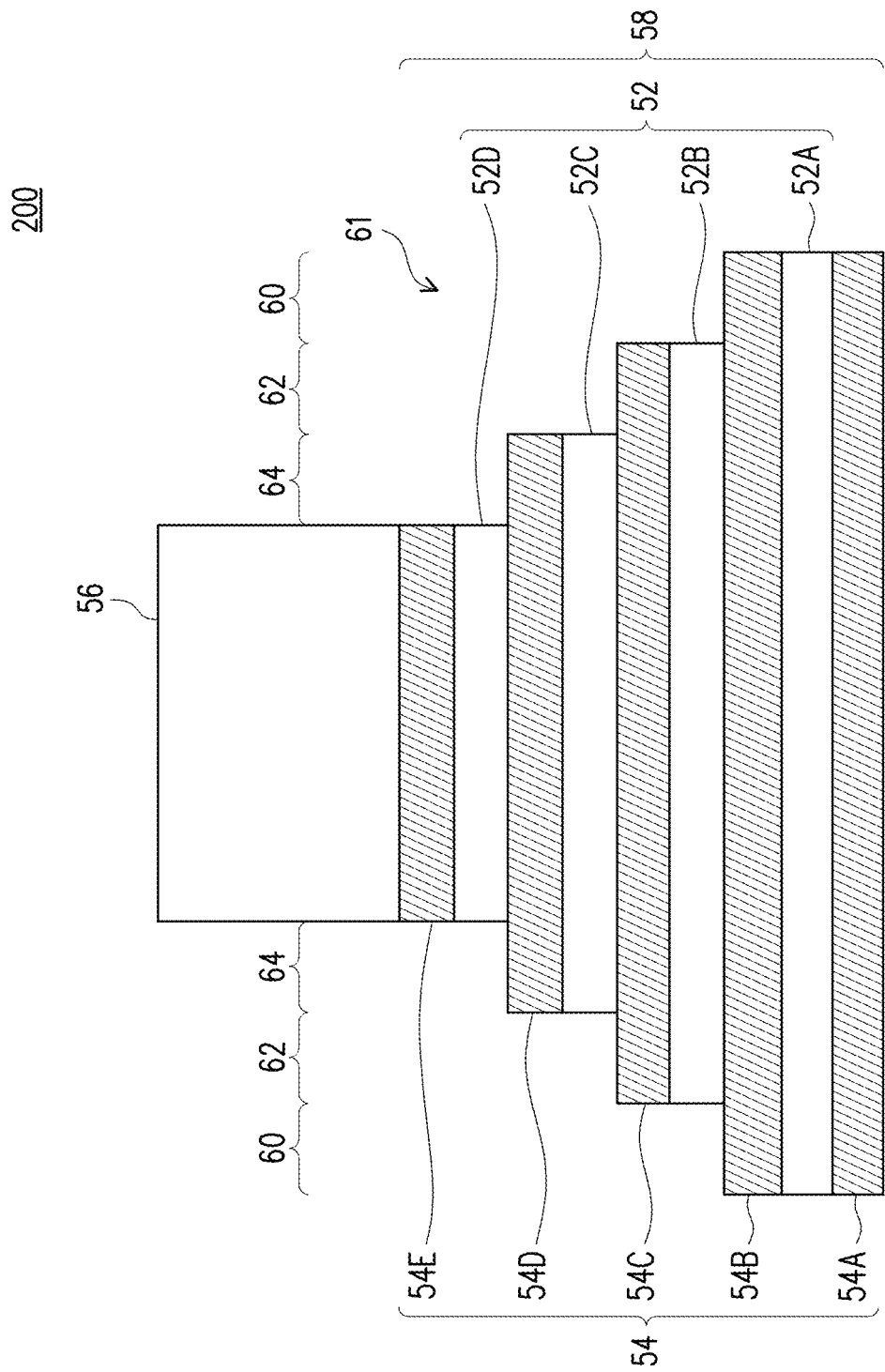

In FIG. 9, portions of the conductive layers 54E, 54D, and 54C and the dielectric layers 52D, 52C, and 52B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54E, 54D, and 54C and the dielectric layers 52D, 52C, and 52B have different material compositions, etchants used to remove exposed portions of these layers may be different. In some embodiments, the dielectric layer 52D acts as an etch stop layer while etching the conductive layer 54E; the conductive layer 54D acts as an etch stop layer while etching dielectric layer 52D; the dielectric layer 52C acts as an etch stop layer while etching the conductive layer 54D; the conductive layer 54C acts as an etch stop layer while etching the dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54E/54D/54C and the dielectric layer 52D/52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layers 54E/54D and the dielectric layers 52D/52C (see FIG. 8) may be transferred to the underlying conductive layers 54D/54C and dielectric layers 52C/52B. In the resulting structure, the conductive layer 54B is exposed in the regions 60; the conductive layer 54C is exposed in the regions 62; and the conductive layer 54B is exposed in the regions 64.

Figure 10:
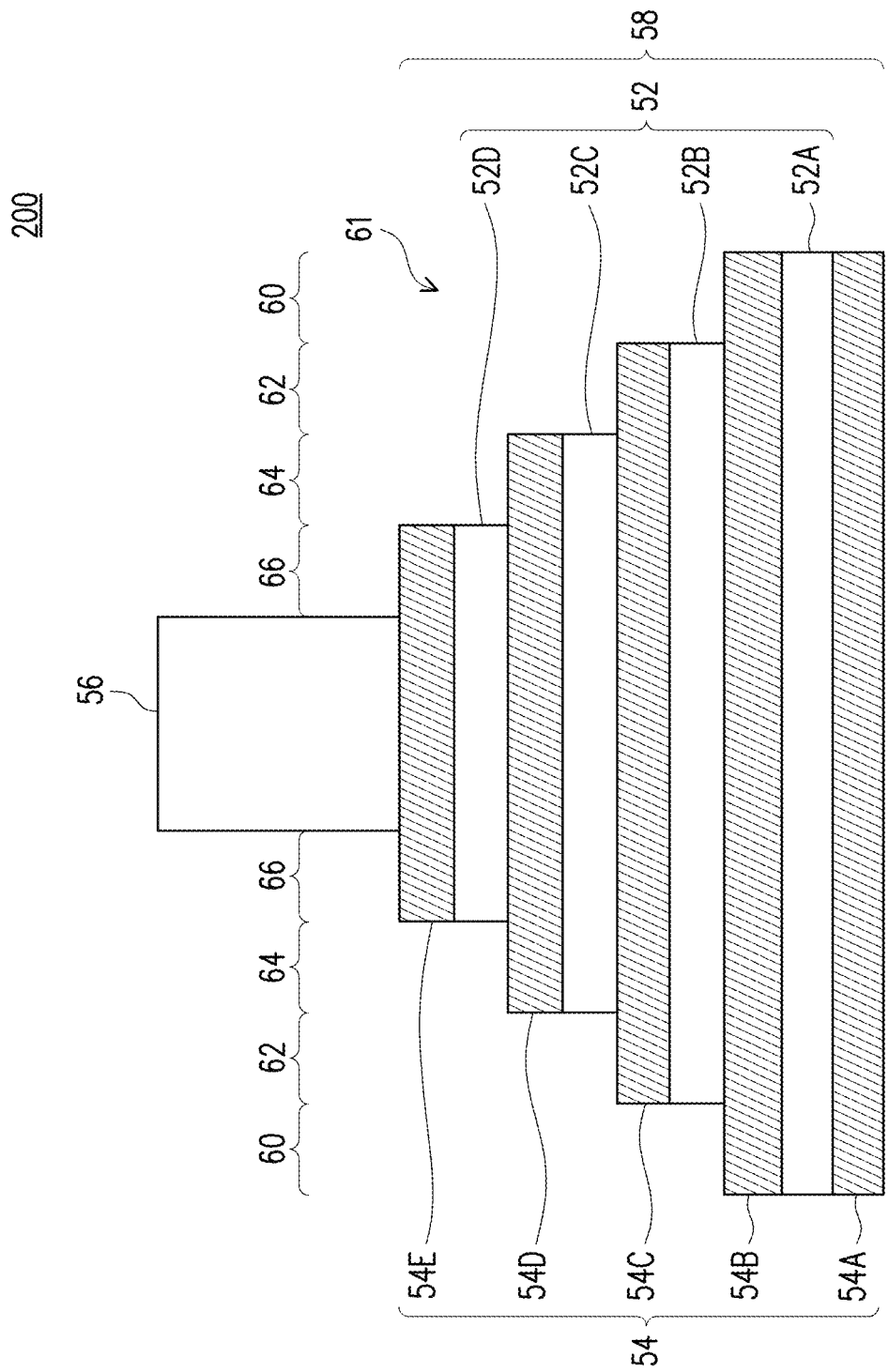

In FIG. 10, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 62, 64, and 66 may be exposed. For example, a top surface of the conductive layer 54B may be exposed in the regions 60; a top surface of the conductive layer 54C may be exposed in the regions 62; a top surface of the conductive layer 54D may be exposed in the regions 64; and a top surface of the conductive layer 54E may be exposed in the regions 66.

Figure 11:
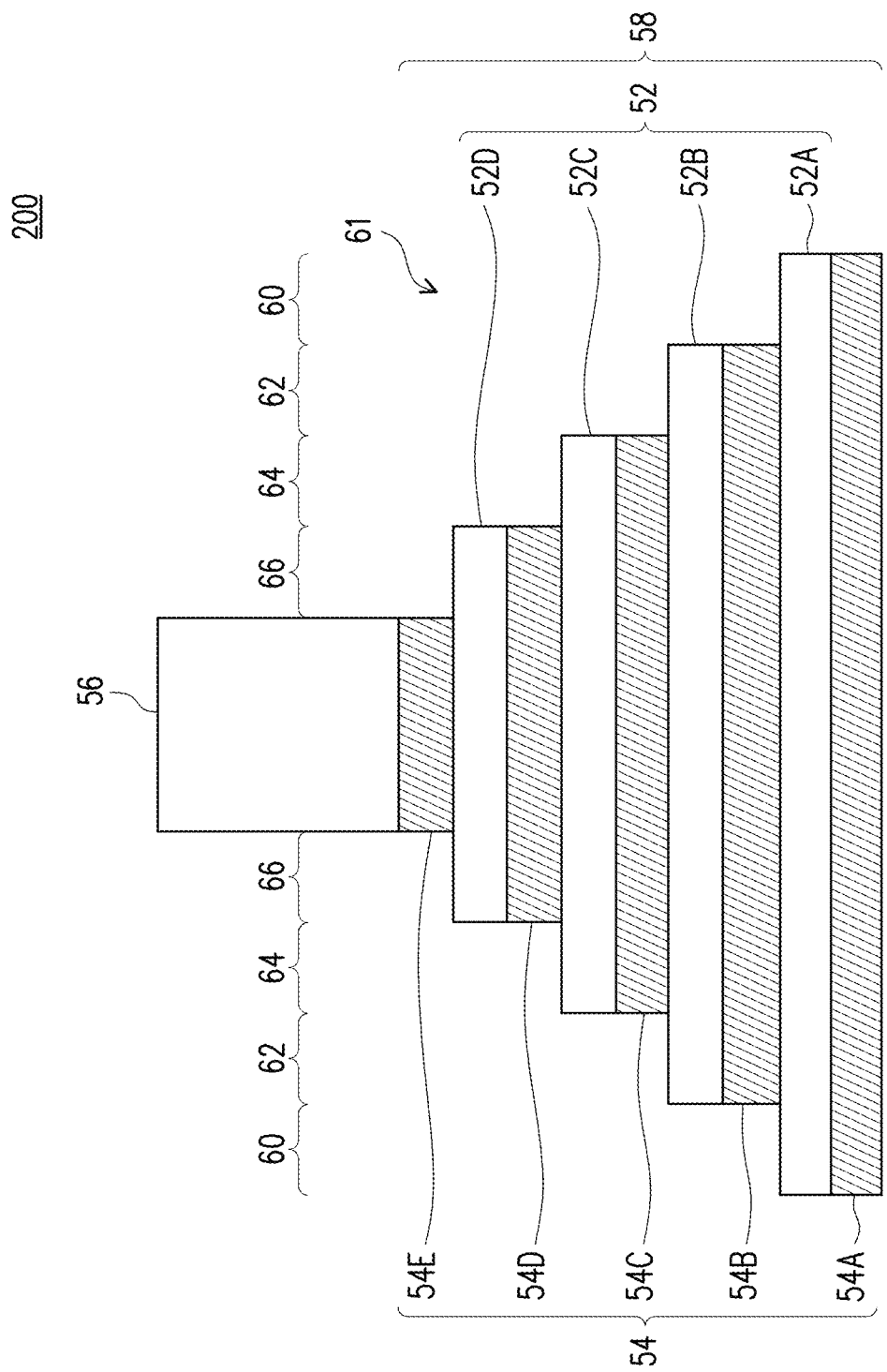

In FIG. 11, portions of the conductive layers 54E, 54D, 54C, and 54B in the regions 60, 62, 64, and 66 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52D acts as an etch stop layer while etching the conductive layer 54E; the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54E, 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52D/52C/52B (see FIG. 10) may be transferred to the underlying conductive layers 54D/54C/54B. In the resulting structure, the dielectric layer 52A is exposed in the regions 60; the dielectric layer 52B is exposed in the regions 62; the dielectric layer 52C is exposed in the regions 64; and the dielectric layer 52D is exposed in the regions 66.

Figure 12A:
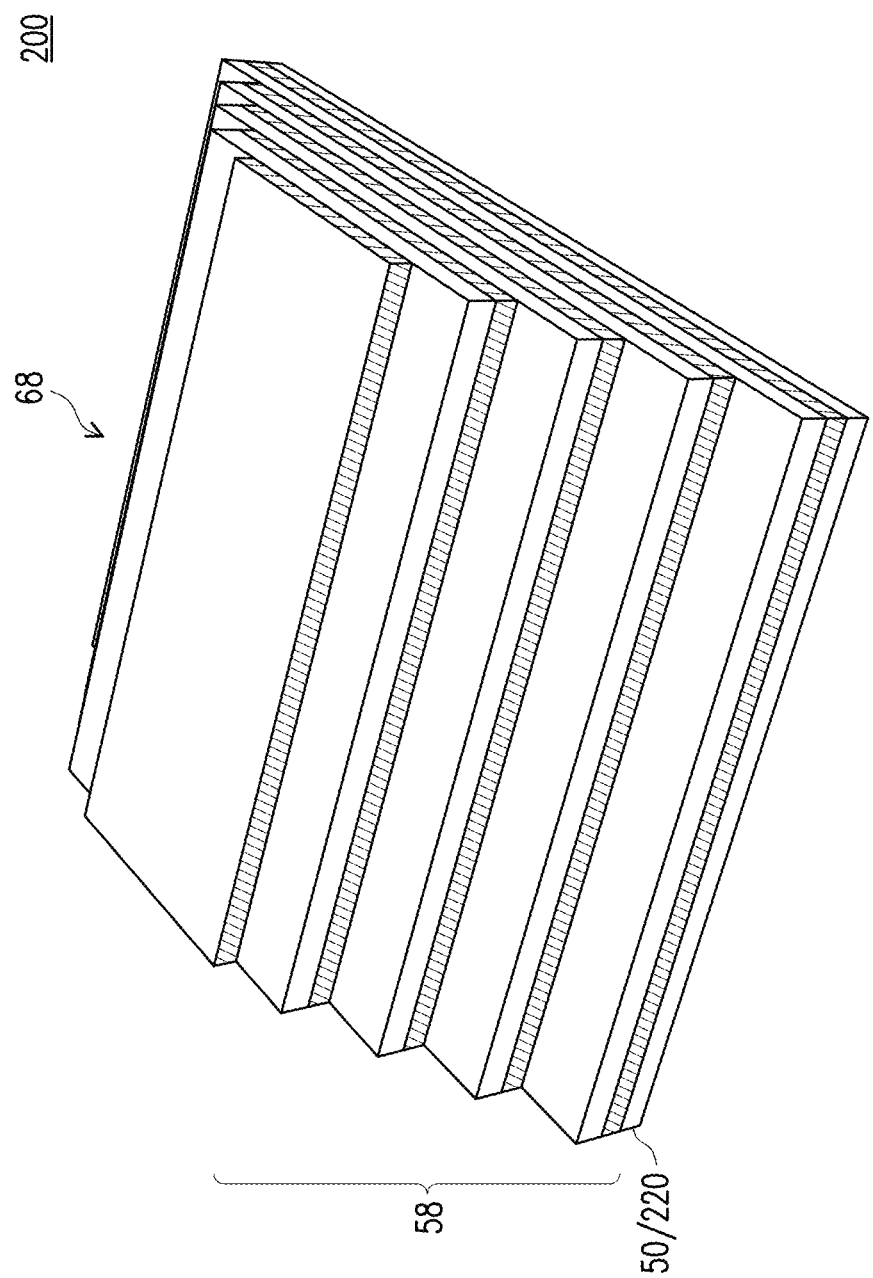
Figure 12B:
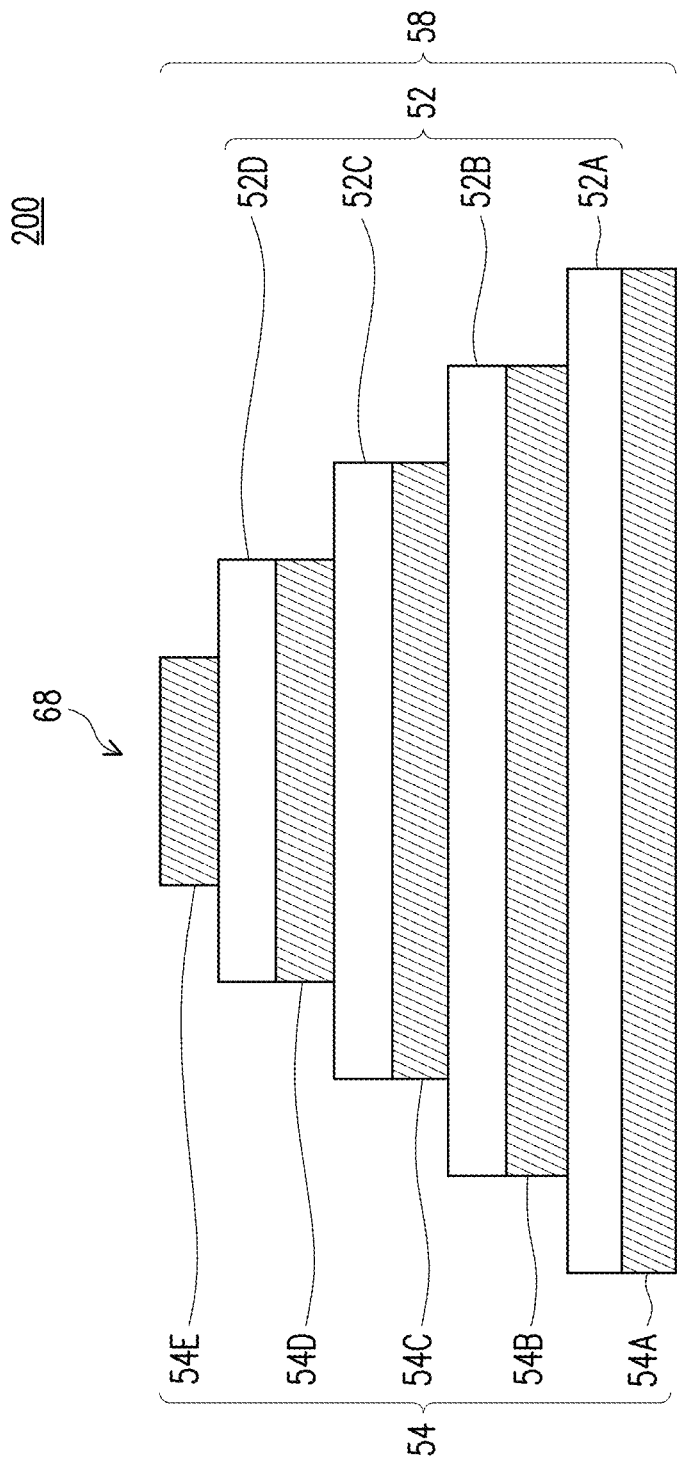

In FIGS. 12A and 12B the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are longer and extend laterally past upper conductive layers 54, and a length of each of the conductive layers 54 increases in a direction towards the substrate 50. For example, the conductive layer 54A may be longer than the conductive layer 54B; the conductive layer 54B may be longer than the conductive layer 54C; the conductive layer 54C may be longer than the conductive layer 54D; and the conductive layer 54D may be longer than the conductive layer 54E. As a result, conductive contacts can be made from above the staircase structure 68 to each of the conductive layers 54 in subsequent processing steps.

Figure 13A:
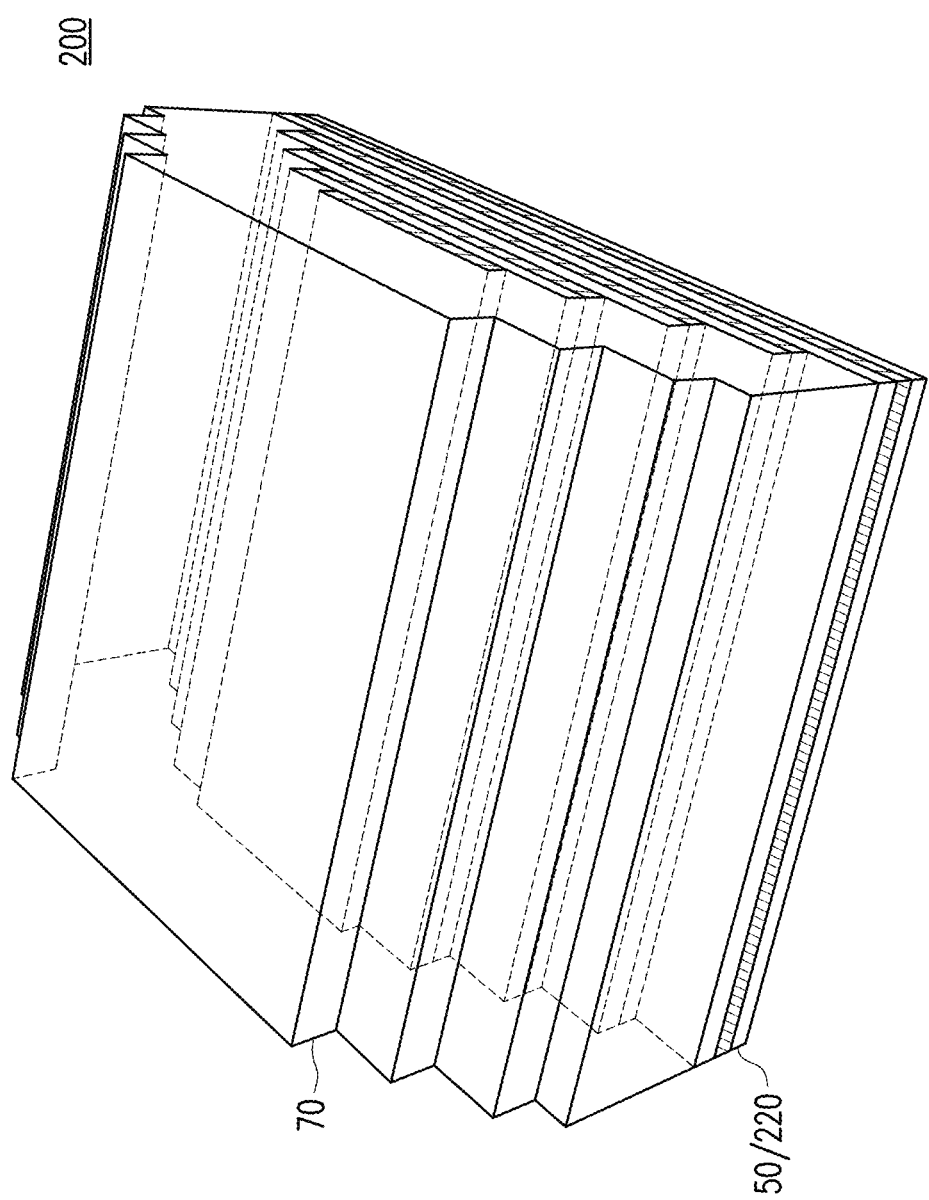
Figure 13B:
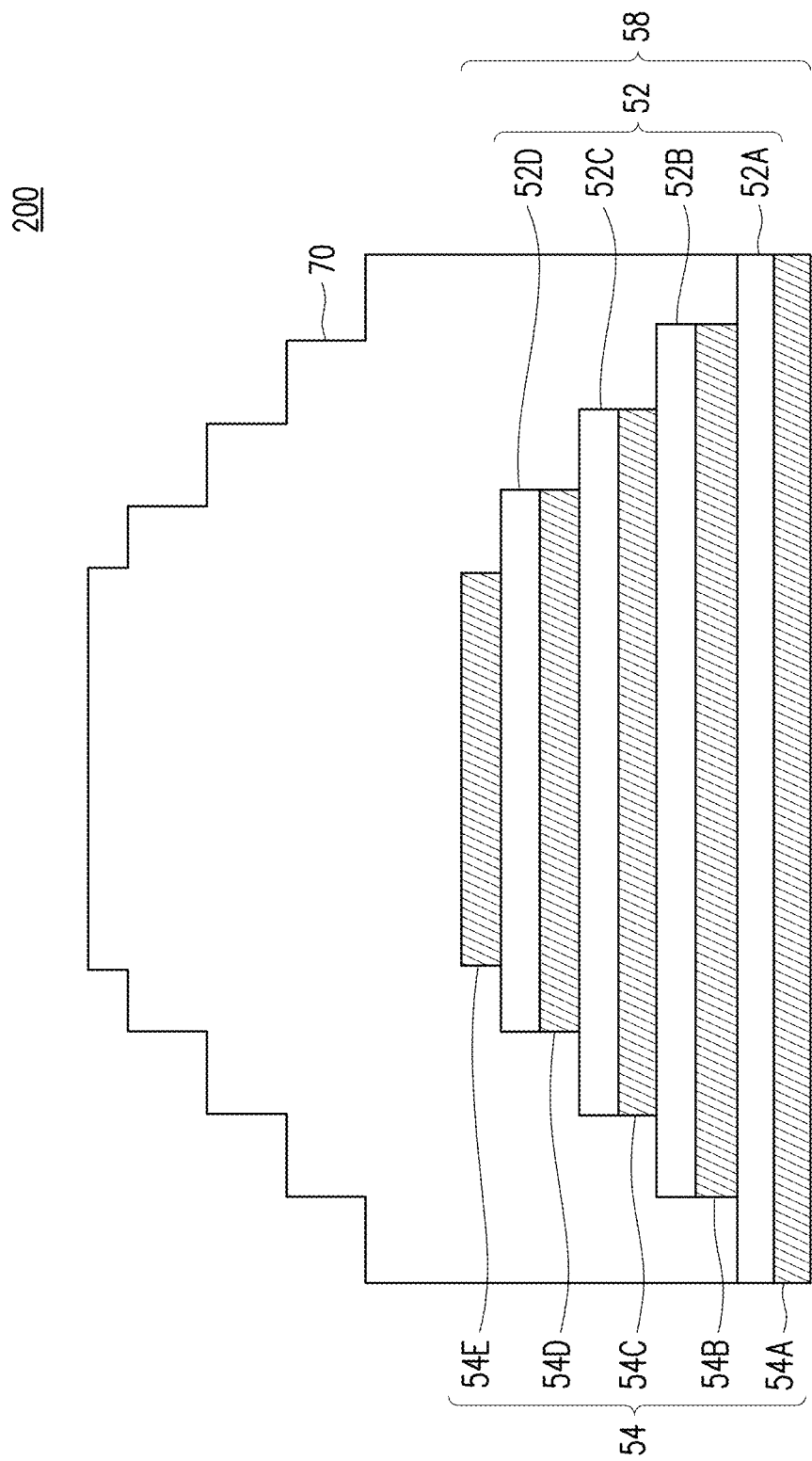

In FIGS. 13A and 13B, an intermetal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54E, 54D, 54C, and 54B as well as sidewalls of the dielectric layers 52D, 52C, and 52B. Further, the IMD 70 may contact top surfaces of each of the dielectric layers 52.

Figure 14A:
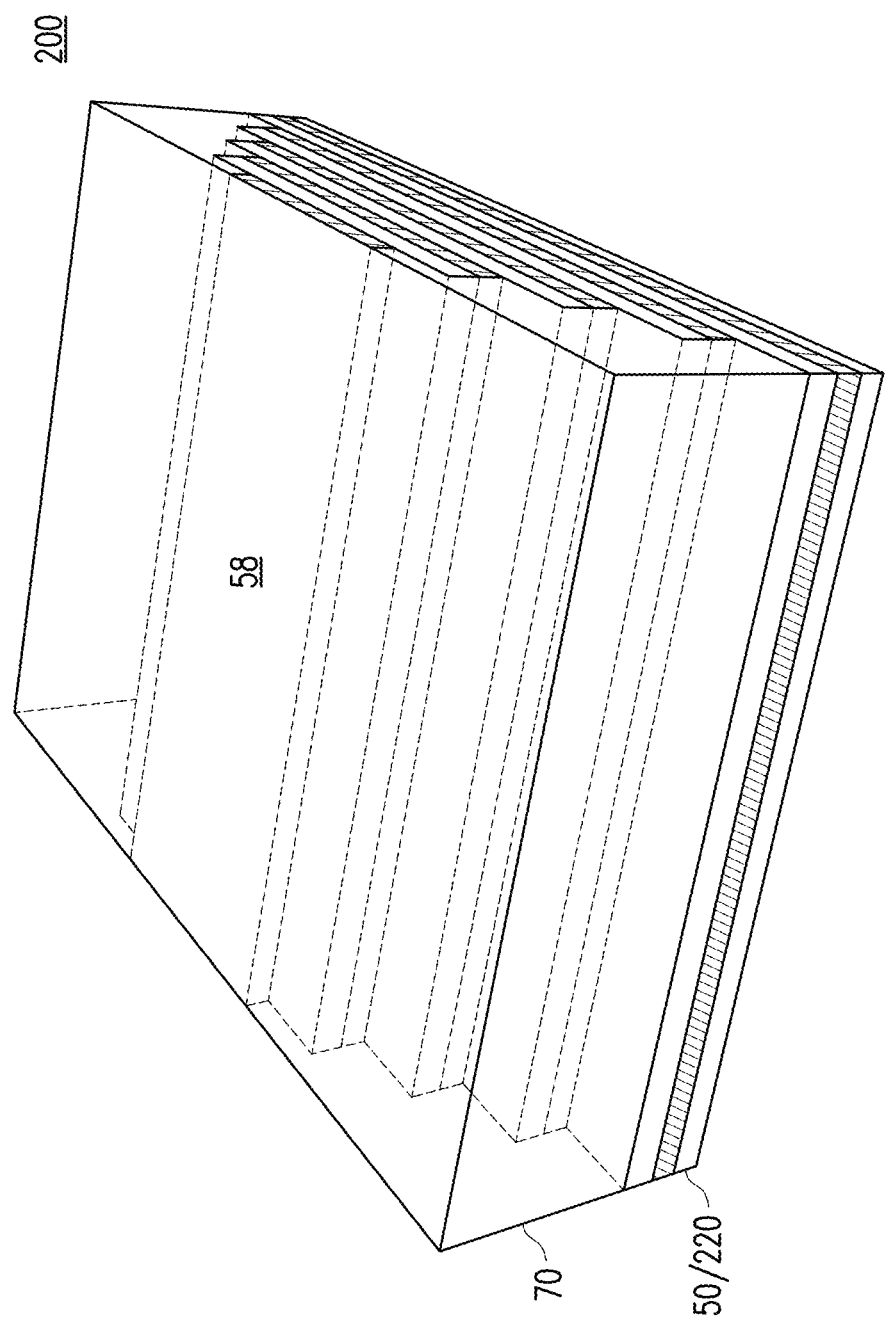
Figure 14B:
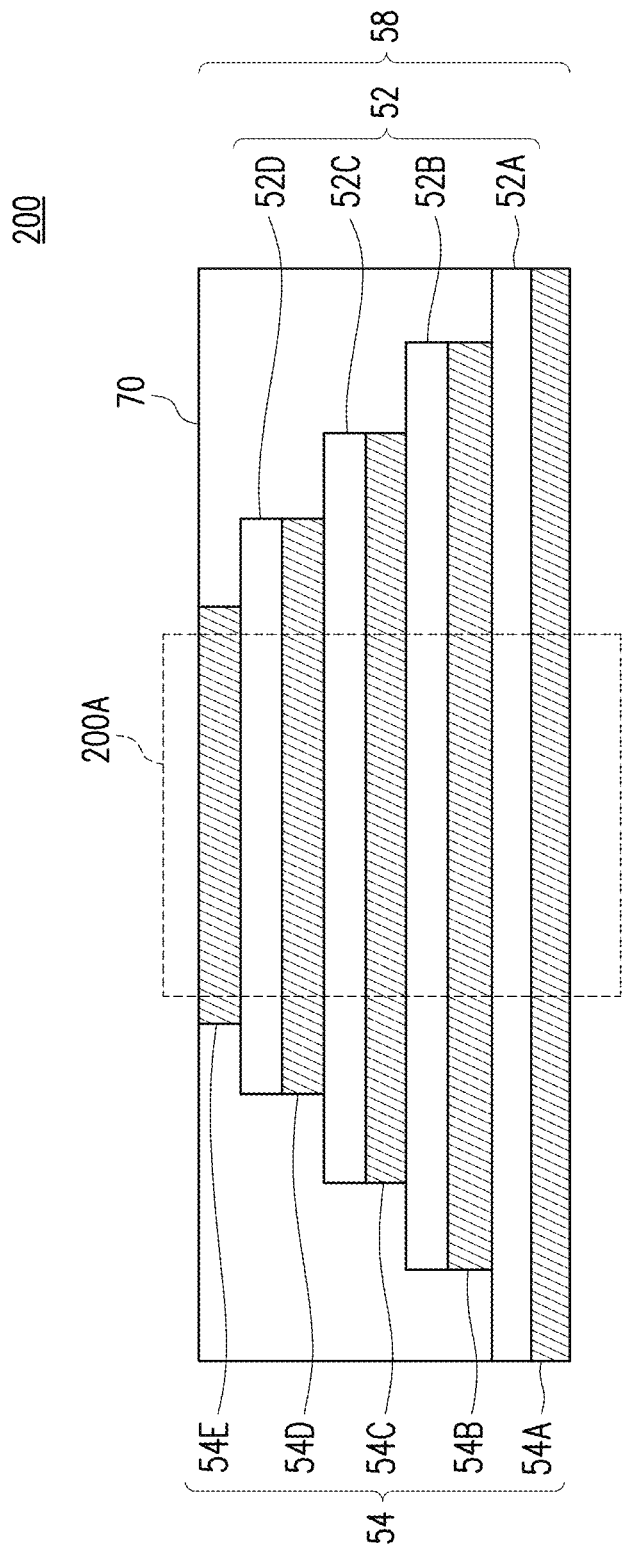

In FIGS. 14A and 14B, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

Figure 15A:
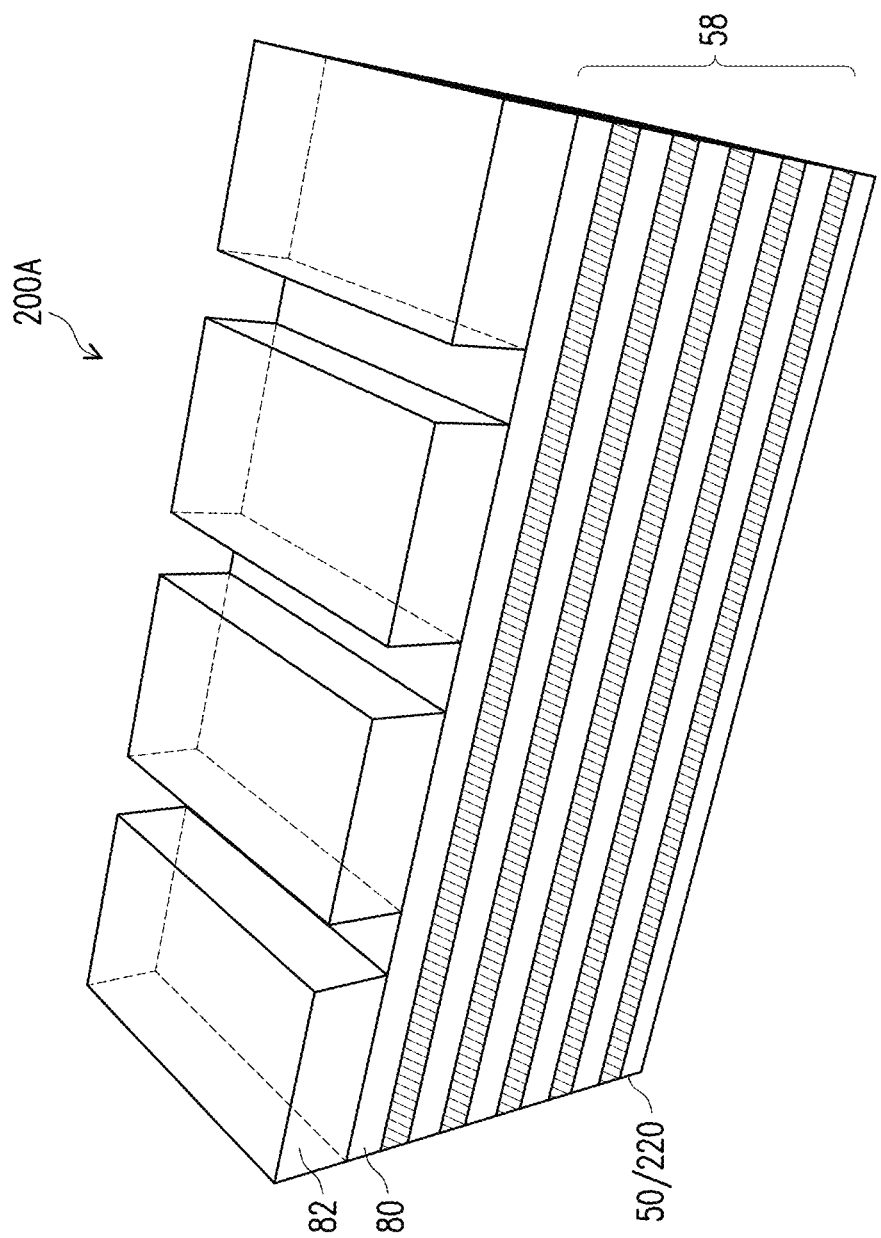

In FIGS. 15A through 18C, trenches are formed in the multi-layer stack 58, thereby defining the conductive lines 72. The conductive lines 72 may correspond to word lines in the memory array 200, and the conductive lines 72 may further provide gate electrodes for the resulting TFTs of the memory array 200. In FIGS. 15A through 18C, figures ending in "A" illustrate a perspective view, figures ending in "B" illustrate a cross-sectional view along line B-B' of FIG. 1A, and figures ending in "C" illustrate a cross-sectional view along line C-C' of FIG. 1A. For ease of illustration, FIGS. 15A, 16A, and 17A illustrate a portion of the multi-layer stack 58 in the region 200A (see FIG. 14B).

Figure 15B:
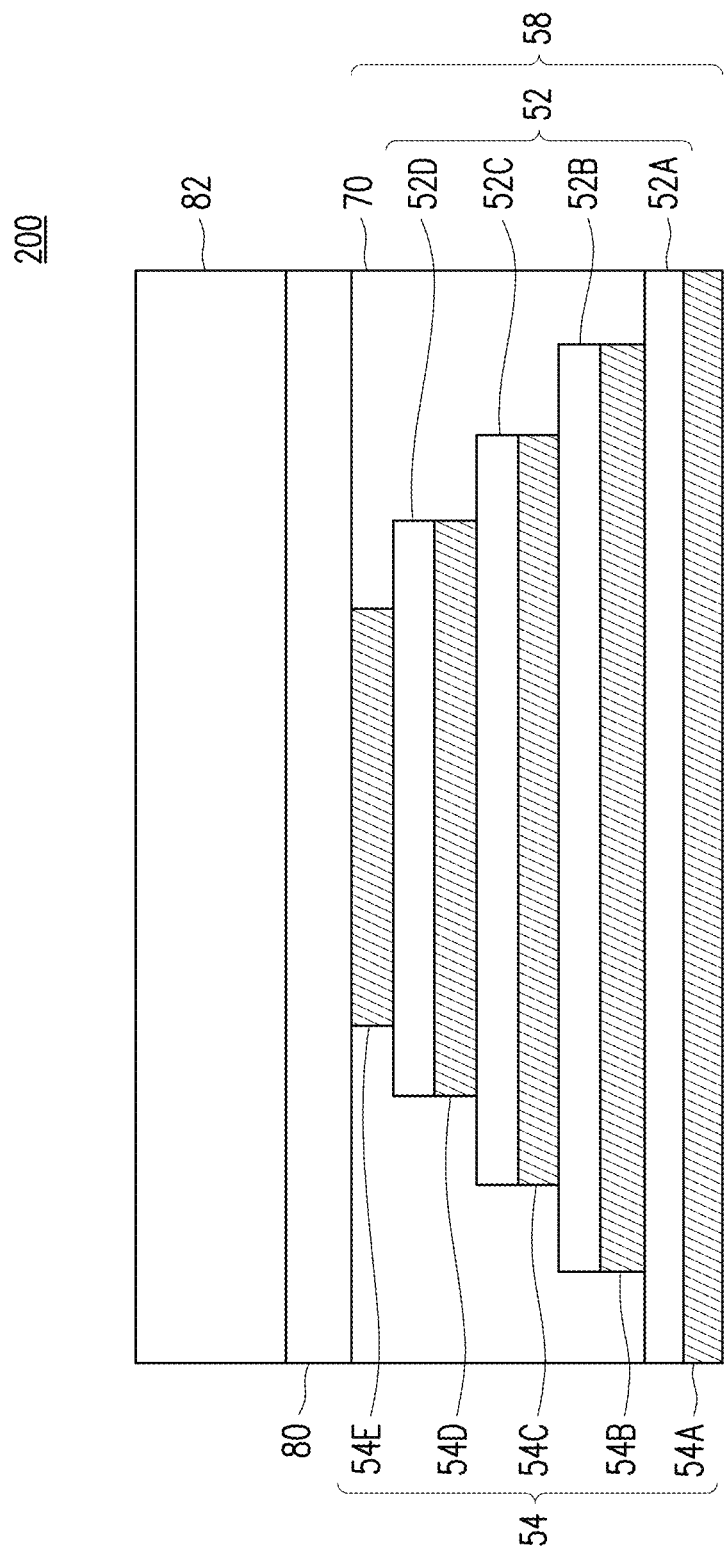
Figure 15C:
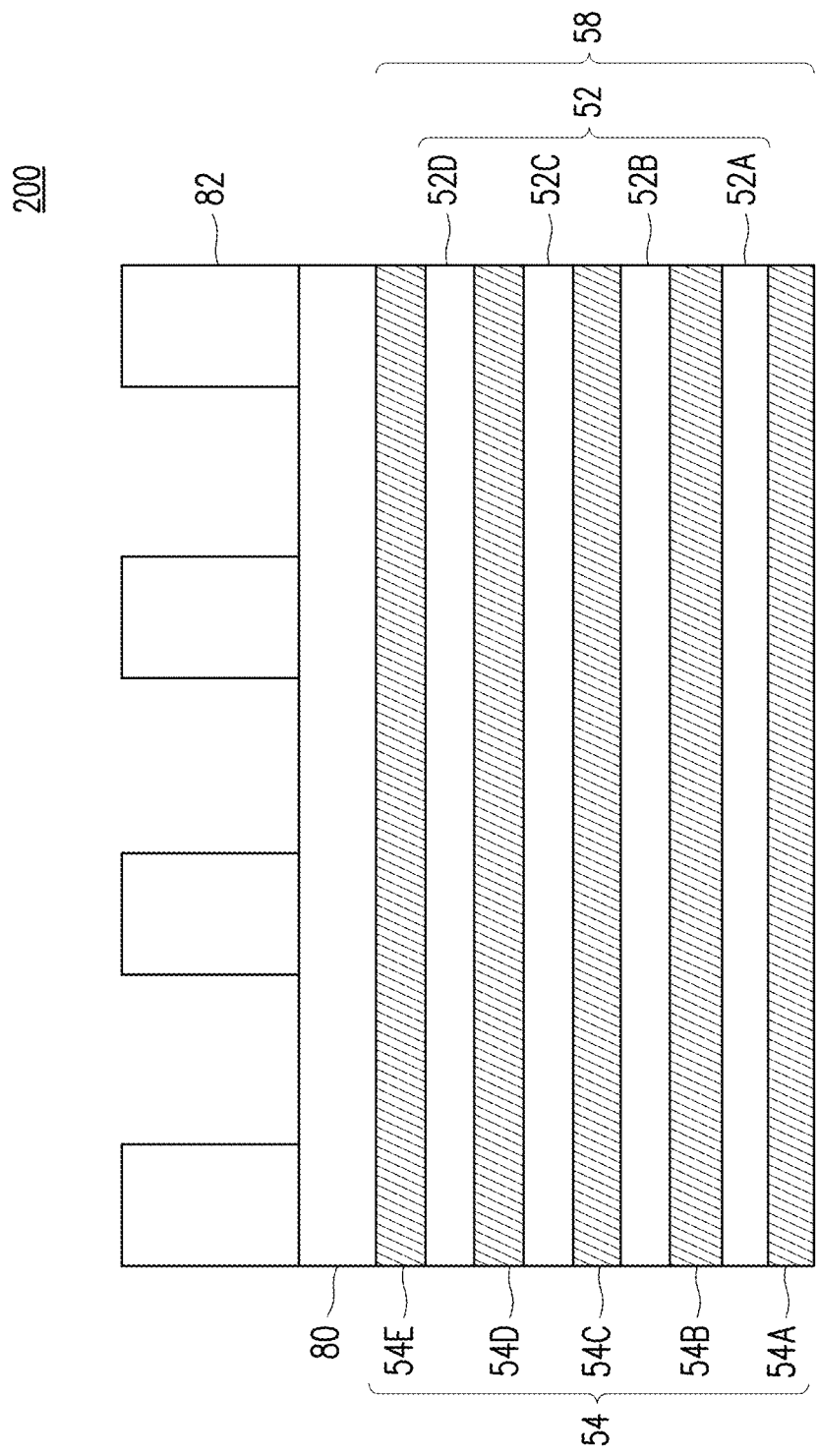

In FIGS. 15A, 15B, and 15C a hard mask 84 is deposited over the multi-layer stack 58 and inter-metal dielectric 70. The hard mask layer 84 may include, for example, silicon nitride, silicon oxynitride, or the like, which may be deposited by CVD, PVD, ALD, PECVD, or the like. A photoresist 82 is formed and patterned over the hard mask 84. The photoresist 82 can be formed by using a spin-on technique and can be patterned using acceptable photolithography techniques.

Figure 16A:
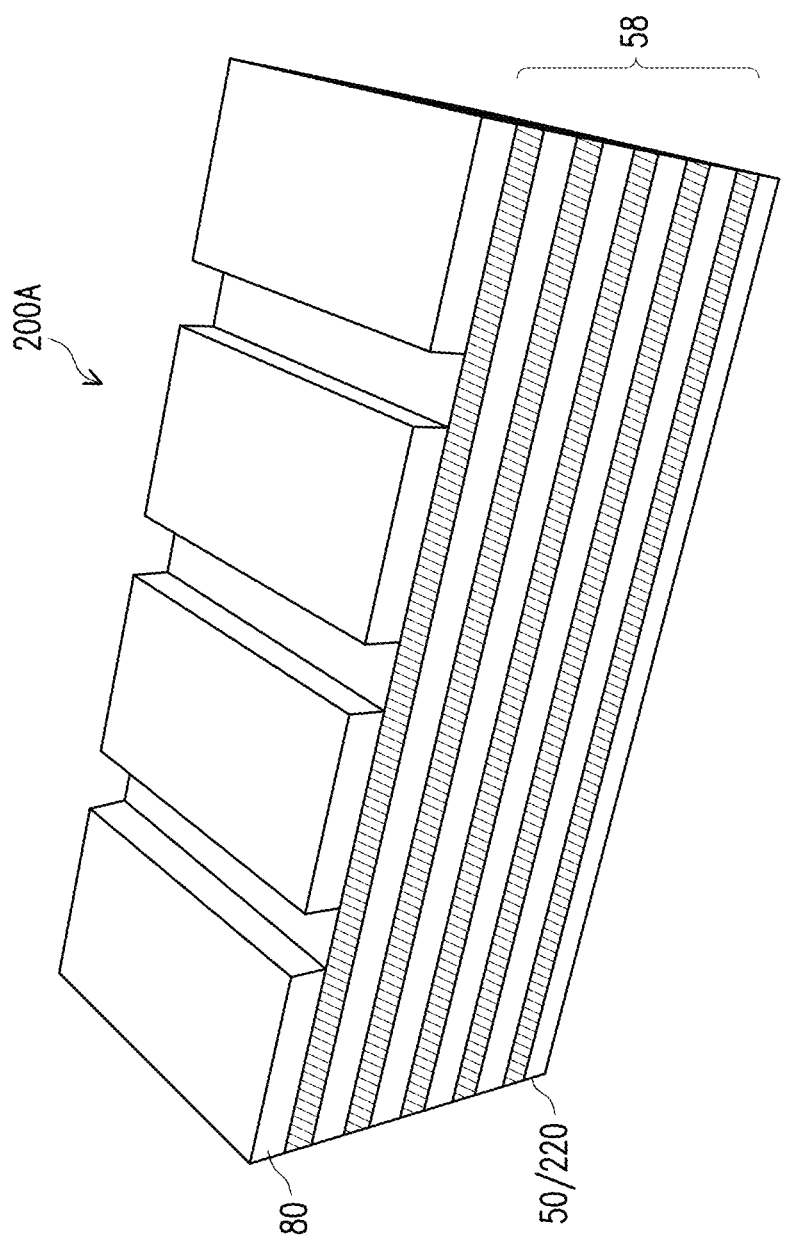
Figure 16B:
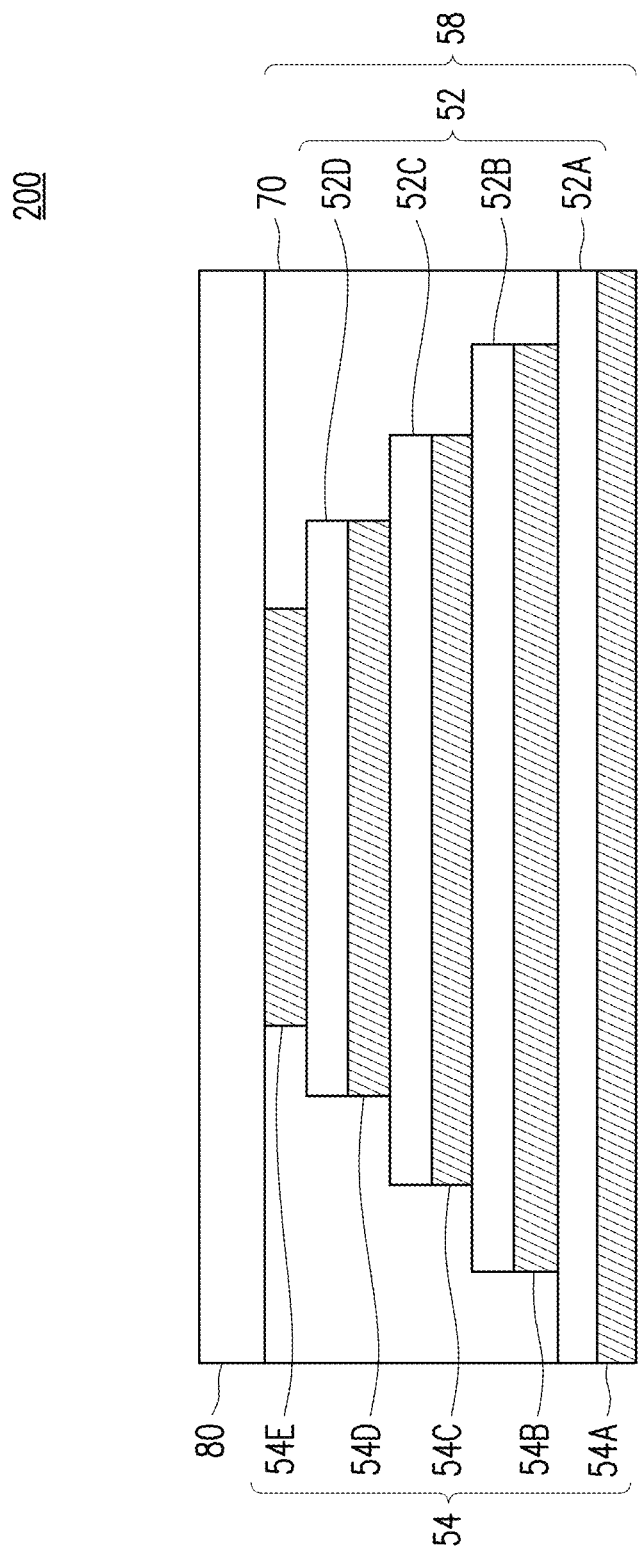
Figure 16C:
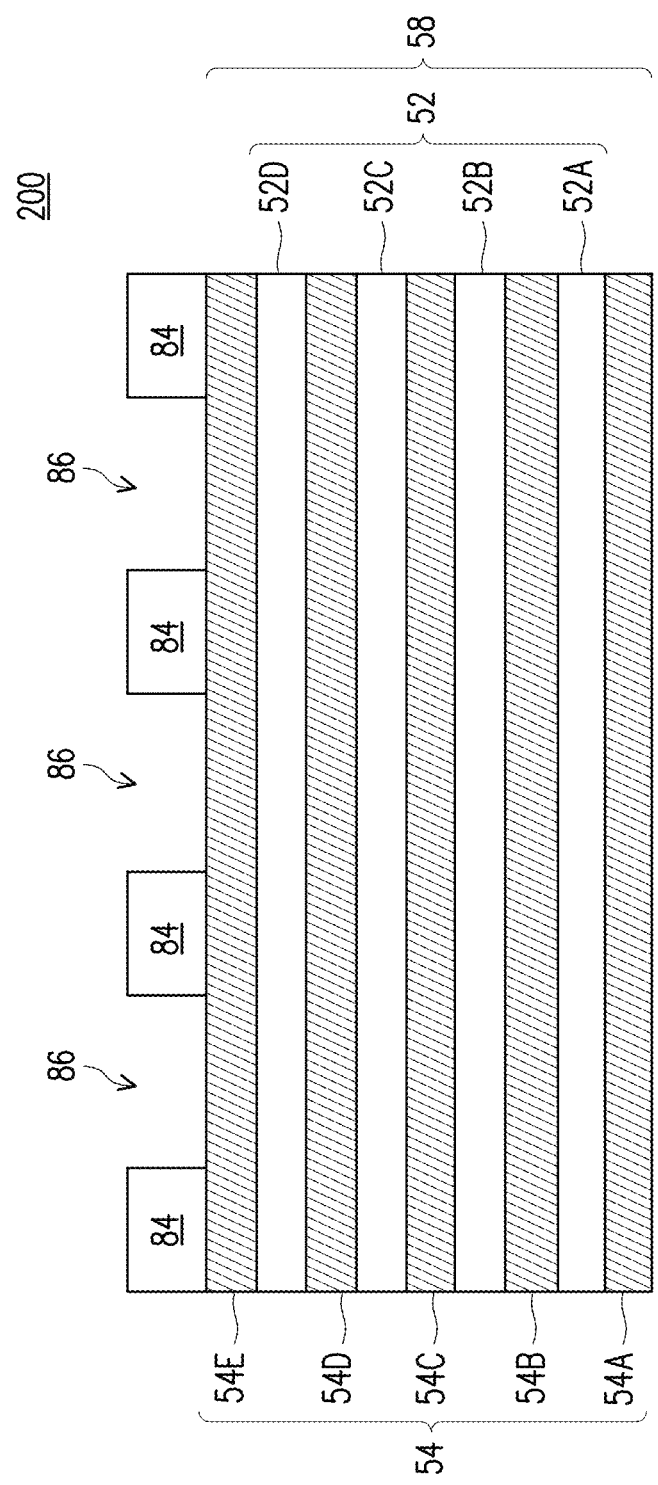

In FIGS. 16A, 16B, and 16C, a pattern of the photoresist 82 is transferred to the hard mask 84 using an acceptable etching process, such as by wet or dry etching, a reactive ion etch (RIE), neutral beam etch (NBE), the like, or a combination thereof. The etching may be anisotropic. Thus, trenches 86 are formed in the hard mask 84.

Figure 17A:
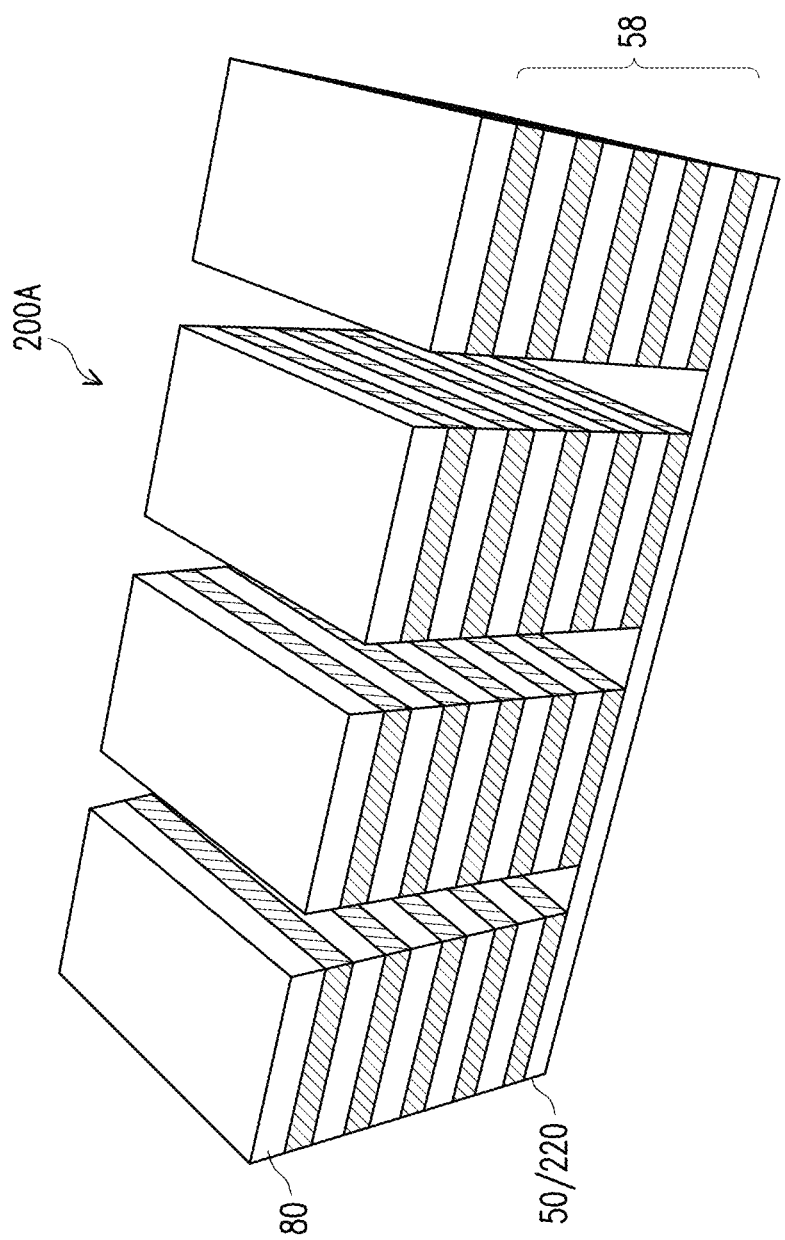
Figure 17B:
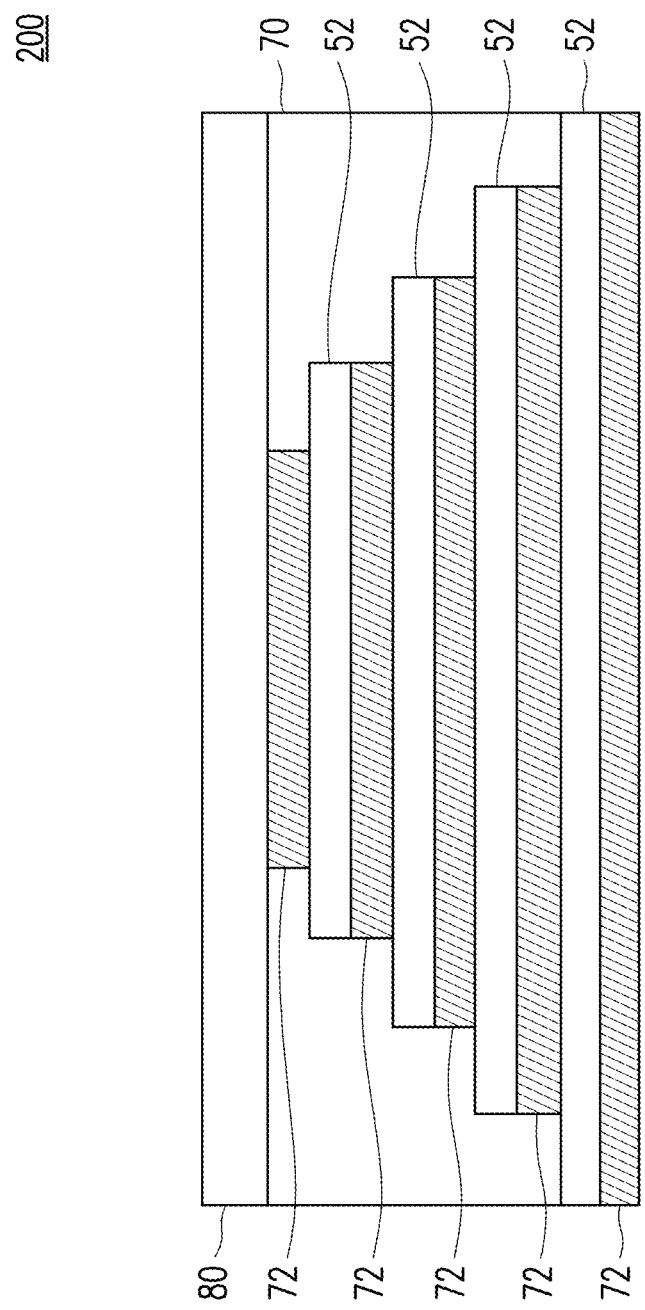
Figure 17C:
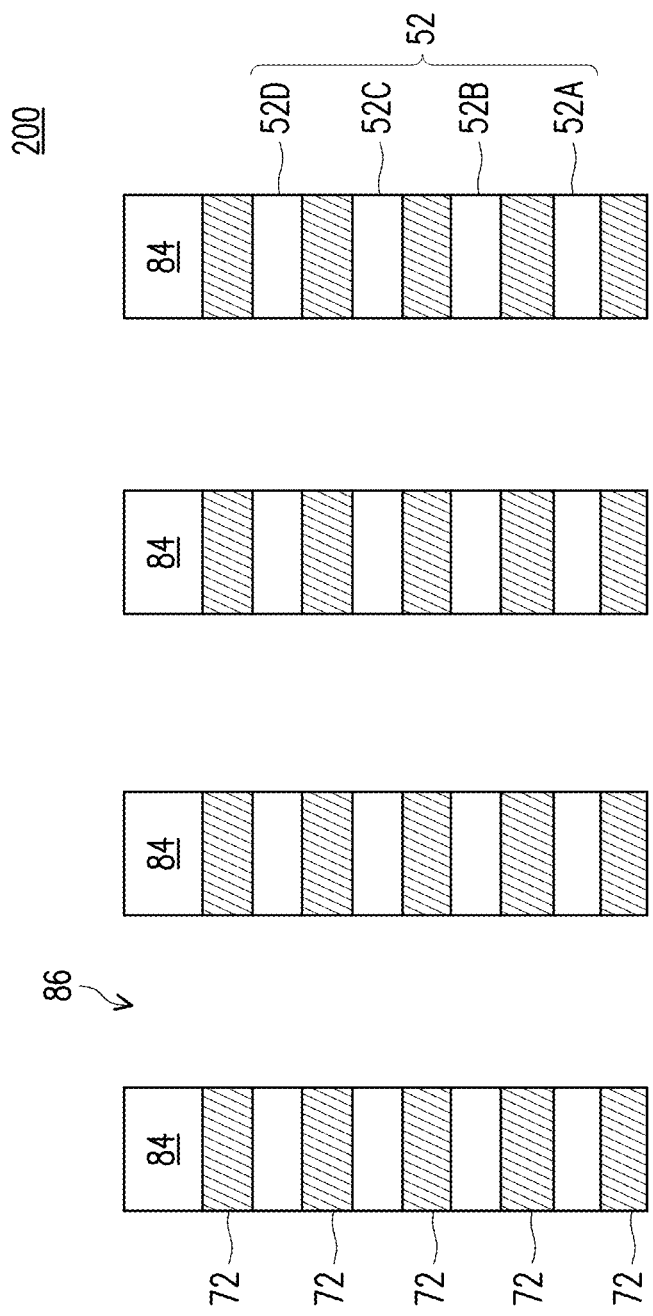
Figure 18A:
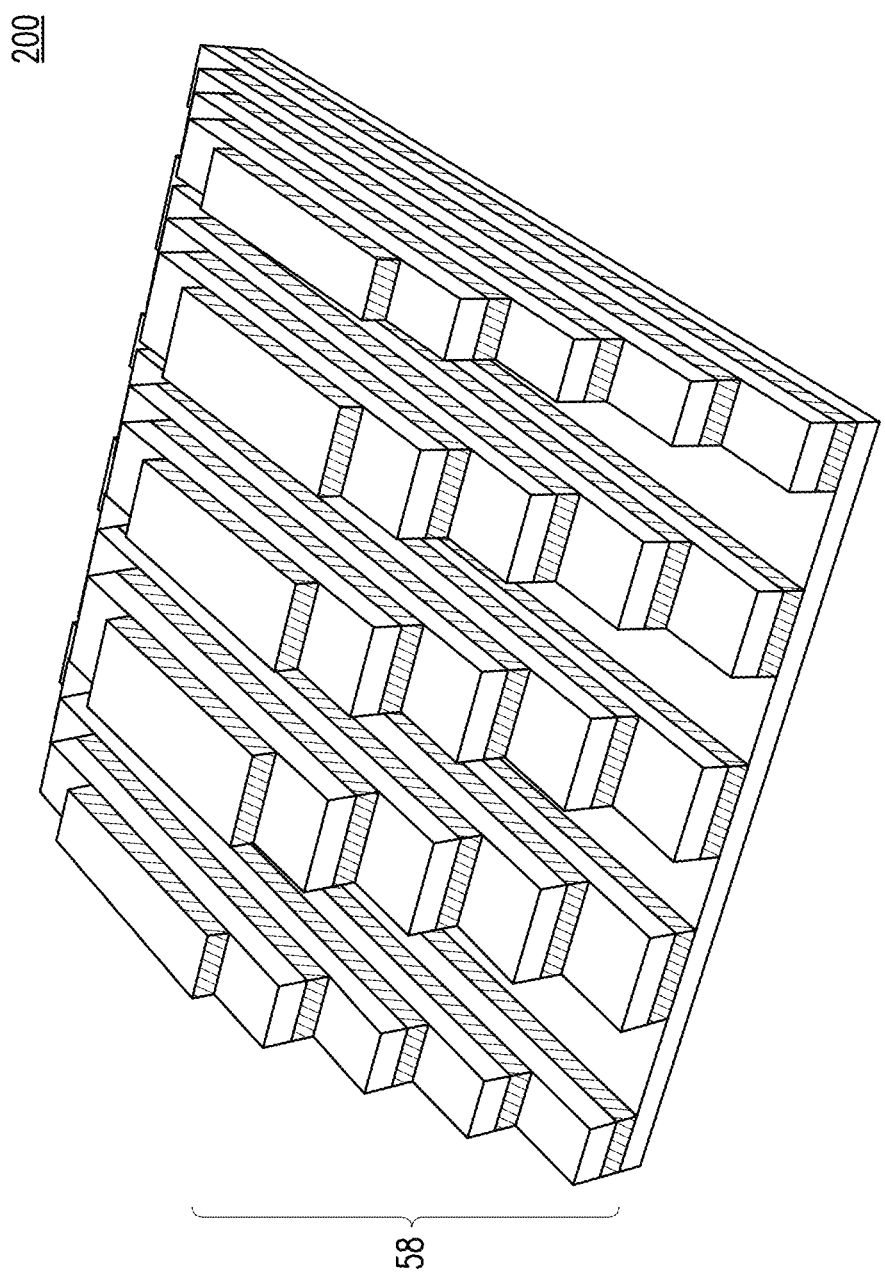
Figure 18B:
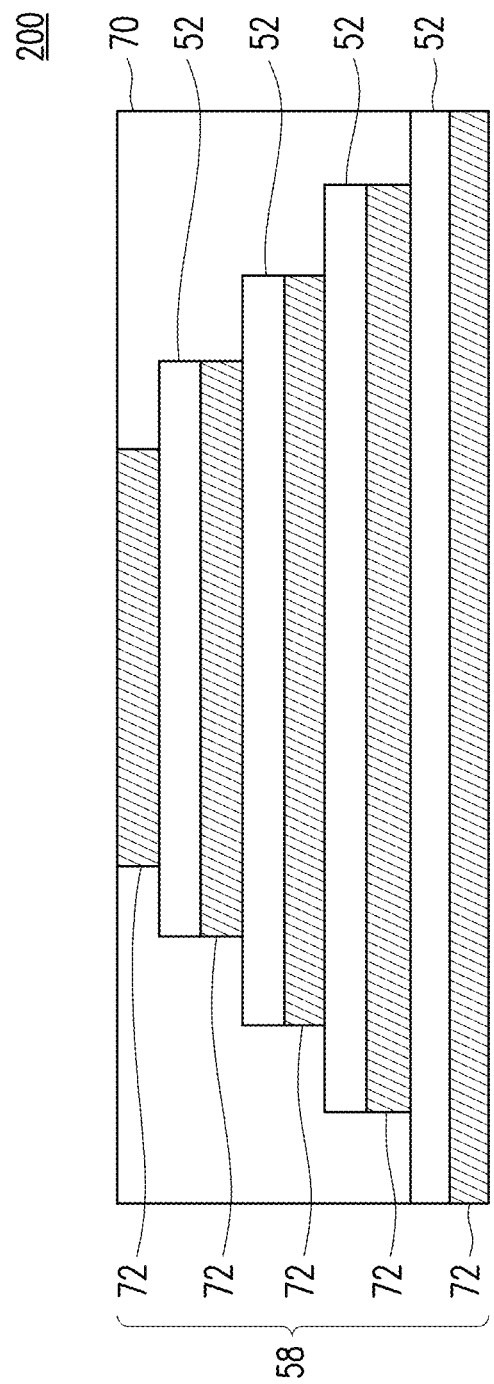
Figure 18C:
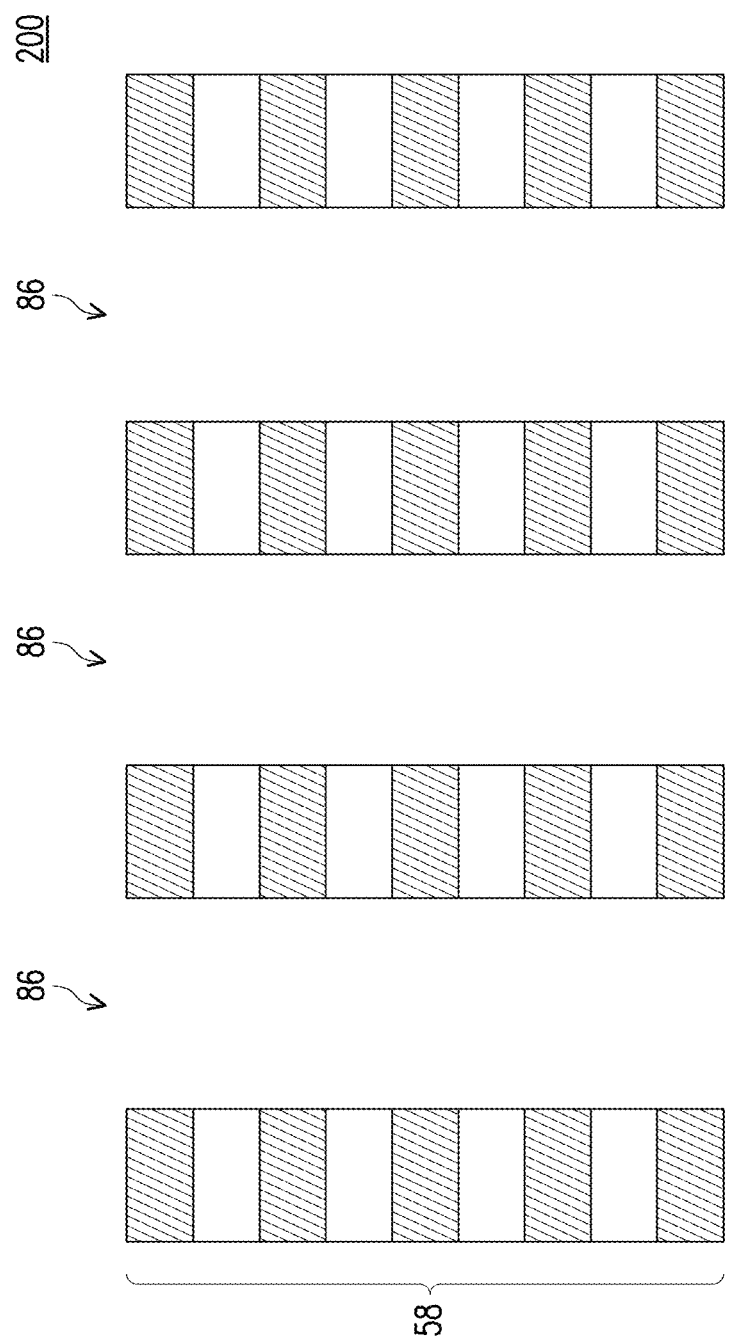

In FIGS. 17A, 17B, and 17C, a pattern of the hard mask 84 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 18A, 18B, and 18C, the hard mask 84 may then be removed by an acceptable process, such as a wet etching process, a dry etching process, a planarization process, combinations thereof, or the like.

FIGS. 19 through 25 illustrate forming and patterning channel regions for the TFTs 204 (see FIG. 1A) in the trenches 86. In FIGS. 19 through 25, cross-sectional views are provided along line C-C' of FIG. 1A.

Figure 19:
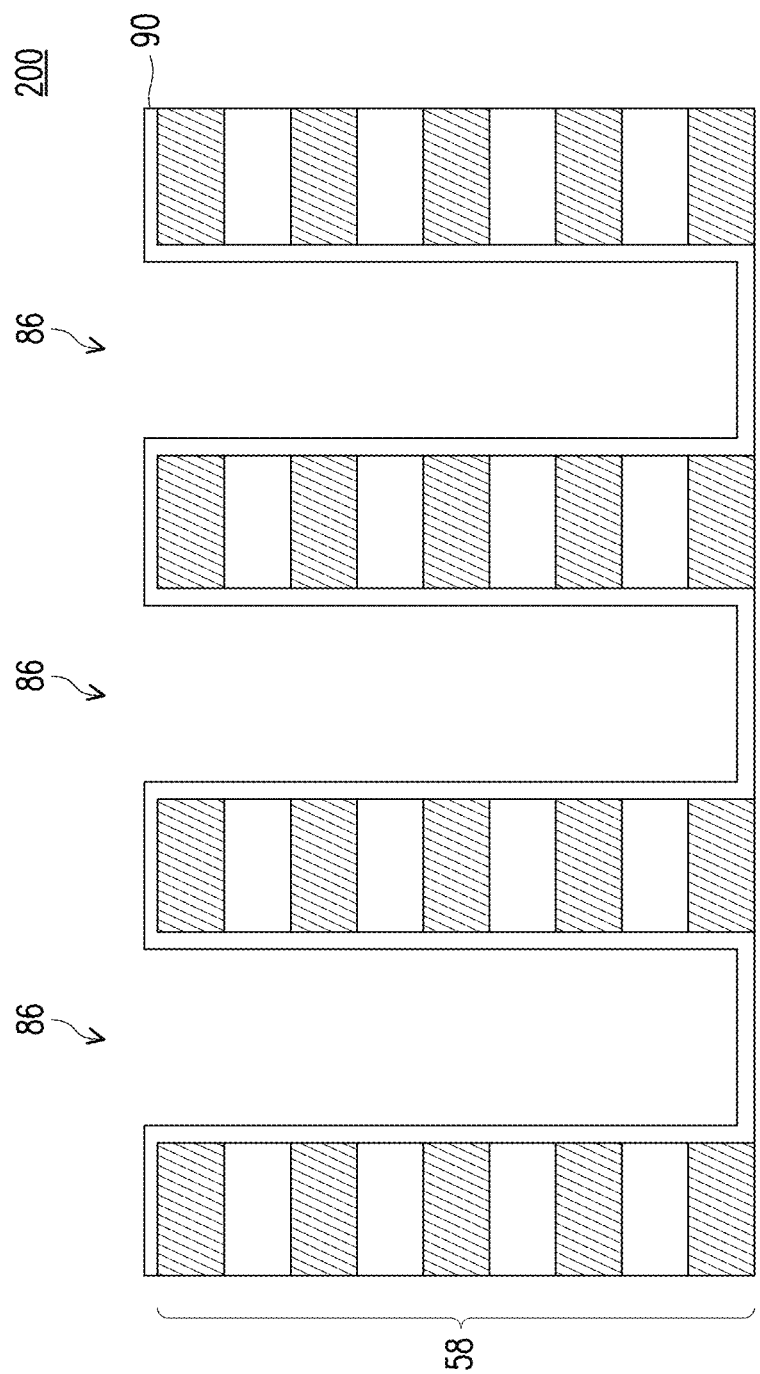

In FIG. 19, a FE material 90 is conformally deposited in the trenches 86. The FE material 90 may have a material that is capable of switching between two different polarization directions by applying an appropriate voltage differential across the FE material 90. For example, the FE material 90 may be a high-k dielectric material, such as a hafnium (Hf) based dielectric material, or the like. In some embodiments, the FE material 90 comprises hafnium oxide, hafnium zirconium oxide, silicon-doped hafnium oxide, or the like. In other embodiments, the FE material 90 may be a multi-layer structure comprising a layer of $SiN_x$ between two $SiO_x$ layers (e.g., an ONO structure). In still other embodiments, the FE material 90 may comprise a different ferroelectric material or a different type of memory material. The FE material 90 may be deposited by CVD, PVD, ALD, PECVD, or the like to extend along sidewalls and a bottom surface of the trenches 86.

Figure 20:
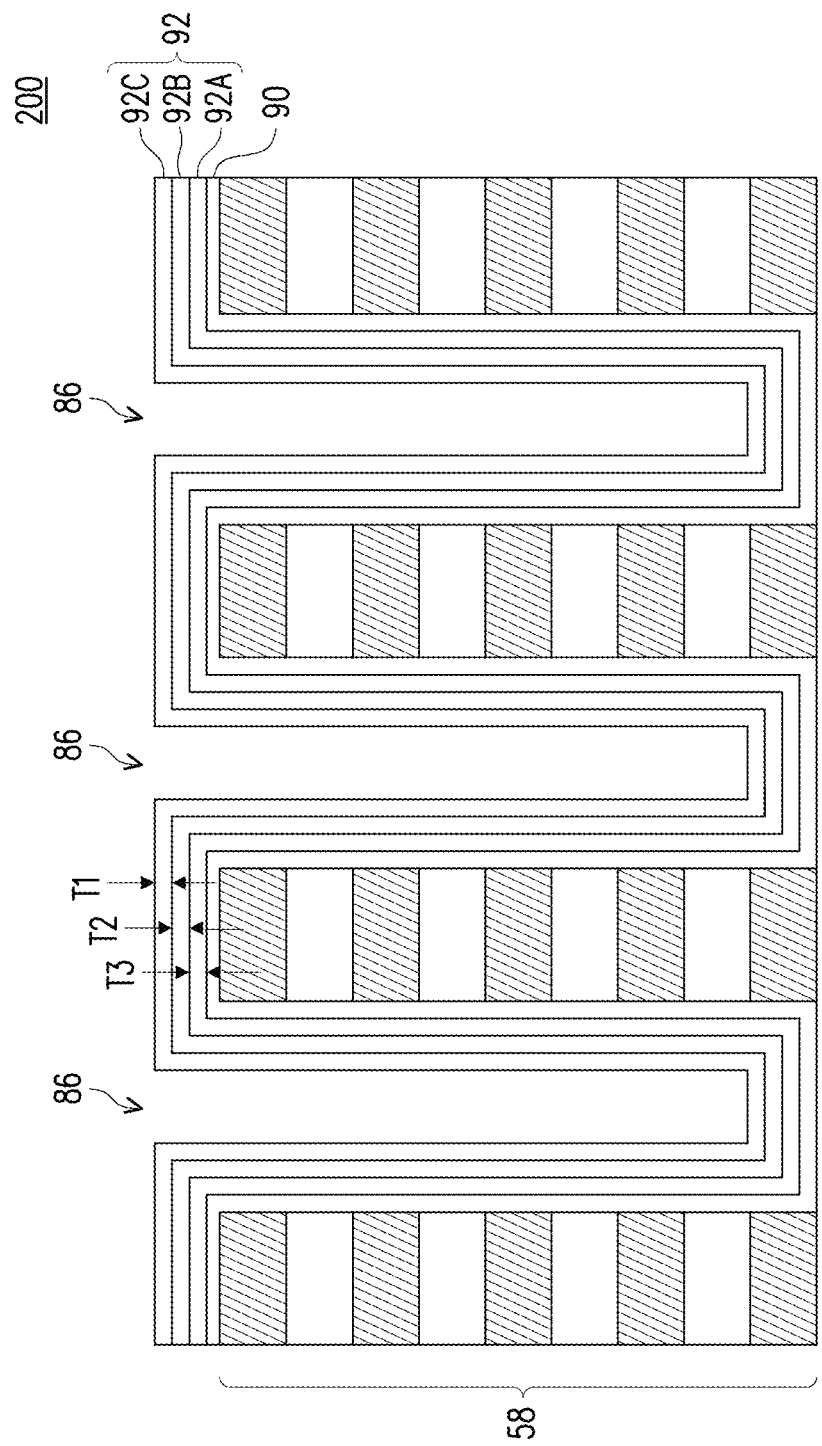

In FIG. 20, the OS layer 92 is conformally deposited in the trenches 86 over the FE material 90. The OS layer 92 comprises a material suitable for providing a channel region for a TFT (e.g., TFTs 204, see FIG. 1A). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1.

The OS layer 92 may have a varying concentration of the semiconductor element (e.g., indium), and the concentration of the semiconductor element may increase in a direction toward the FE material 90. For example, as illustrated by the embodiments of FIG. 20, the OS layer 92 may have a tri-layer structure comprising a bottom OS layer 92A, a middle OS layer 92B over and forming an interface with the bottom OS layer 92A, and a top OS layer 92C over and forming an interface with the middle OS layer 92B. An indium concentration of the bottom OS layer 92A may be higher than an indium concentration of the middle OS layer 92B, and the indium concentration of the middle OS layer 92B may be higher than an indium concentration of the top OS layer 92C. Each of the OS layers 92A, 92B, and 92C may comprise an indium-comprising material, such as $In_xGa_yZn_zMO$, where M may be Ti, Al, Ag, Si, Sn, or the like. The OS layers 92A, 92B, and 92C may each be separately deposited over the FE material 90 using a conformal deposition process such as CVD, ALD, PECVD, or the like such that the resulting OS layer 92 extends along sidewalls and a bottom surface of the trenches 86. The indium concentration in each of the OS layers 92A, 92B, and 92C may be adjusted by controlling the supply and flow of indium precursors (e.g., $InO_x$, (3-dimethylamimopropryl)-dimethyl indium (DADI), or the like) into the deposition chamber during the deposition process, for example. After the OS layer 92 is deposited, an anneal step with 300° C. to 450° C. in oxygen-related ambient may be performed to activate the charge carriers of the OS layer 92.

In some embodiments, the indium concentration of the bottom OS layer 92A may be in a range of about 40% to about 100% of a maximum indium concentration of the OS layer 92; the indium concentration of the middle OS layer 92B may be in a range of about 20% to about 40% of the maximum indium concentration of the OS layer 92; and the indium concentration of the top OS layer 92C may be less than 20% of the maximum indium concentration of the OS layer 92. In some embodiments, the maximum indium concentration of the OS layer 92 may be in a range of about 10% to about 45%, and a charge carrier concentration in the OS layer 92 may be in range of about $10^{14}$ cm$^{-3}$ to $10^{20}$ cm$^{-3}$. Further, a combined thickness (e.g., thickness T1 plus thickness T2) of the top OS layer 92C and the middle OS layer 92B may be greater than a thickness T3 of the bottom OS layer 92A.

By providing three discrete indium concentration regions in the OS layer 92 in the above ranges, advantages may be achieved. For example, a high concentration of indium in the bottom OS layer 92A provides a greater charge carrier concentration in the resulting channel regions, which advantageously increases carrier mobility. For example, mobility may be increased from about 20 cm$^2$/Vs to about 40 cm$^2$/Vs by providing a sufficiently high indium concentration in the bottom OS layer 92A. Further, the middle OS layer 92B may act as a barrier layer to prevent or at least reduce electron scattering from the bottom OS layer 92A. For example, the middle OS layer 92B may act as a transitional, interfacial layer between the different indium concentrations of the bottom OS layer 92A and the top OS layer 92C, which reduces undesired lattice mismatch and scattering. As a result, mobility in the resulting channels may be increased. The top OS layer 92A may act as a passivation layer that protects the underlying OS layers (e.g., bottom OS layer 92C) from process damage and passivates oxygen deficiencies in the underlying OS layers (e.g., the middle OS layer 92B and the bottom OS layer 92A). For example, surfaces of the bottom OS layer 92A may be more susceptible to process damage (e.g., water absorption, etching damage, metal diffusion, undesired interfacial layer formation with adjacent oxide layers, or the like) due to its relatively high indium concentration, and the top OS layer 92C is less susceptible to this damage due to its reduced indium concentration (e.g., in the above range). Accordingly, the top OS layer 92C may protect the underlying layers from subsequent processing.

Figure 21:
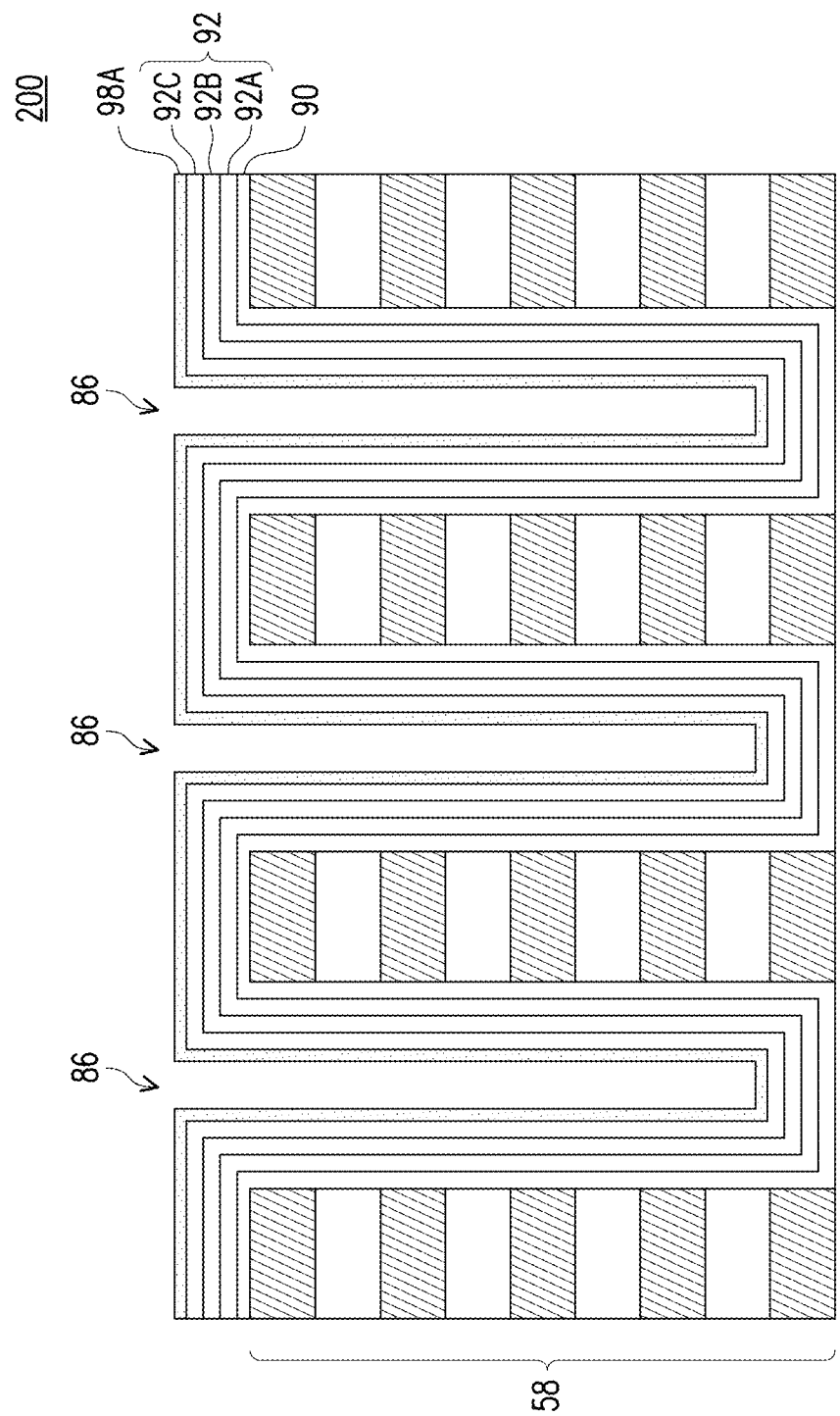

In FIG. 21, a dielectric layer 98A is deposited in the trenches 86 over the OS layer 92. The dielectric layer 98A may include, for example, silicon oxide, silicon nitride, silicon oxynitride, or the like, which may be deposited by CVD, PVD, ALD, PECVD, or the like. The dielectric layer 98A may extend along sidewalls and a bottom surface of the trenches 86 over the OS layer 92.

Figure 22:
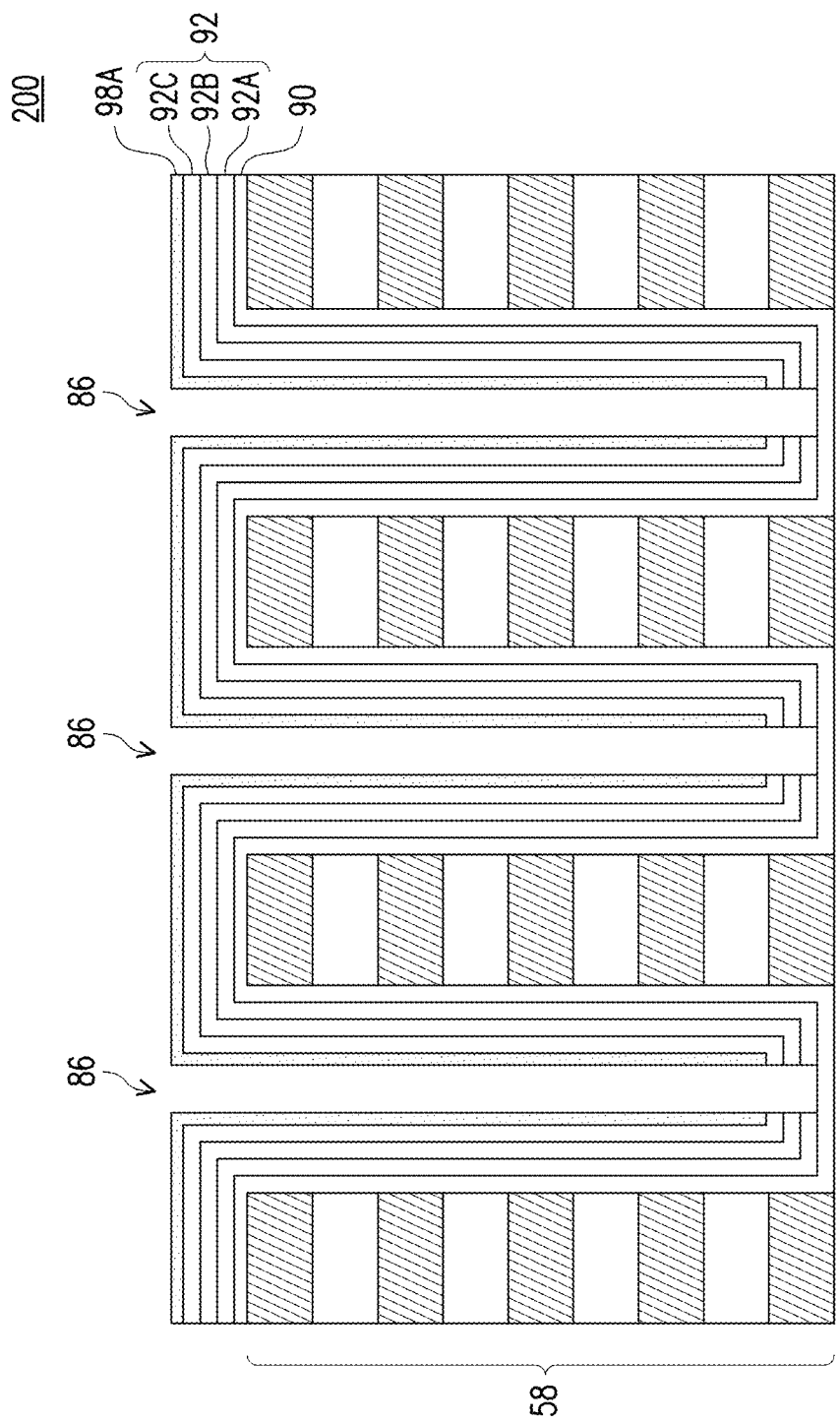

In FIG. 22, lateral portions of the dielectric layer 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 22, the dielectric layer 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. The etching may comprise using an etchant that etches a material of the OS layer 92 without signifi-cantly etching the underlying FE material 90. Accordingly, the FE material 90 may act as an etch stop layer while patterning the OS layer 92. Etching the OS layer 92 may expose portions of the FE material 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

Figure 23:
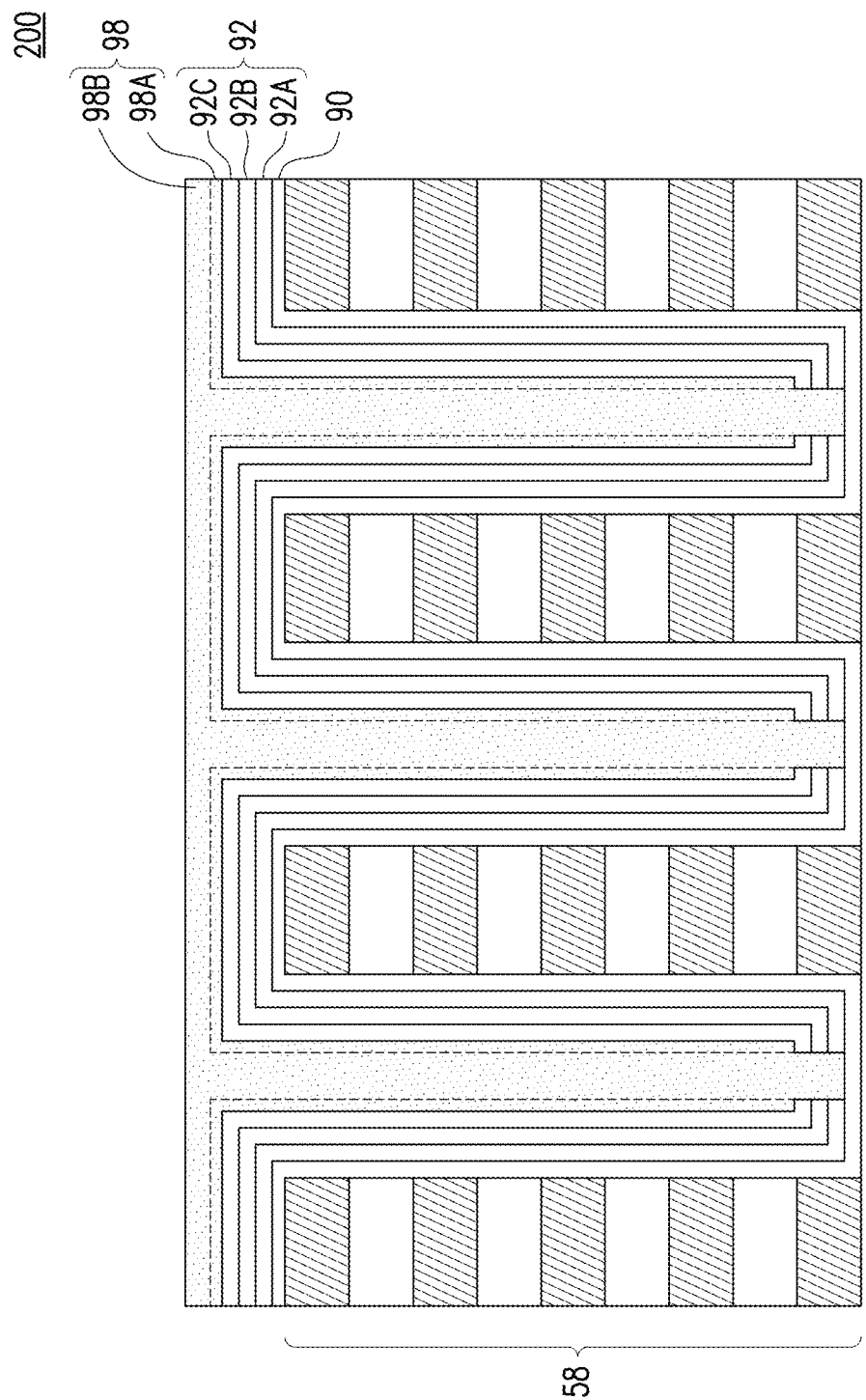

In FIG. 23, an additional dielectric material 98B may be deposited to fill remaining portions of the trenches 86. The dielectric material 98B may have a same material composition and be formed using a like process as the dielectric layer 98A. The dielectric material 98B and the dielectric layer 98A may be referred to collectively as the dielectric material 98 herein after.

Figure 24:
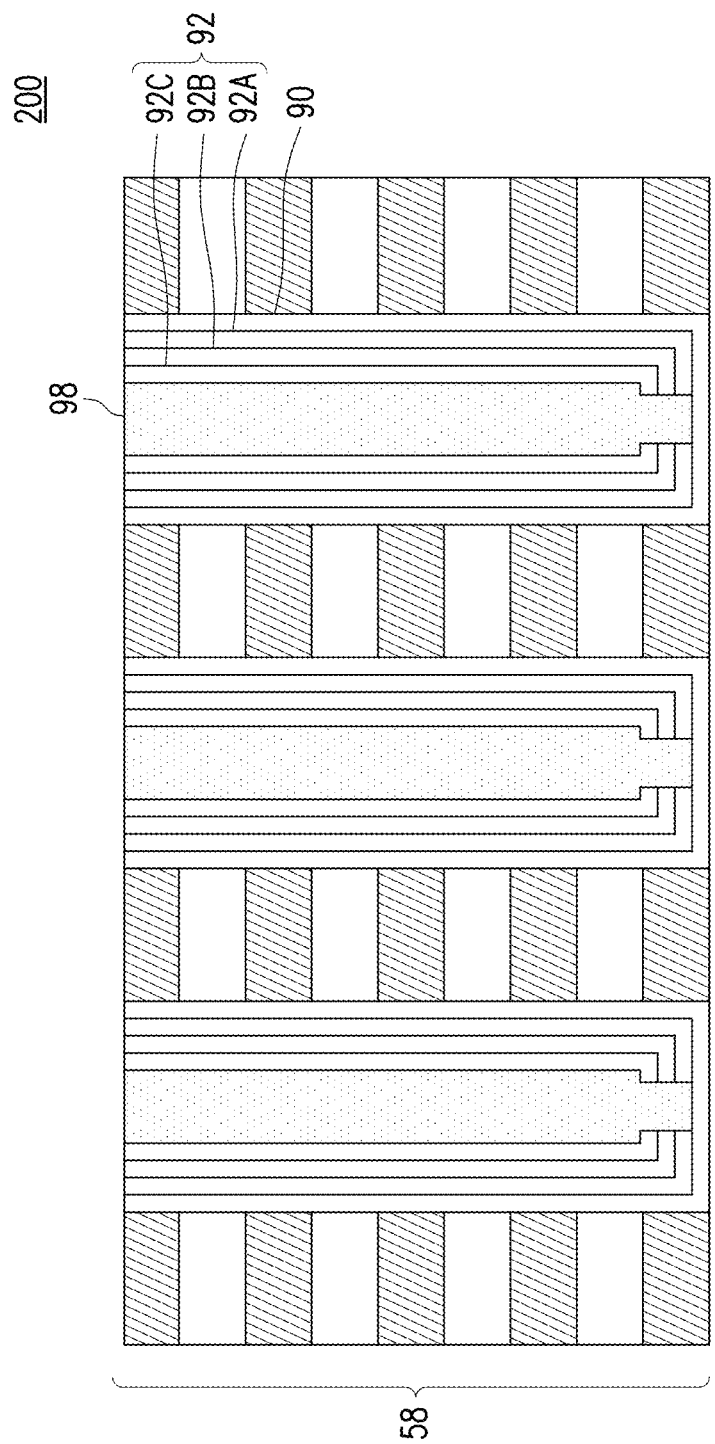
Figure 25:
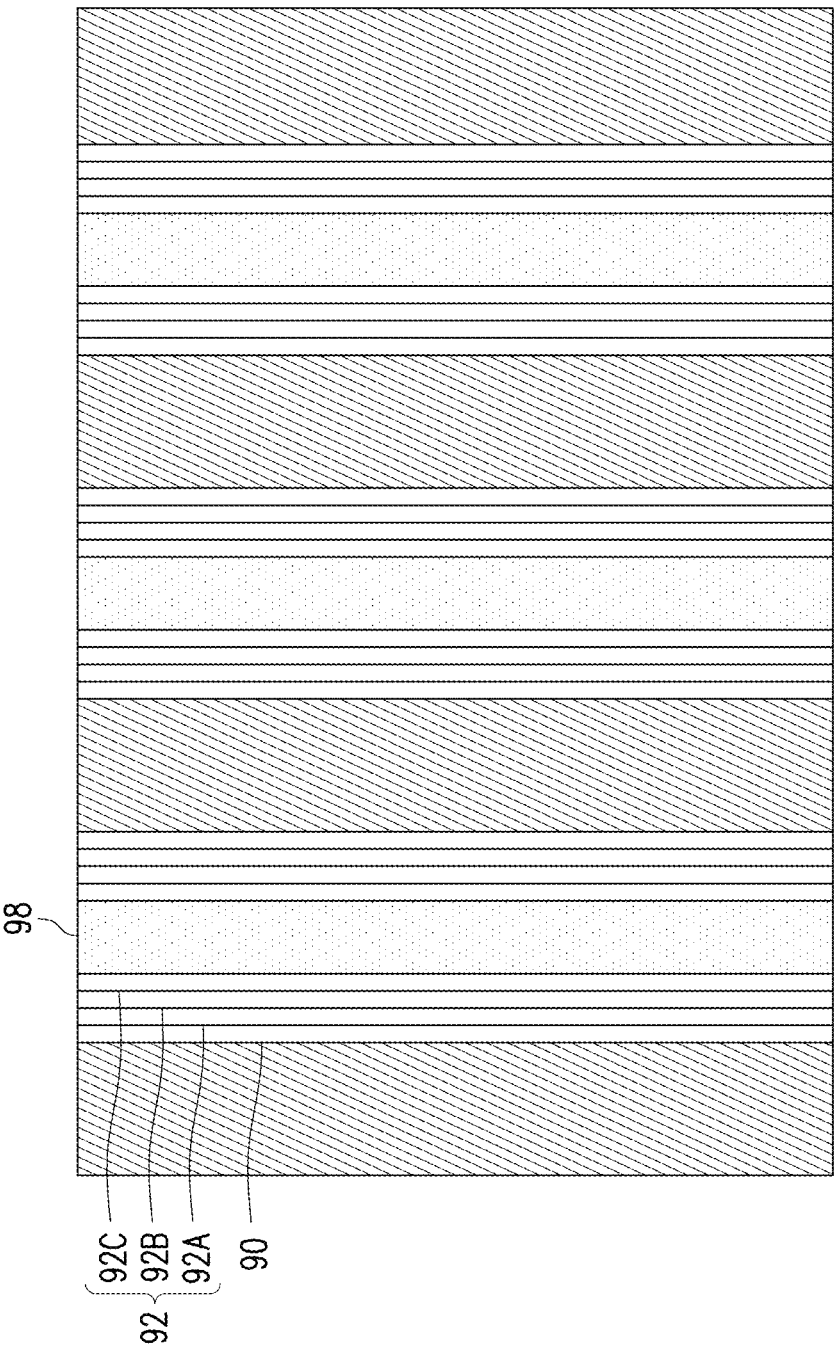

In FIG. 24, a removal process is then applied to the dielectric material 98, the OS layer 92, and the FE material 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete. FIG. 25 illustrates a corresponding top-down view of the structure illustrated in FIG. 24.

FIGS. 26A through 29B illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. In FIGS. 26A through 27B, Figures ending in "A" illustrate a top down view, and Figures ending in "B" illustrate a corresponding cross-sectional view along line D-D' of FIG. 1A. In FIGS. 28A through 29B, Figures ending in "A" illustrate a top down view, and Figures ending in "B" illustrate a corresponding cross-sectional view along line C-C' of FIG. 1A.

Figure 26A:
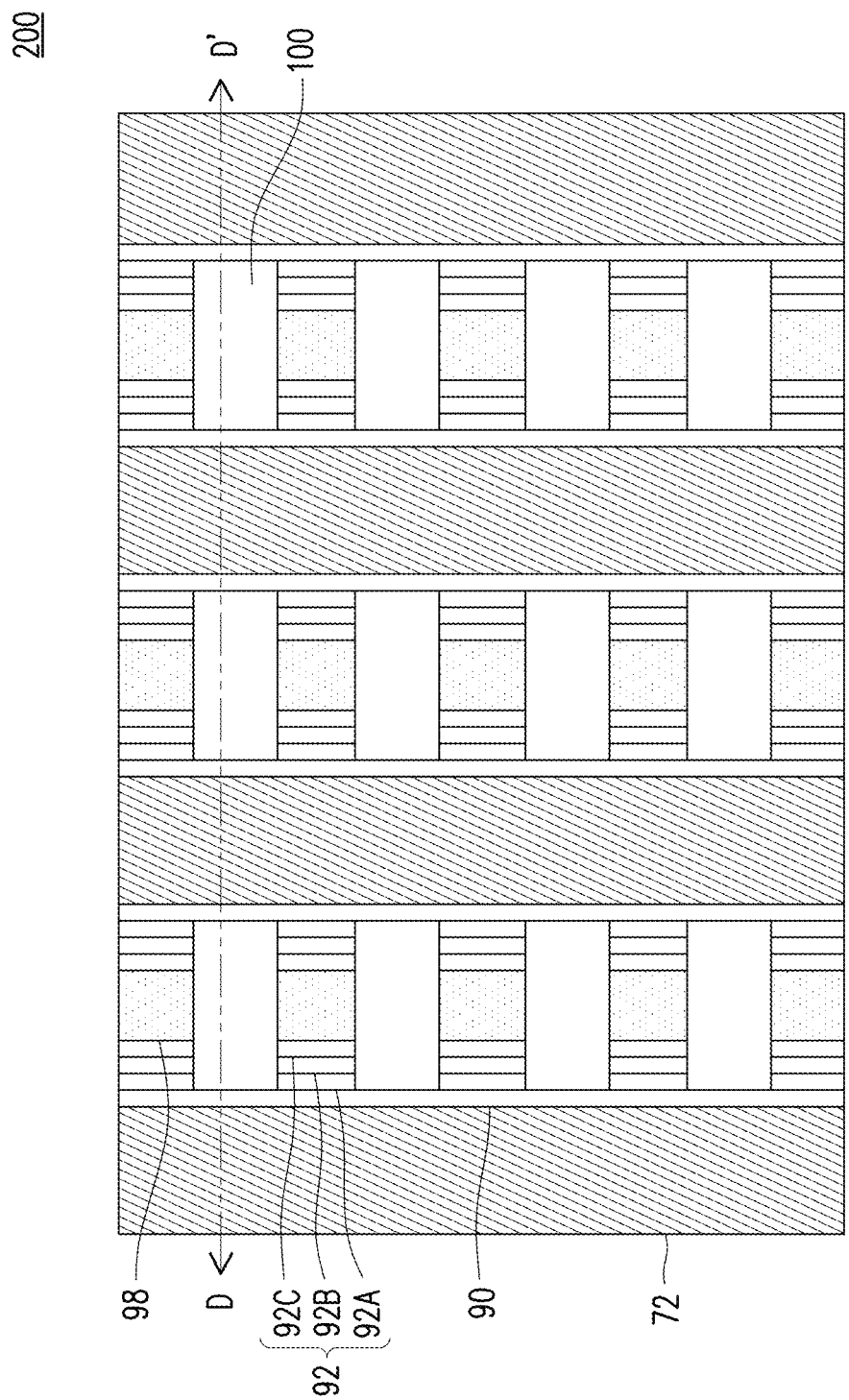
Figure 26B:
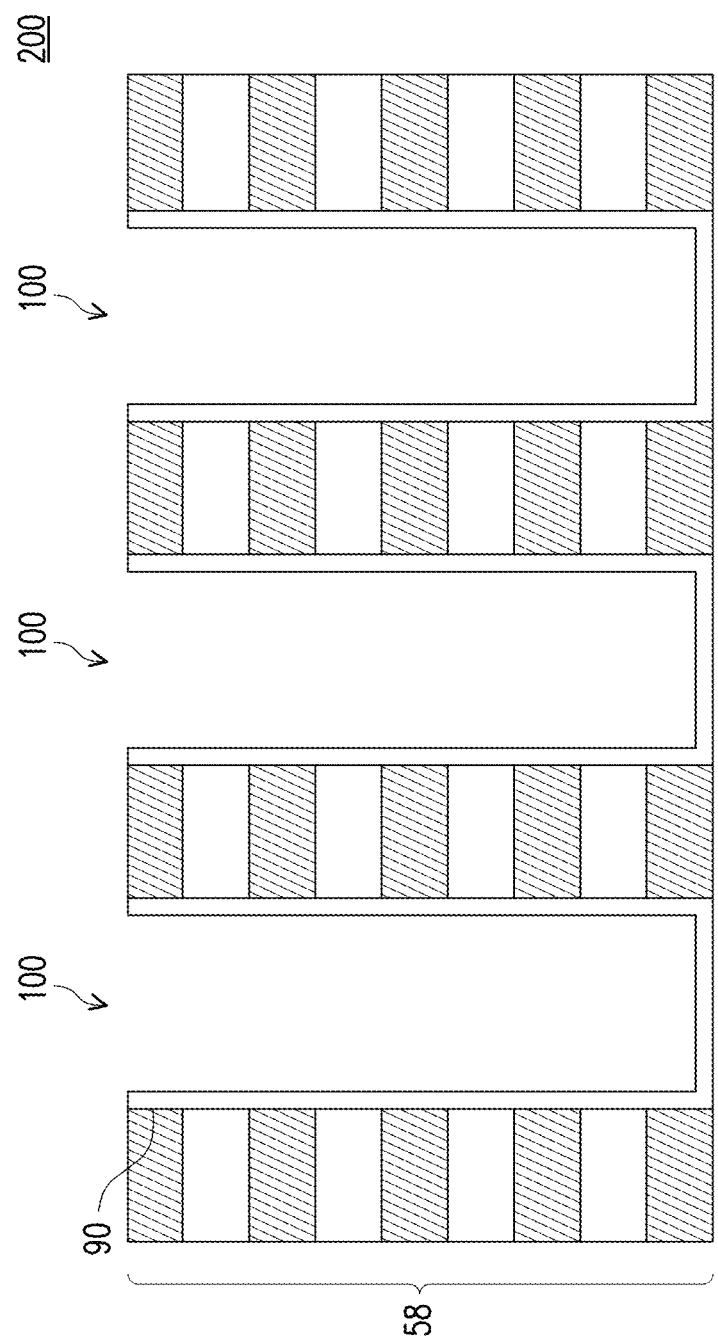

In FIGS. 26A and 26B, trenches 100 are patterned through the OS layer 92 and the dielectric material 98. FIG. 26B illustrates a top-down view of line D-D' in FIG. 26A. Patterning the trenches 100 may be performed through a combination of photolithography and etching, for example. The trenches 100 may be disposed between opposing sidewalls of the FE material 90, and the trenches 100 may physically separate adjacent stacks of memory cells in the memory array 200 (see FIG. 200).

Figure 27A:
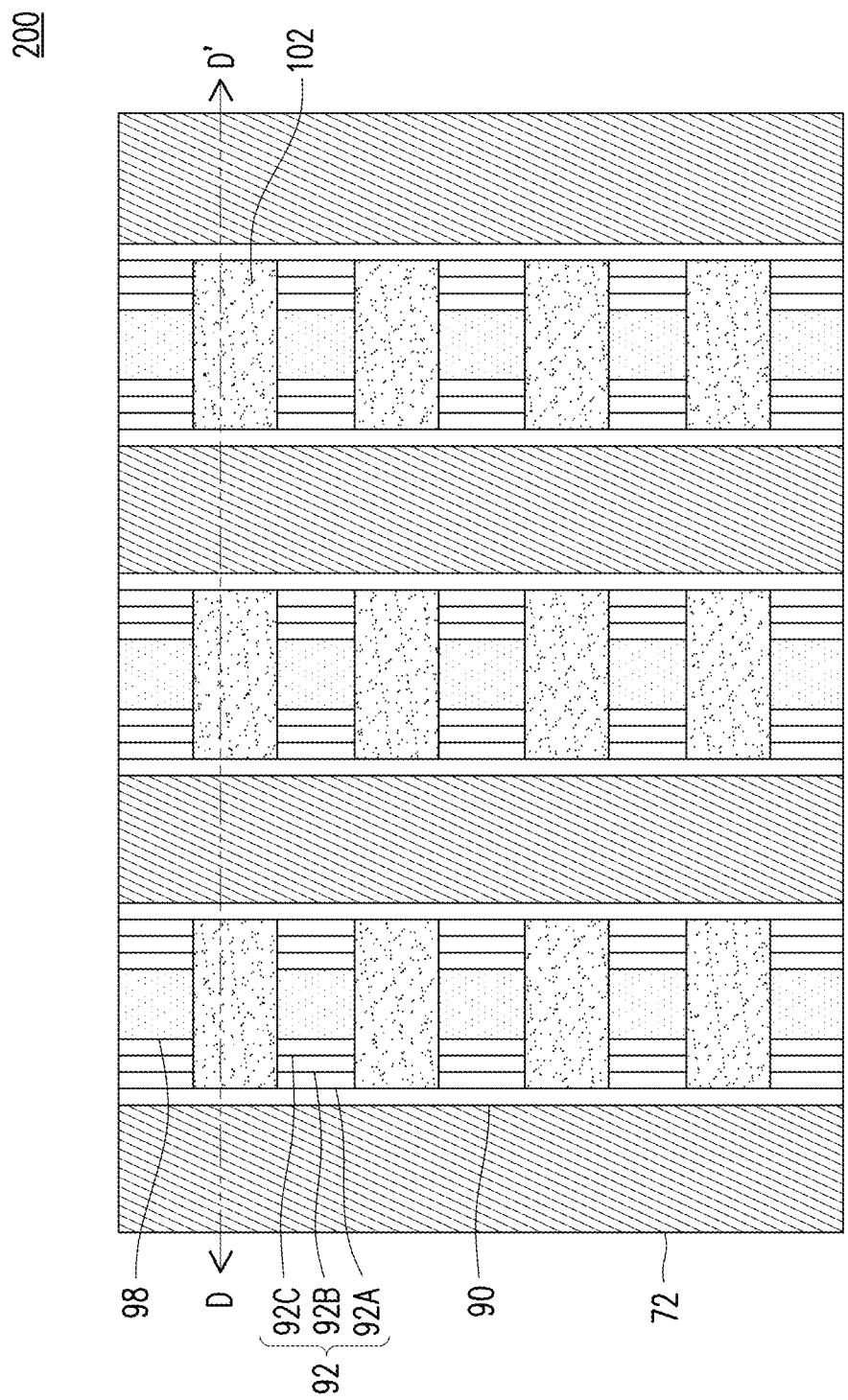
Figure 27B:
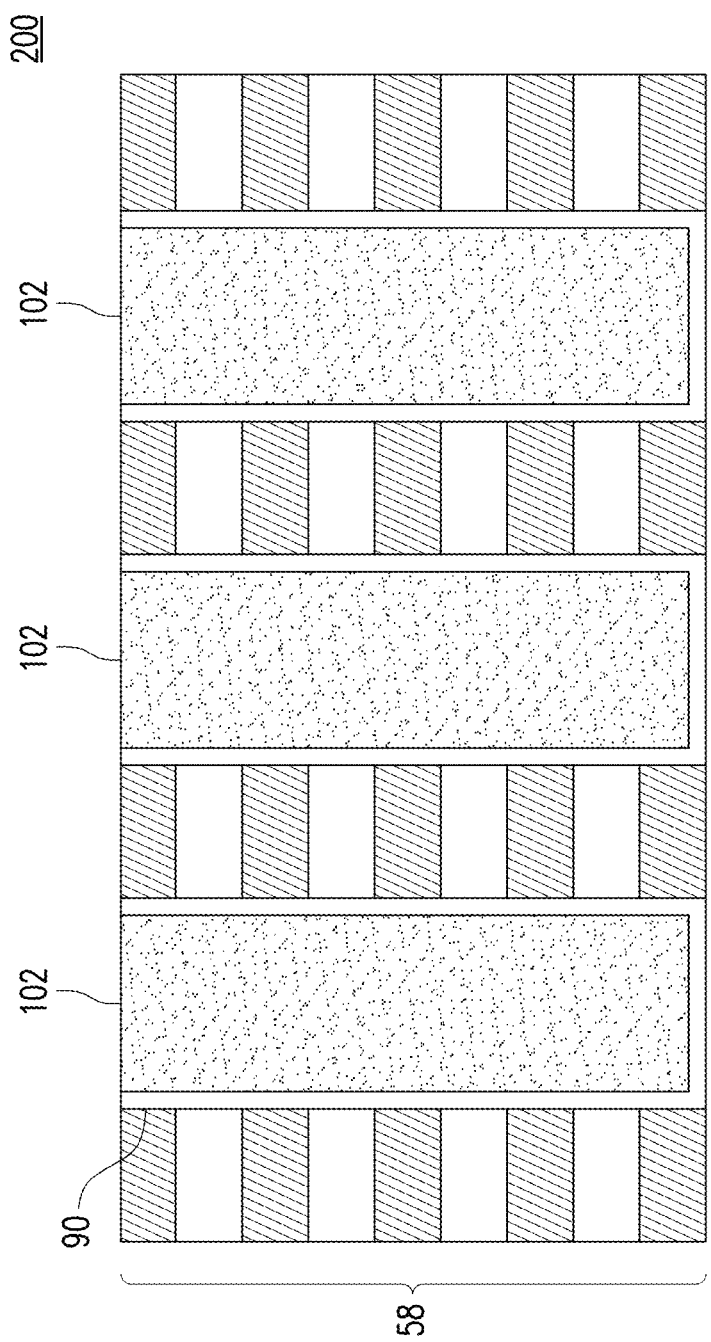

In FIGS. 27A and 27B, a dielectric material 102 is deposited in and fills the trenches 100. FIG. 27B illustrates a top-down view of line D-D' in FIG. 27A. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92. After deposition, a planarization process (e.g., a CMP, etch back, or the like) may be performed to remove excess portions of the dielectric material 102. In the resulting structure, top surfaces of the multi-layer stack 58, the FE material 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride, the dielectric material 98 is a nitride and the dielectric material 102 is an oxide. Other materials are also possible.

Figure 28A:
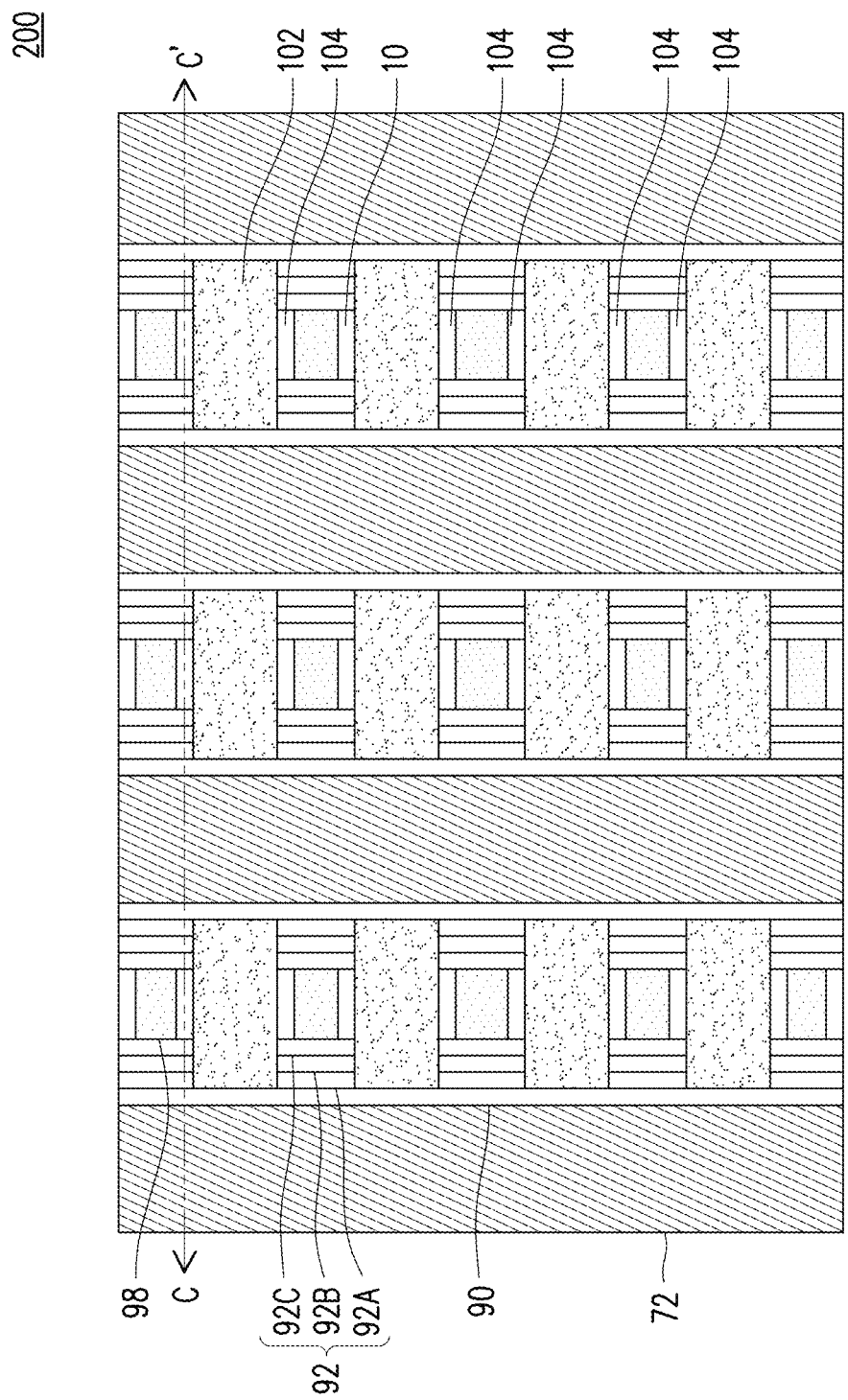
Figure 28B:
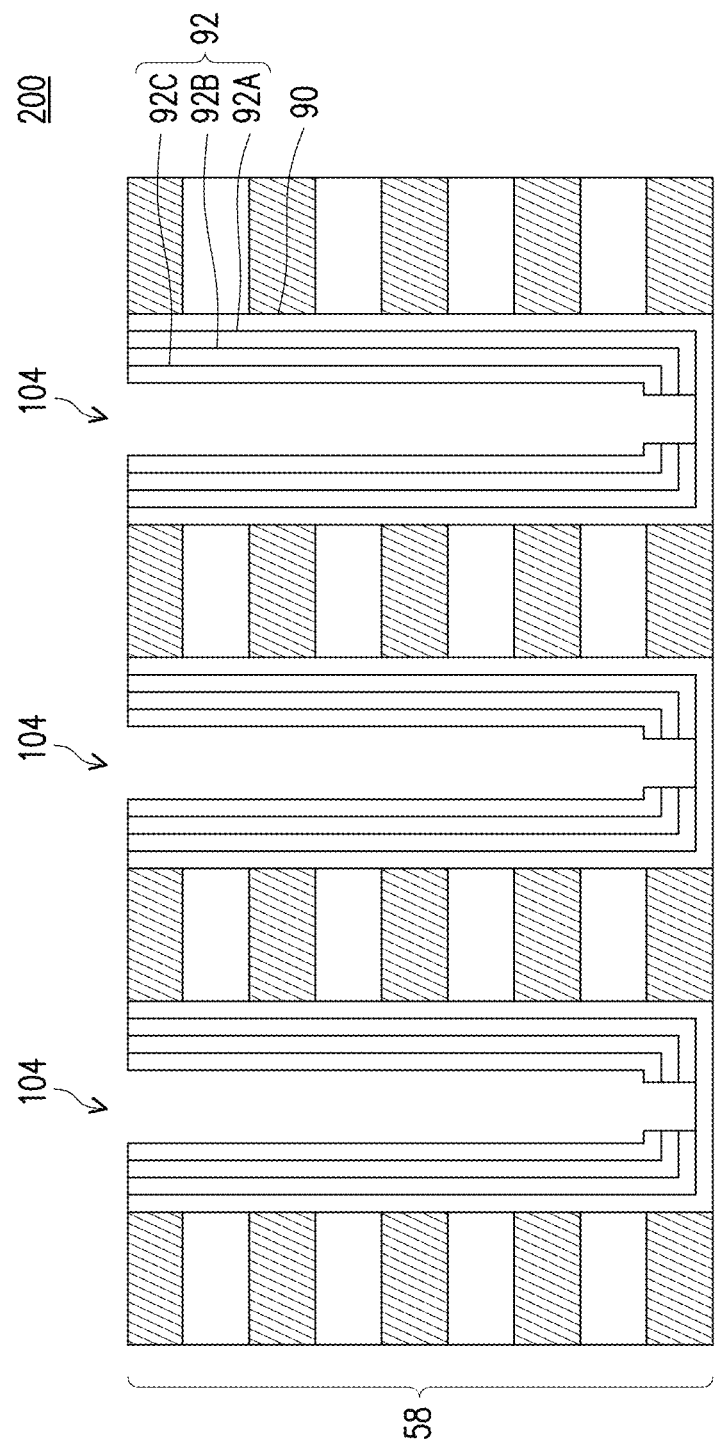

In FIGS. 28A and 28B, trenches 104 are patterned for the conductive lines 106 and 108. FIG. 28B illustrates a top-down view of line C-C' in FIG. 28A. The trenches 104 are patterned by patterning the dielectric material 98 using a combination of photolithography and etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. A pattern of the trenches 104 may correspond to the conductive lines 106 and 108 (see FIGS. 29A and 29B). For example, a portion of the dielectric material 98 may remain between each pair of the trenches 104, and the dielectric material 102 may be disposed between adjacent pairs of the trenches 104.

Figure 29A:
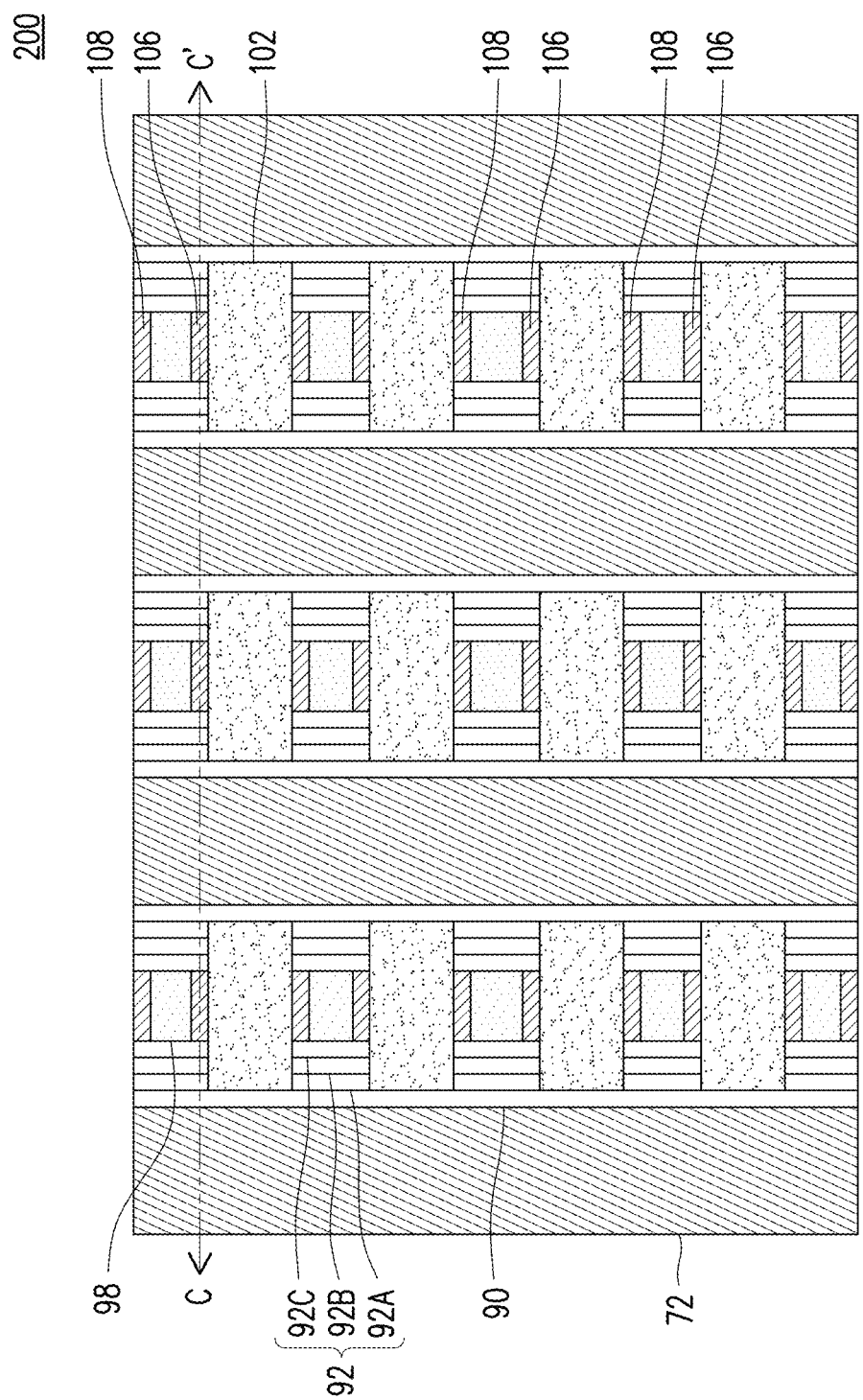
Figure 29B:
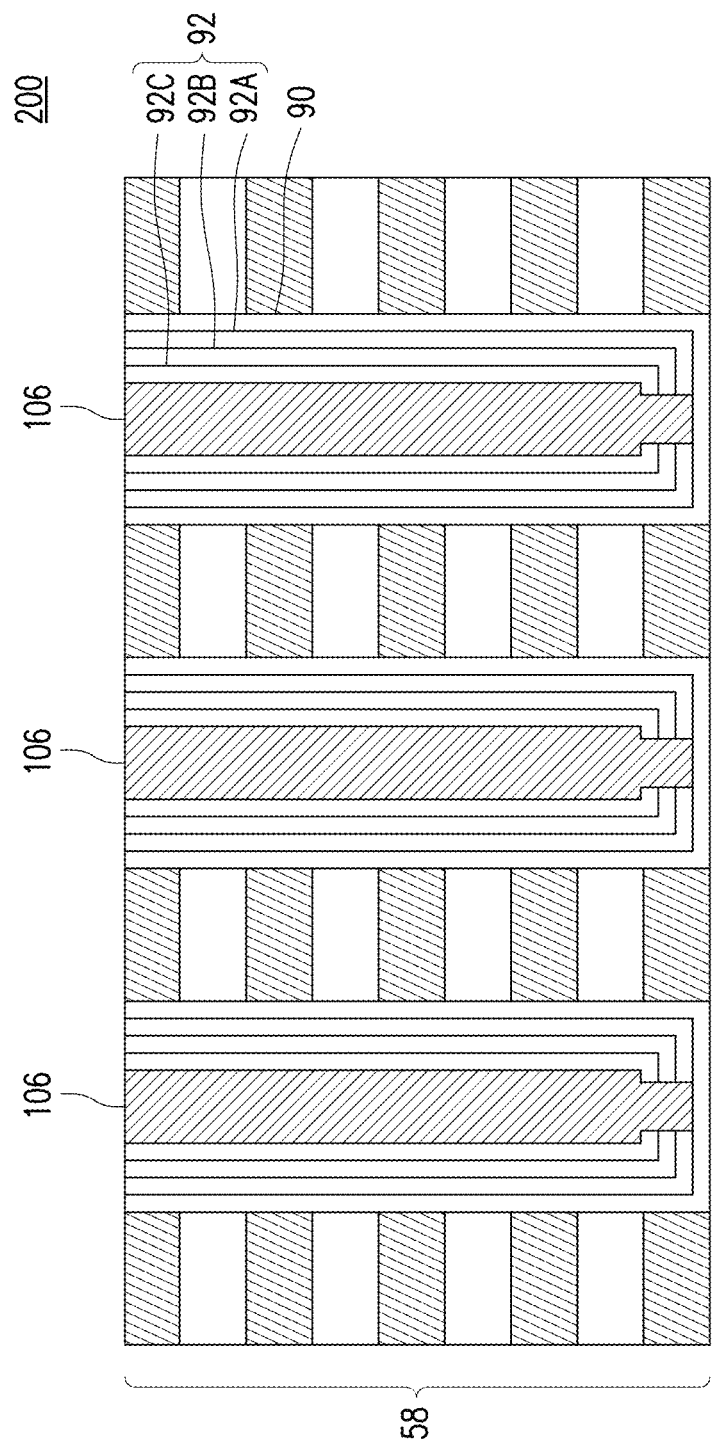

In FIGS. 29A and 29B, the trenches 104 are filled with a conductive material to form the conductive lines 106 and 108. FIG. 29C illustrates a top-down view of line C-C' in FIG. 29A. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and the conductive material is deposited, a planarization (e.g., a CMP, etch back, or the like) may be performed to remove excess portions of the conductive material, thereby forming the conductive lines 106 and 108. In the resulting structure, top surfaces of the multi-layer stack 58, the FE material 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Further the conductive lines 106 and 108 may provide source/drain electrodes for TFTs in the memory array 200. Although FIG. 29B illustrates a cross-sectional view that only shows the conductive lines 106, a cross-sectional view of the conductive lines 108 may be similar.

As illustrated by FIGS. 29A and 29B, the dielectric material 98 may be disposed between and separate adjacent ones of the conductive lines 106 and 108. Further, pairs of the conductive lines 106 and 108 are separated by the dielectric material 102. The longitudinal axes of conductive lines 106 and 108 each extend vertically in a direction that perpendicular to a major surface of the substrate 50. In this manner, a vertical column of stacked memory cells 202 in the memory array 200 may share a common conductive line 106 and a common conductive line 108.

Figure 30A:
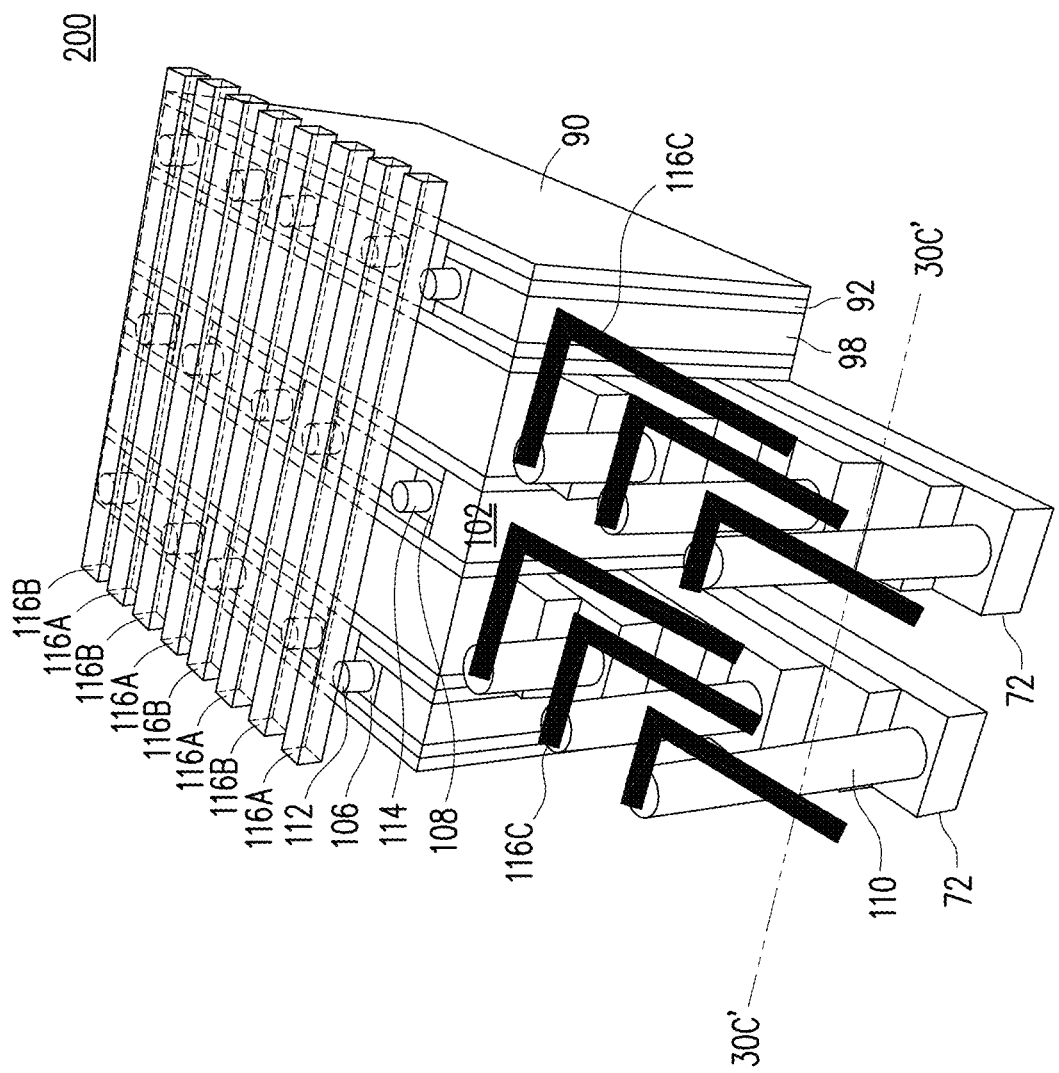
Figure 30B:
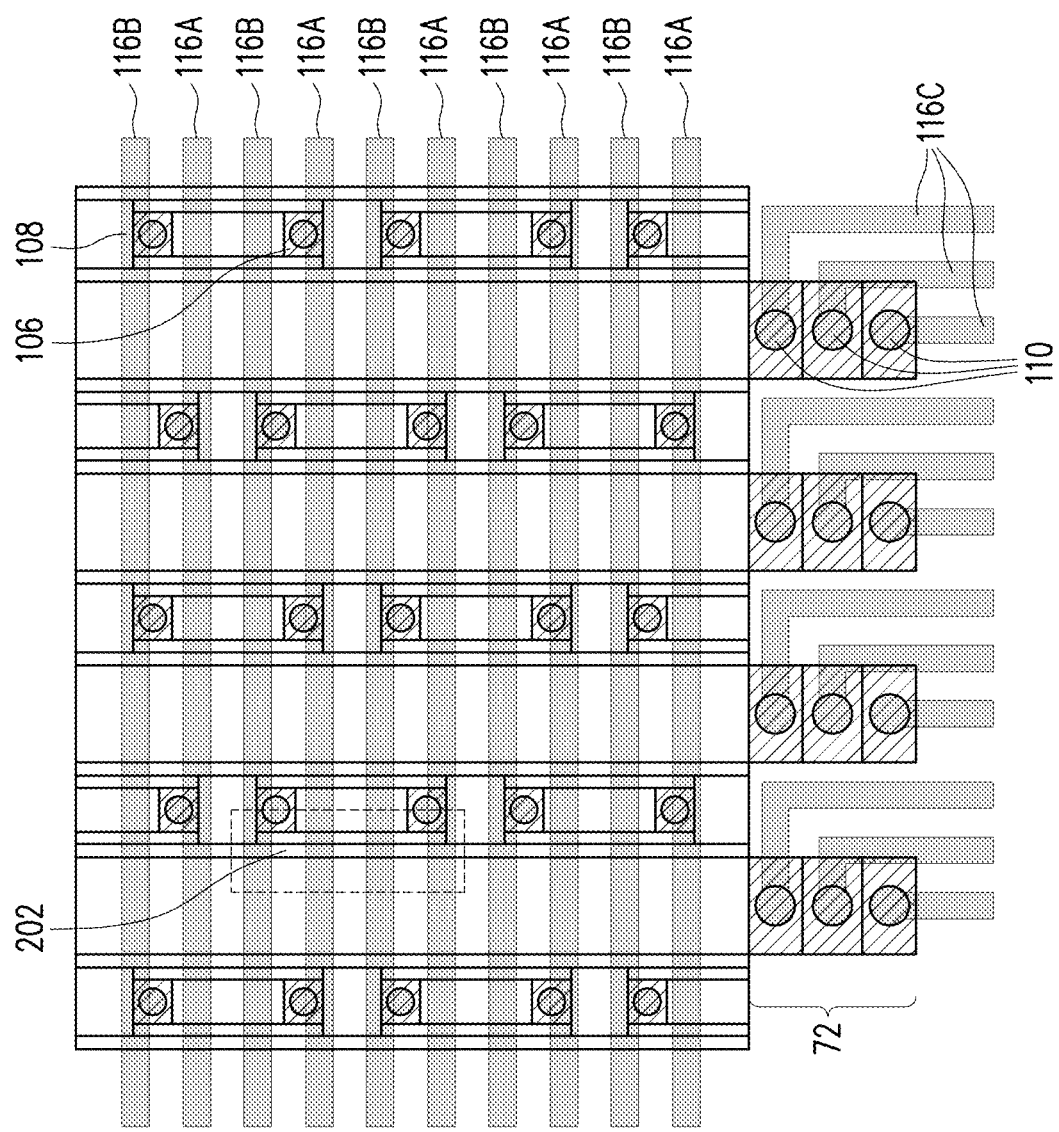
Figure 30C:
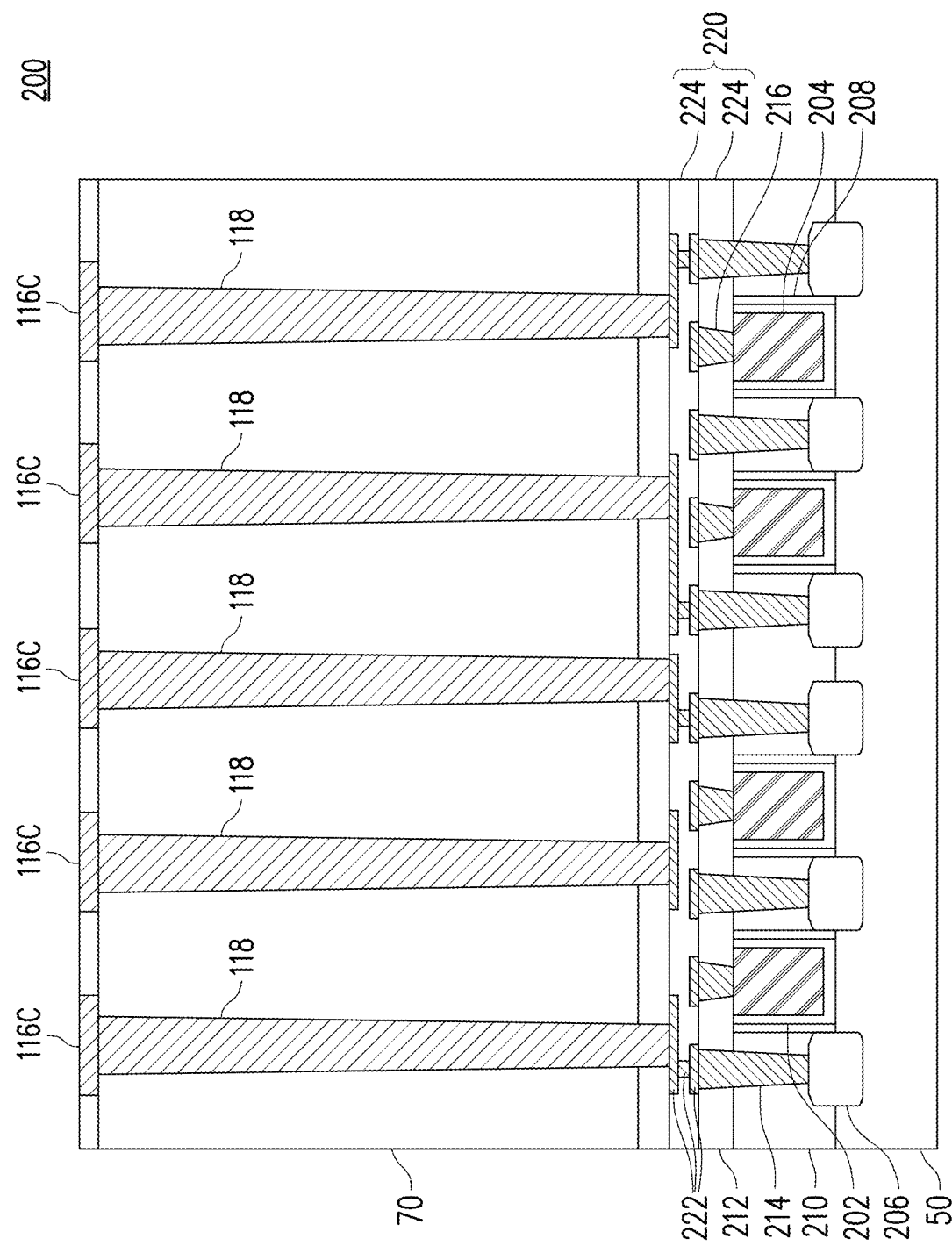

Subsequently, as illustrated in FIGS. 30A, 30B, and 30C, contacts may be made to each of the conductive lines 72, the conductive lines 106, and the conductive lines 108. FIG. 30A illustrates a perspective view of the memory array 200; FIG. 30B illustrates a top-down view of the memory array 200; and FIG. 30C illustrates a cross-sectional view of the device and underlying substrate alone the line 30C'-30C' of FIG. 30A. In some embodiments, conductive contacts 110 may be made to exposed surfaces of each of the conductive lines 72. The staircase shape of the conductive lines 72 may provide a surface on each of the conductive lines 72 for the conductive contacts 110 to land on. Conductive contacts 112 and 114 may be made to top surfaces of the conductive lines 106 and 108, respectively. The conductive contacts 110, 112, and 114 may be electrically connected to conductive lines 116A, 116B, and 116C, respective, which connect the memory array to an underlying active devices and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50. In alternate embodiments, routing and/or power lines to and from the memory array may be provided by an interconnect structure formed over the memory array 200 in addition to or in lieu of the interconnect structure 220. Accordingly, the memory array 200 having a tri-layer semiconductor channel region may be completed. The tri-layer semiconductor channel region may be disposed in the interconnect structure above the active devices at the top surface of the substrate 50.

Figure 31A:
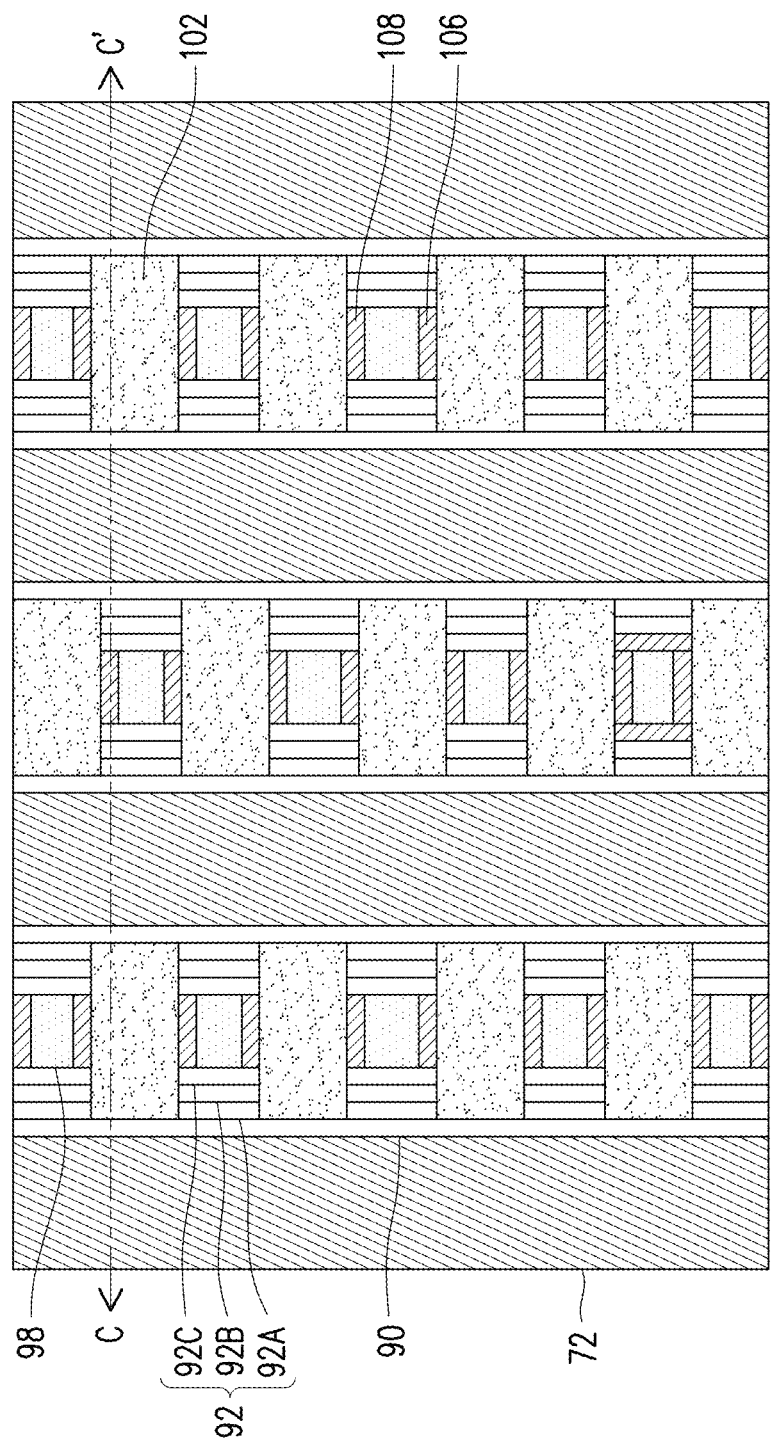
FIGS. 31A and 31B illustrate varying views of a memory array in accordance with some embodiments.
Figure 31B:
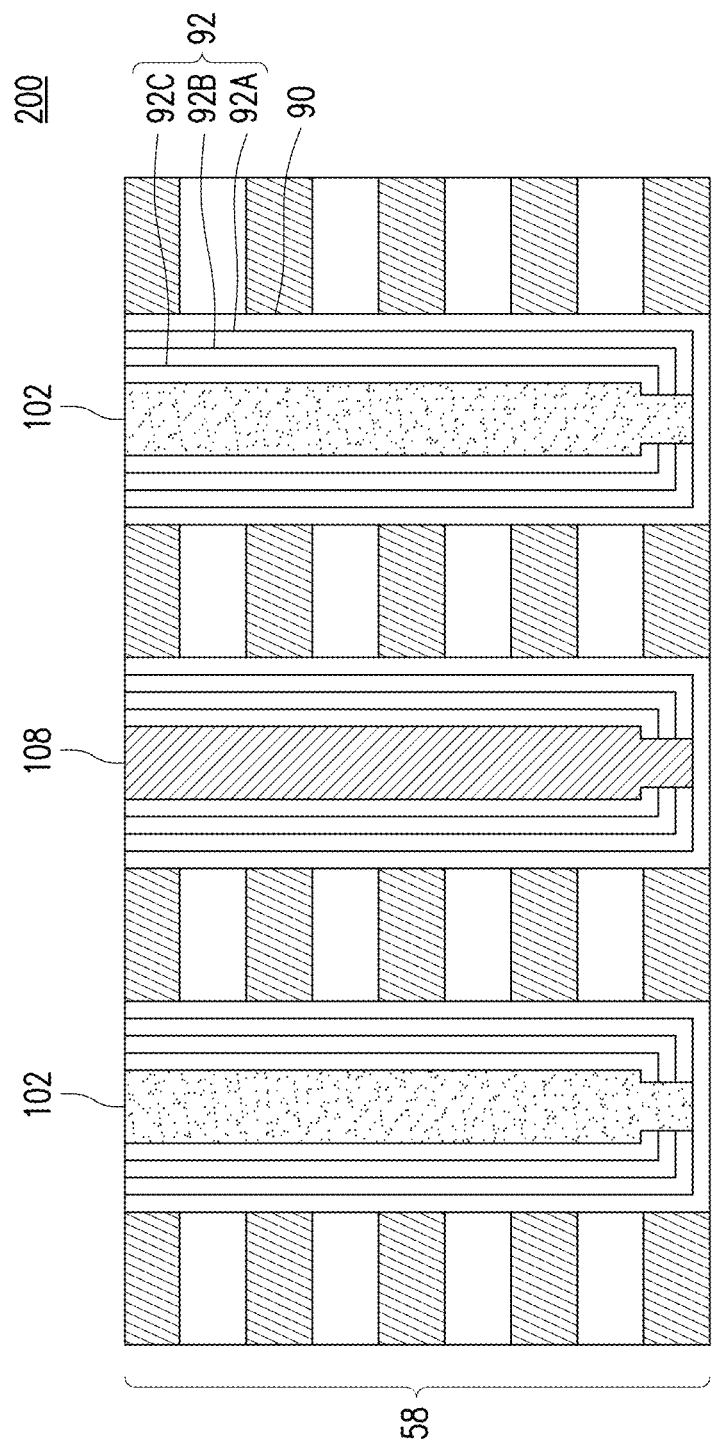

Although the embodiments of FIGS. 2 through 30C illustrate a particular pattern for the conductive lines 106 and 108, other configurations are also possible. For example, in these embodiments, the conductive lines 106 and 108 in a same row of the array are all aligned with each other. In some embodiments, the conductive lines 106 and 108 within a row have a staggered pattern as illustrated by FIGS. 31A and 31B. FIG. 31A illustrates a top-down view, and FIG. 31B illustrates a cross-sectional view alone line C-C' of FIG. 31A. In FIGS. 31A and 31B, like reference numerals indicate like elements formed by like processes as the elements of FIGS. 2 through 30.

Figure 32A:
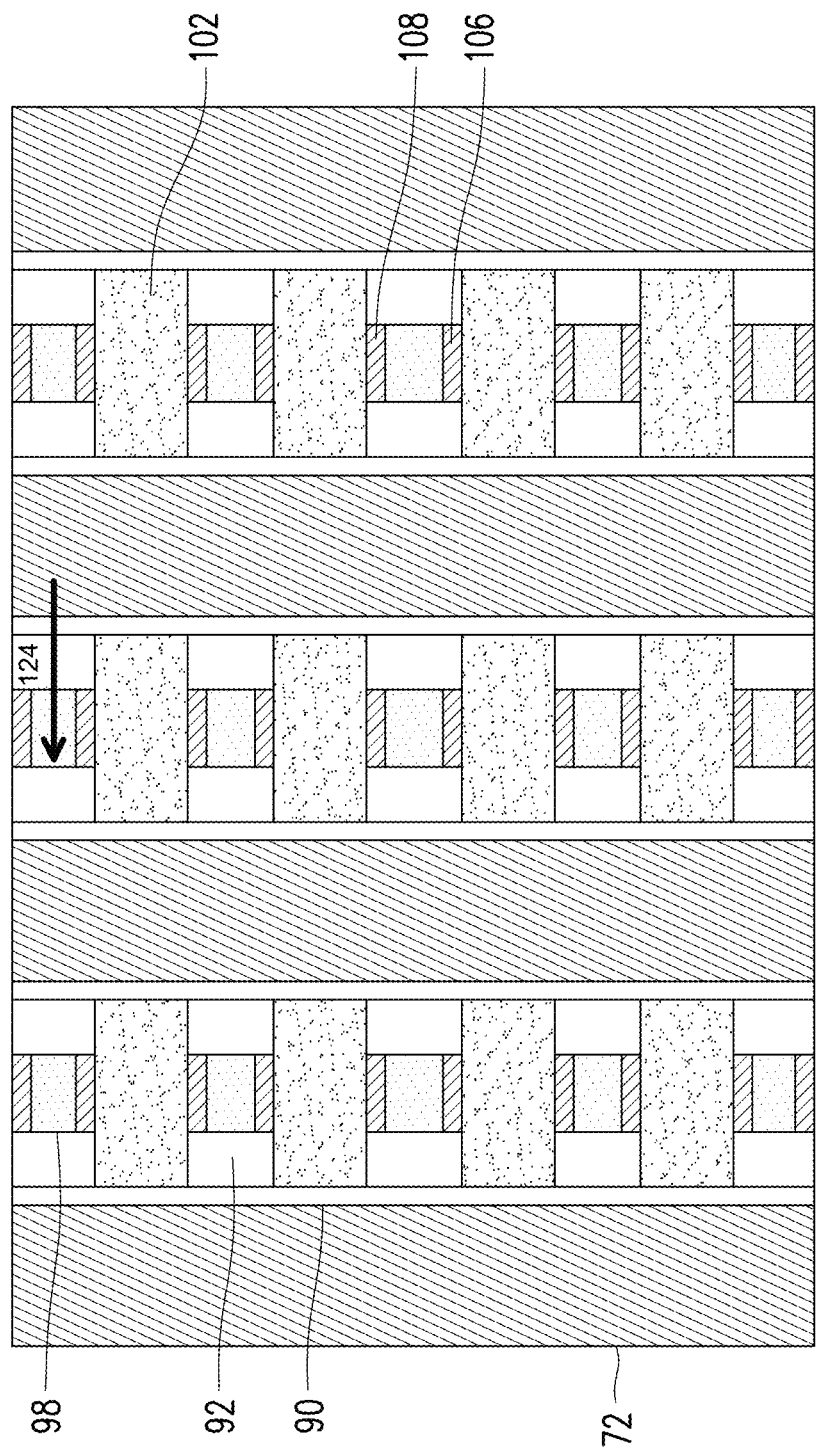
FIGS. 32A and 32B illustrate varying views of a memory array in accordance with some embodiments.
Figure 32B:
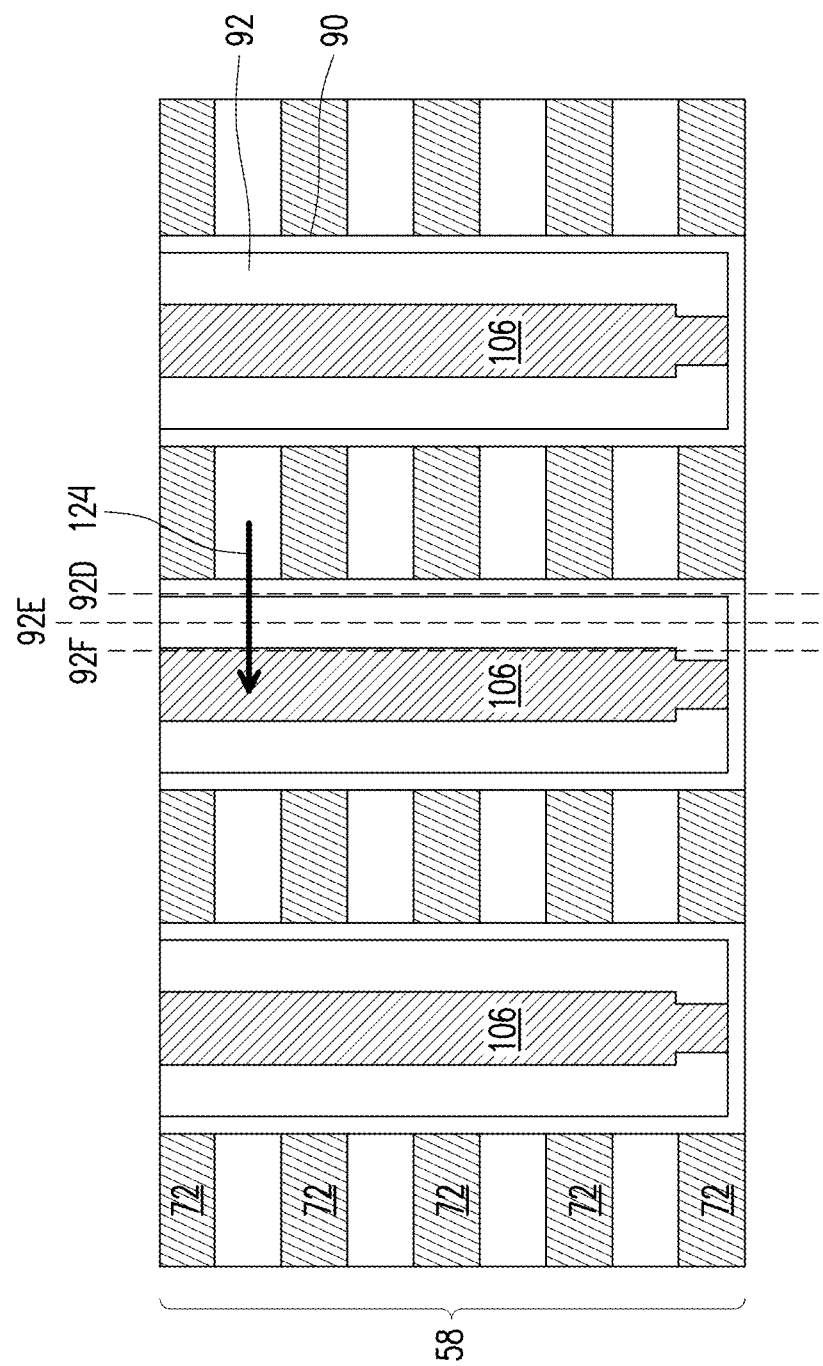

Further although the embodiments of FIGS. 2 through 30 illustrate the OS layer 92 has having three separately formed layers (e.g., the bottom OS layer 92A, the middle OS layer 92B, and the top OS layer 92C), in other embodiments the OS layer 92 may be a single layer with a gradient semiconductor element (e.g., indium) concentration as illustrated by FIGS. 32A and 32B.

Figure 33:
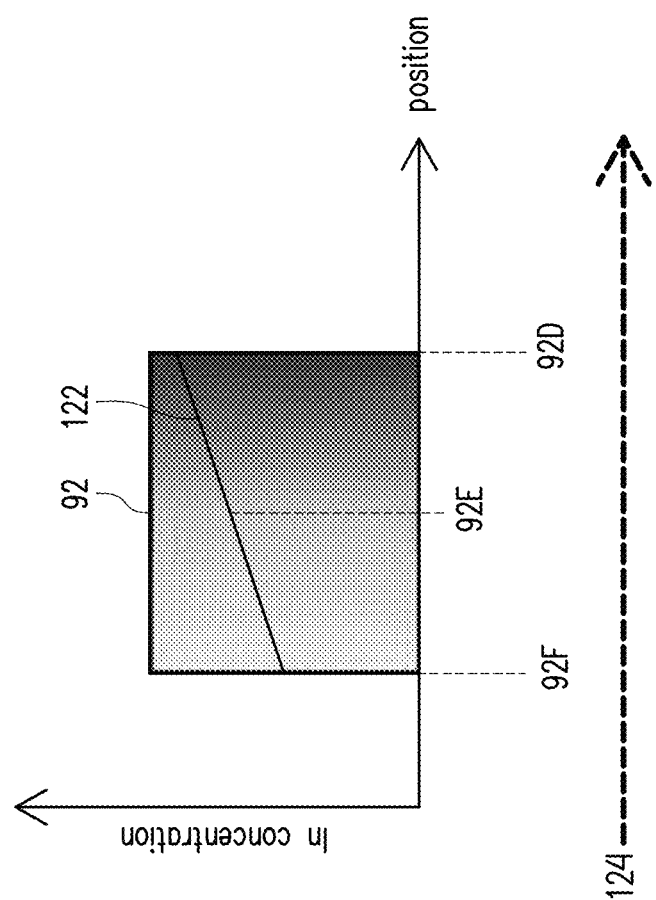
FIG. 33 illustrates a graph of semiconductor concentration in a channel region according to some embodiments.

In FIGS. 32A and 32B, like reference numerals indicate like elements formed by like processes as the elements of FIGS. 2 through 30. However, the OS layer 92 is a single layer (e.g., free of any internal interfaces) with a gradient indium concentration. For example, the indium concentration of the OS layer 92 may constantly decrease in a direction of arrow 124 (e.g., away from the conductive lines 72 towards the conductive lines 106 and 108). The change in indium concentration is further illustrated by line 122 of the graph in FIG. 33, which illustrates indium concentration in the OS layer 92 along the arrow 124.

In some embodiments, the indium concentration of region 92D (e.g., the region adjacent the FE material 90) may be in a range of about 40% to about 100% of a maximum indium concentration of the OS layer 92; the indium concentration of the OS layer 92E (e.g., in the middle of the OS layer 92) may be in a range of about 20% to about 40% of the maximum indium concentration of the OS layer 92; and the indium concentration of region 92F (e.g., the region adjacent the conductive lines 106 and 108) may be less than 20% of the maximum indium concentration of the OS layer 92. In some embodiments, the maximum indium concentration of the OS layer 92 may be in a range of about 10% to about 45%, and a charge carrier concentration in the OS layer 92 may be in range of about $10^{14}$ cm$^{-3}$ to $10^{20}$ cm$^{-3}$. By providing three discrete indium concentration regions in the OS layer 92 in the above ranges, the advantages described above may be achieved such as increased mobility in the channel region of the TFTs, reduced electron scattering, and reduced manufacturing defects.

Various embodiments provide a 3D memory array with a plurality of vertically stacked memory cells. Each TFT further includes FE gate dielectric layer and an OS material in a channel region. The OS material may have at least three different regions each with a different semiconductor element (e.g., indium) concentration. By providing at least three different concentrations of the semiconductor element, advantages may be achieved. For example, by having a relatively high concentration of the semiconductor element closest to the gate electrode, carrier mobility in the channel region may be increased. By having a relatively low concentration of the semiconductor element at an exposed surface of the channel region, process damage during subsequent processing of the channel region can be reduced. Further, by including a medium concentration of the semiconductor element between the relatively low concentration region and the relatively high concentration region of the channel region, electron scattering between the low and high concentration regions can be reduced. Accordingly, device performance can be increased by reducing manufacturing defects.

In some embodiments, a memory cell includes a ferroelectric (FE) material contacting a word line; and an oxide semiconductor (OS) layer contacting a source line and a bit line, wherein the FE material is disposed between the OS layer and the word line. The OS layer comprises: a first region adjacent the FE material, the first region having a first concentration of a semiconductor element; a second region adjacent the source line, the second region having a second concentration of the semiconductor element; and a third region between the first region and the second region, the third region having a third concentration of the semiconductor element, the third concentration is greater than the second concentration and less than the first concentration. Optionally, in some embodiments, the semiconductor element is indium. Optionally, in some embodiments, the OS layer comprises $In_xGa_yZn_zMO$, wherein M is Ti, Al, Ag, Si, or Sn, and x, y, and z are each a number between 0 and 1. Optionally, in some embodiments, the first region is in a first semiconductor layer, the second region is in a second semiconductor layer, and the third region is in a third semiconductor layer, the third semiconductor layer forms an interface with the first semiconductor layer, and the third semiconductor layer forms an interface with the second semiconductor layer. Optionally, in some embodiments, the second semiconductor layer extends continuously from the source line to the bit line. Optionally, in some embodiments, the OS layer has a gradient concentration of the semiconductor element that decreases in a direction away from the FE material. Optionally, in some embodiments, a longitudinal axis of the word line extends parallel to a major surface of a semiconductor substrate, a longitudinal axis of the source line extends perpendicular to the major surface of the semiconductor substrate, and a longitudinal axis of the bit line extends perpendicular to the major surface of the semiconductor substrate.

In some embodiments, a device includes a semiconductor substrate; a first memory cell over the semiconductor substrate, the first memory cell comprising a first thin film transistor, wherein the first thin film transistor comprises: a first portion of a ferroelectric material, the first portion of the ferroelectric material contacting a first word line; and a first channel region comprising: a first portion of a first semiconductor layer contacting the ferroelectric material; a first portion of a second semiconductor layer contacting the first semiconductor layer, an indium concentration of the first semiconductor layer is greater than an indium concentration of the second semiconductor layer; and a first portion of a third semiconductor layer contacting the second semiconductor layer, an indium concentration of the third semiconductor layer is less than the indium concentration of the second semiconductor layer; and a second memory cell over the first memory cell. Optionally, in some embodiments, the third semiconductor layer contacts a source line and a bit line. Optionally, in some embodiments, the source line and the bit line each extend along a direction perpendicular to a major surface of the semiconductor substrate. Optionally, in some embodiments, the second memory cell comprises: a second portion of the ferroelectric material, the second portion of the ferroelectric material contacting a second word line different from the first word line; and a second channel region comprising: a second portion of the first semiconductor layer; a second portion of the second semiconductor layer; and a second portion of the third semiconductor layer. Optionally, in some embodiments, the second word line is disposed over the first word line, and a dielectric material separates the second word line from the first word line. Optionally, in some embodiments, the first word line is longer than the second word line. Optionally, in some embodiments, the first semiconductor layer, the second semiconductor layer, and the third semiconductor layer each extend continuously from the first channel region to the second channel region. Optionally, in some embodiments, the first semiconductor layer, the second semiconductor layer, and the third semiconductor layer each comprise $In_xGa_yZn_zMO$, wherein M is Ti, Al, Ag, Si, or Sn, and x, y, and z are each a number between 0 and 1.

In some embodiments, a method includes patterning a first trench extending through a first conductive line; depositing a ferroelectric (FE) material along sidewalls and a bottom surface of the first trench; depositing an oxide semiconductor (OS) layer over the FE material, the OS layer extending along the sidewalls and the bottom surface of the first trench, depositing the OS layer comprises: depositing a first region of the OS layer over the FE material, the first region having a first concentration of a semiconductor element; depositing a second region of the OS layer over the first region of the OS layer, the second region having a second concentration of the semiconductor element that is less than the first concentration of the semiconductor element; and depositing a third region of the OS layer over the second region of the OS layer, the third region having a third concentration of the semiconductor element, the third concentration is less than the second concentration. Optionally, in some embodiments, the semiconductor element is indium. Optionally, in some embodiments, the method further includes removing a portion of the OS layer along a bottom surface of the first trench; and filling remaining portions of the first trench with a first dielectric material. Optionally, in some embodiments, the method further includes patterning a second trench in the first dielectric material; filling the second trench with a second dielectric material; patterning a third trench and a fourth trench in the second dielectric material; and filling the third trench and the fourth trench with a conductive material to form a second conductive line and a third conductive line. Optionally, in some embodiments, the first trench extends through a multi-layer stack, the multi-layer stack comprises a plurality of stacked conductive lines, the plurality of stacked conductive lines comprises the first conductive line The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
patterning a first trench extending through a first conductive line;
depositing a ferroelectric (FE) material along sidewalls and a bottom surface of the first trench;
depositing an oxide semiconductor (OS) layer over the FE material, the OS layer extending along the sidewalls and the bottom surface of the first trench, depositing the OS layer comprises:
depositing a first region of the OS layer over the FE material, the first region having a first concentration of an element comprised by a semiconductor material of the OS layer;
depositing a second region of the OS layer over the first region of the OS layer, the second region having a second concentration of the element of the semiconductor material that is less than the first concentration of the element of the semiconductor material; and
depositing a third region of the OS layer over the second region of the OS layer, the third region having a third concentration of the element of the semiconductor material, the third concentration is less than the second concentration.

2. The method of claim 1, wherein the element of the semiconductor material is indium.

3. The method of claim 1, further comprising:
removing a portion of the OS layer along the bottom surface of the first trench; and
filling remaining portions of the first trench with a first dielectric material.

4. The method of claim 3, further comprising:
patterning a second trench in the first dielectric material;
filling the second trench with a second dielectric material;
patterning a third trench and a fourth trench in the second dielectric material; and
filling the third trench and the fourth trench with a conductive material to form a second conductive line and a third conductive line.

5. The method of claim 3, wherein the first trench extends through a multi-layer stack, the multi-layer stack comprises a plurality of stacked conductive lines, the plurality of stacked conductive lines comprises the first conductive line.

6. The method of claim 1, wherein the first region of the OS layer forms a physical interface with the second region of the OS layer, and wherein the second region of the OS layer forms a physical interface with the third region of the OS layer.

7. The method of claim 1, wherein the element of the semiconductor material has a gradient distribution that extends through the first region, the second region, and the third region of the OS layer.

8. A method, comprising:
patterning a trench extending through a multi-layer stack, the multi-layer stack comprising a plurality of conductive lines, wherein adjacent conductive lines of the plurality of conductive lines are separated by a dielectric;
depositing a ferroelectric (FE) material along sidewalls of the trench;
depositing an oxide semiconductor (OS) layer in the trench and over the FE material, wherein depositing the OS layer comprises:
depositing a first region of the OS layer over the FE material, the first region having a first concentration of indium;
depositing a second region of the OS layer over the first region of the OS layer, the second region having a second concentration of the indium; and
depositing a third region of the OS layer over the second region of the OS layer, the third region having a third concentration of the indium, wherein the second concentration is greater than the third concentration and less than the first concentration.

9. The method of claim 8, further comprising depositing a first dielectric material over the OS layer.

10. The method of claim 9, further comprising:
etching a second trench extending through the first dielectric material, the OS layer, and the FE material;
filling the second trench with a second dielectric material; and
forming a source line and a bit line each extending through the first dielectric material, the OS layer, and the FE material, wherein the second dielectric material insulates the source line from the bit line.

11. The method of claim 8, wherein the OS layer comprises $In_xGa_yZn_zMO$, wherein M is Ti, Al, Ag, Si, or Sn, and x, y, and z are each a number between 0 and 1.

12. The method of claim 8, further comprising annealing the OS layer.

13. The method of claim 12, wherein annealing the OS layer comprises annealing the OS layer at a temperature in a range of 300° C. to 450° C.

14. The method of claim 8, wherein the first region of the OS layer shares a physical interface with the second region of the OS layer, and the second region of the OS layer shares a physical interface with the third region of the OS layer.

15. The method of claim 8, wherein the OS layer is free of any internal interfaces.

16. A method, comprising:
patterning a first trench extending through a first conductive line;
depositing a ferroelectric (FE) material along sidewalls and a bottom surface of the first trench; and
depositing an oxide semiconductor (OS) layer over the FE material, the OS layer extending along the sidewalls and the bottom surface of the first trench, wherein the OS layer has a gradient concentration of indium that decreases in a direction away from the FE material.

17. The method of claim 16, wherein depositing the OS layer comprising controlling a supply and flow of an indium precursor to achieve the gradient concentration of the indium.

18. The method of claim 16, wherein the OS layer comprises a metal alloy, the metal alloy comprising indium, gallium, zinc, and oxygen.

19. The method of claim 18, wherein the metal alloy further comprises Ti, Al, Ag, Si, or Sn.

20. The method of claim 16, wherein the OS layer is free of any internal interfaces.

* * * * *